(12) United States Patent
Hampden-Smith et al.

(10) Patent No.: US 7,255,954 B2
(45) Date of Patent: *Aug. 14, 2007

(54) ENERGY DEVICES

(75) Inventors: Mark J. Hampden-Smith, Albuquerque, NM (US); Toivo T. Kodas, Abuquerque, NM (US); Paolina Atanassova, Albuquerque, NM (US); Paul Napolitano, Albuquerque, NM (US); Rimple Bhatia, Placitas, NM (US); James H. Brewster, Rio Rancho, NM (US)

(73) Assignee: Cabot Corporation, Boston, MA (US)

( * ) Notice: Subject to any disclaimer, the term of this patent is extended or adjusted under 35 U.S.C. 154(b) by 459 days.

This patent is subject to a terminal disclaimer.

(21) Appl. No.: 10/279,773

(22) Filed: Oct. 24, 2002

(65) Prior Publication Data
US 2003/0198849 A1    Oct. 23, 2003

Related U.S. Application Data

(63) Continuation-in-part of application No. 09/815,380, filed on Mar. 22, 2001, which is a continuation-in-part of application No. 09/532,917, filed on Mar. 22, 2000, now Pat. No. 6,660,680, which is a continuation-in-part of application No. 09/141,397, filed on Aug. 27, 1998, now Pat. No. 6,103,393.

(51) Int. Cl.
*H01M 4/86* (2006.01)

(52) U.S. Cl. ............. 429/40; 429/41; 429/44; 429/30; 429/33; 502/185; 502/224; 502/230; 502/339; 427/115; 427/376.1; 427/376.2; 427/383.1

(58) Field of Classification Search ........... 429/30, 429/33, 40, 41, 44; 427/115, 376.1, 376.2, 427/383.1; 502/224, 339, 185, 230, 159
See application file for complete search history.

(56) References Cited

U.S. PATENT DOCUMENTS

| | | | | |
|---|---|---|---|---|
| 5,501,915 A | * | 3/1996 | Hards et al. | 429/42 |
| 5,589,300 A | * | 12/1996 | Fauteux et al. | 429/223 |
| 5,707,763 A | * | 1/1998 | Shimizu et al. | 429/217 |
| 5,783,325 A | * | 7/1998 | Cabasso et al. | 429/42 |
| 5,843,519 A | * | 12/1998 | Tada | 427/115 |
| 5,871,860 A | * | 2/1999 | Frost et al. | 429/40 |
| 5,876,867 A | * | 3/1999 | Itoh et al. | 429/44 |
| 5,900,386 A | * | 5/1999 | Freund et al. | 502/330 |
| 6,403,245 B1 | * | 6/2002 | Hunt | 429/33 |
| 7,138,159 B2 | * | 11/2006 | Hampden-Smith et al. | 427/376.1 |

FOREIGN PATENT DOCUMENTS

EP    0424586 A2 * 2/1991

* cited by examiner

*Primary Examiner*—Bruce F. Bell
(74) *Attorney, Agent, or Firm*—Marsh Fischmann & Breyfogle LLP

(57) ABSTRACT

Electrocatalyst powders and energy devices fabricated using electrocatalyst powders and methods for making energy devices. The energy devices, such as fuel cells, have improved performance over a range of operating conditions.

57 Claims, 34 Drawing Sheets

ENERGY DEVICES

RELATED APPLICATIONS

This application is a continuation-in-part of U.S. patent application Ser. No. 09/815,380, filed Mar. 22, 2001, which is a continuation-in-part of U.S. patent application Ser. No. 09/532,917, filed on Mar. 22, 2000 now U.S. Pat. No. 6,660,680, which is a continuation-in-part of U.S. patent application Ser. No. 09/141,397, filed on Aug. 27, 1998 now U.S. Pat. No. 6,103,393. Each of the foregoing U.S Patent Applications is incorporated herein by reference in its entirety.

BACKGROUND OF THE INVENTION

1. Field of the Invention

The present invention relates to particulate materials such as electrocatalyst particles and complex multi-component particles for the fabrication of energy devices such as fuel cells. The present invention also relates to improved energy devices incorporating the particulate materials.

2. Description of Related Art

With the advent of portable and hand-held electronic devices and an increasing demand for electric automobiles due to the increased strain on non-renewable natural resources, there is a need for the rapid development of high performance, economical power systems. Such power systems include improved devices for energy storage using batteries and energy generation using fuel cells.

Fuel cells are electrochemical devices that are capable of converting the energy of a chemical reaction into electrical energy without combustion and with virtually no pollution. Fuel cells are unlike batteries because fuel cells convert chemical energy to electrical energy as the chemical reactants are continuously delivered to the fuel cell. When the fuel cell is off, it has zero electrical potential. As a result, fuel cells are typically used to produce a continuous source of electrical energy and compete with other forms of continuous electrical energy production such as the combustion engine, nuclear power and coal-fired power stations. Different types of fuel cells are categorized by the electrolyte used in the fuel cell. The five main types of fuel cells are alkaline, molten carbonate, phosphoric acid, solid oxide and proton exchange membrane (PEM) or polymer electrolyte fuel cells (PEFCs).

One of the critical requirements for these energy devices is the efficient catalytic conversion of the reactants to electrical energy. A significant obstacle to the wide-scale commercialization of such devices is the need for highly efficient electrocatalyst materials for this conversion process.

One example of a fuel cell utilizing electrocatalysts for the chemical reactions is a proton exchange membrane fuel cell (PEMFC). A PEMFC stack typically includes tens to hundreds of membrane electrode assemblies (MEAs) each including a cathode layer and an anode layer. The anode and cathode sandwich a proton exchange membrane that has a catalyst layer on each side of the membrane. Power is generated when hydrogen is fed into the anode and oxygen (air) is fed into the cathode. In a reaction typically catalyzed by a platinum-based catalyst in the catalyst layer of the anode, the hydrogen ionizes to form protons and electrons. The protons are transported through the proton exchange membrane to a catalyst layer on the opposite side of the membrane (the cathode) where another catalyst, typically platinum or a platinum alloy, catalyzes the reaction of the protons with oxygen to form water. The reactions can be written as follows:

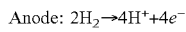

Anode: $2H_2 \rightarrow 4H^+ + 4e^-$

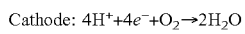

Cathode: $4H^+ + 4e^- + O_2 \rightarrow 2H_2O$

Overall: $2H_2 + O_2 \rightarrow 2H_2O$

The electrons formed at the anode are routed to the cathode through an electrical circuit which provides the electrical power.

The critical issues that must be addressed for the successful commercialization of fuel cells are cell cost, cell performance and operating lifetime. For stationary applications improved power density is critical whereas for automotive applications higher voltage efficiencies are necessary. In terms of fuel cell cost, current fuel cell stacks employ MEA's that include platinum electrocatalysts with a total loading of about 1 milligram of platinum per square centimeter of electrode (1 mgPt/cm$^2$), including both the anode and cathode. At a typical cell performance of 0.42 Watts per square centimeter, about 2.4 grams of platinum per kilowatt is required (1 mgPt/cm$^2$ over 0.42 Watts/cm$^2$). Platinum metal is very expensive and a significant cost reduction in the electrocatalyst is necessary for these cells to become economically viable. However, reducing the amount of precious metal per se is not a suitable solution to reduce cost, because the performance for the fuel cell may suffer and there is also a strong demand for improved cell performance The major technical challenge is improving the performance of the cathode with air as the oxidant. Platinum metal electrocatalysts for oxygen reduction are used in both alkaline and acid electrolyte media and are used in PEM fuel cells, alkaline fuel cells, hybrid fuel cells and others.

The conventional synthesis of electrocatalyst powders that include an active species on a support material involves several steps. First, an appropriate high surface area catalyst support (e.g., carbon) is mixed with a solution containing the precursor of the catalytic active species e.g., platinum). Sufficient contact time is used for the adsorption of the active species precursor to occur and to achieve a uniform deposition of the precursor on the support surface. A reducing agent is often added to reduce the metal-containing precursor to a reduced metal species. Surfactants may also be added to control the size of the reduced metal particles. The electrocatalyst is then filtered from the solution, dried, and in some cases heated to a relatively high temperature under an inert atmosphere (to avoid combustion of the carbon) to crystallize or alloy (if two metals were co-reduced) the metal particles on the carbon support. The solution that is recovered from the filtrate is treated to extract unreacted precious metal and to make it environmentally safe for disposal.

The powder product derived from the foregoing process does not have a controlled aggregate particle structure and requires further processing (such as ball milling) to convert the large range of aggregate particle sizes (generally from about 10 μm to 1,000 μm) to a suitable size (from about 1 μm to 10 μm) for further processing into a formulation for MEA construction. The method is labor intensive, requires many unit operations and does not result in good control over the size and size distribution of the electrocatalyst particles.

Methods for preparing noble metal electrocatalyst materials are known in the art. U.S. Pat. No. 4,052,336 by VanMontfoort et al. discloses a process for preparing an active noble metal catalyst on a carbon carrier, such as palladium on carbon, by adsorbing a salt of the metal onto the carbon, forming an oxide or hydroxide from the metal salt and reducing the oxide or hydroxide to a metal. The carbon support comprises porous active carbon particles having a widely varying particle size of less than 1 µm up to 60 µm. The catalyst comprises from about 0.1 to about 15 percent by weight of the noble metal. It is disclosed that the noble metal is deposited on the carbon carrier in the form of very small crystallites which have a high degree of catalytic activity per gram of noble metal.

U.S. Pat. No. 4,136,059 by Jalan et al. discloses a method for the production of electrochemically active platinum particles for use in fuel cell electrodes. The particles are formed by mixing chloroplatinic acid and sodium dithionite in water to provide a colloidal dispersion which is absorbed onto a support material (e.g., carbon black).

U.S. Pat. No. 4,482,641 by Wennerberg discloses a high surface area porous active carbon matrix containing a uniform dispersion of a metal. The material is formed by spray drying a carbon precursor and a metal precursor to form particles and then pyrolyzing the spray dried particles under an inert gas and in the presence of an alkali metal hydroxide. A preferred heating method for the pyrolyzation step is to heat using microwave heating. It is disclosed that the metal crystals have a size from about 5 to 30 angstroms and are disposed on active carbon having a cage-like structure.

U.S. Pat. No. 4,569,924 by Ozin et al. discloses a carbon-metal catalyst having an active metal such as silver deposited on the carbon substrate in a zero-valent, small cluster form. The catalyst is produced by vaporizing the metal under low vapor pressure conditions in an organic liquid solvent such that the metal dissolves in the solvent. The solvent is then contacted with carbon so that the complex diffuses onto the surface of the carbon and into the pores of the carbon. The carbon particles have a metal loading of 0.1 to 15 weight percent.

U.S. Pat. No. 4,652,537 by Tamura et al. discloses a process for producing a catalyst useful for converting carbon monoxide into carbon dioxide. The process includes contacting activated carbon with an aqueous solution of chloroplatinic acid, reducing the absorbed chloroplatinic acid to platinum with a reducing agent and decomposing the excess reducing agent. The catalyst preferably contains at least about 6 milligrams of platinum per gram of activated carbon. The activated carbon particles have an average grain size of from about 0.4 to about 10 millimeters.

U.S. Pat. No. 4,970,128 by Itoh et al. discloses a supported platinum alloy electrocatalyst for an acid electrolyte fuel cell. The platinum alloy includes platinum, iron and copper. The electrocatalyst has better initial activity and lifetime than conventional platinum or other multi-component alloy electrocatalysts. U.S. Pat. No. 5,489,563 by Brand et al. discloses a platinum/cobalt/chromium catalytic alloy which is precipitated onto a carbon support from nitrate salts.

U.S. Pat. No. 4,970,189 by Tachibana discloses a porous, metal-containing carbon material which includes fine particles of a metal having an average particle size of 1 µm or less dispersed in a carbonaceous body. The method includes mixing a metal oxide with an organic, carbonizing and converting the oxide to metal particles. The catalyst includes from about 5 to 50 weight percent metal.

U.S. Pat. No. 5,068,161 by Keck et al. discloses an electrocatalytic material suitable for use in phosphoric acid fuel cells. The material includes an alloy of platinum with another element such as titanium, chromium, manganese, iron, cobalt, nickel, copper, gallium, zirconium or hafnium. The platinum alloy loading is 20 to 60 weight percent and the electrochemical area of the alloy is greater than about 35 $m^2/g$.

U.S. Pat. No. 5,120,699 by Weiss et al. discloses a catalyst containing from 0.01 to 5 weight percent platinum on a graphite support. The graphite support has a particle size distribution of from about 1 to 600 µm. The catalyst material has good longevity when used for hydrogenation reactions.

U.S. Pat. No. 5,453,169 by Callstrom et al. discloses an electrocatalytic material including glassy carbon which contains graphite crystals having a size of from about 1 to 20 nanometers.

U.S. Pat. No. 5,501,915 by Hards et al. discloses a porous electrode suitable for use in a solid polymer fuel cell which includes highly dispersed precious metal catalyst on particulate carbon which is impregnated with a proton conducting polymer.

The foregoing methods generally result in poor control over the aggregate particle size and size distribution of the catalyst, poor control over the aggregate particle morphology and microstructure of the electrocatalytic materials, as well as poor control over the dispersion and surface area of the active species on the carbon surface. Further, alloy compositions such as platinum/transition metal used for oxygen reduction in a fuel cell can not be made in a consistently reproducible fashion. The inability to control the fundamental powder characteristics is a major obstacle to the development of more efficient electrocatalyst materials.

It would be advantageous to provide a flexible production method capable of producing electrocatalyst powders which would enable control over the powder characteristics such as aggregate size and size distribution, aggregate morphology surface area and pore structure as well as the versatility to accommodate compositions which are either difficult or impossible to produce using existing production methods. It would be particularly advantageous if such powders could be produced in large quantities on a substantially continuous basis. It would also be advantageous to provide improved devices, such as fuel cells, having thin layers and improved properties.

SUMMARY OF THE INVENTION

The present invention is directed to catalyst powders and energy devices (e.g., fuel cells) fabricated using the catalyst powders. In one embodiment, a membrane electrode assembly is provided. The membrane electrode assembly includes at least an anode, a cathode and a membrane separating the anode and the cathode. At least one of the anode and cathode includes electrocatalyst particles fabricated by heating suspended droplets of an electrocatalyst precursor composition while the droplets are suspended in a gas. The membrane electrode assembly according to this embodiment offers superior performance as compared to known membrane electrode assemblies due to the unique structure of the electrocatalysts.

According to this embodiment, the electrocatalyst particles can be composite electrocatalyst aggregates having a support phase and an active species phase dispersed on the support phase. The active species phase can be, for example, a platinum metal phase. The heating step can include heating the suspended droplets in a spray-dryer, such as a mixed-flow spray-dryer. The heating can also be to a temperature of not greater than about 400° C., and even not greater than 300° C. and can be for a period of time not greater than about 600 seconds, such as not greater than about 100 seconds. The electrocatalyst particles can have a volume average particle size of not greater than about 30 μm and can include an active species phase dispersed on a support phase and wherein the support phase includes primary carbon particles having an average primary particle size of from about 10 to about 100 nanometers.

According to another embodiment of the present invention, a membrane electrode assembly is provided including at least an anode, a cathode and a membrane separating the anode and cathode, wherein at least one of the anode and cathode includes composite electrocatalyst aggregates having an active species dispersed on a support phase wherein the aggregates are substantially spherical and wherein the volume average size of the aggregates is not greater than about 100 μm.

According to this embodiment, the electrocatalyst aggregates can have a volume average size of not greater than about 20 μm. The electrocatalyst aggregates can also have a support phase of primary carbon particles and an active species phase dispersed on the primary carbon particles. The electrocatalyst aggregates can advantageously be dispersed in an electrocatalyst layer having an average thickness of not greater than about 50 μm.

According to another embodiment of the present invention, a membrane electrode assembly is provided including an anode, a cathode and a membrane separating the anode and the cathode, wherein at least one of the anode and the cathode includes an electrocatalyst layer and the electrocatalyst layer includes substantially spherical electrocatalyst particles. The electrocatalyst particles can preferably have a volume average particle size of not greater than about 20 μm, such as not greater than about 10 μm. Preferably, at least about 5 volume percent of the electrocatalyst layer is comprises of the spherical electrocatalyst particles, more preferably at least about 10 volume percent and even more preferably at least about 20 volume percent.

According to another embodiment of the present invention, a liquid vehicle including catalyst particles is provided, the liquid vehicle being adapted to be deposited using a direct-write tool to form a catalyst layer, wherein the liquid vehicle comprises a liquid carrier and catalyst particles having a volume average particle size of not greater than about 20 μm dispersed in the liquid carrier. According to this embodiment, the volume average particle size can be from about 1 μm to about 10 μm and the catalyst particles can be substantially spherical to enhance the deposition properties of the composition. The liquid vehicle can also include, for example, a solvent and a binder.

According to another embodiment of the present invention, a method for the deposition of an electrocatalyst layer is provided, including the steps of dispersing electrocatalyst particles in a liquid carrier to form a liquid vehicle, wherein the electrocatalyst particles have a volume average particle size of not greater than about 20 μm, depositing the liquid vehicle onto a surface using a direct-write tool and heating the liquid vehicle to a temperature sufficient to form an electrocatalyst layer.

According to another embodiment of the present invention, a membrane electrode assembly is provided including at least an anode, a cathode and a membrane separating the anode and the cathode, wherein at least one of the anode and the cathode includes electrocatalyst aggregates, the electrocatalyst aggregates comprising an active species phase dispersed on a porous support phase and a polymer phase intimately mixed within the structure of the aggregates. According to this embodiment, the polymer phase can include a proton conductive polymer, a hydrophobic polymer, a hydrophilic polymer, a fluorocarbon polymer and/or a perfluorohydrocarbon polymer.

According to another embodiment of the present invention, a membrane electrode assembly is provided including at least an anode, a cathode and a membrane separating the anode and the cathode, wherein at least one of the anode and the cathode includes electrocatalyst particles consisting of an active species phase dispersed on a support phase and wherein the electrocatalyst particles have an average internal pore size of not greater than about 20 nanometers. According to this embodiment, the average internal pore size can be not greater than about 15 nanometers and the electrocatalyst particles can have an open porosity of at least about 40 percent.

According to another embodiment of the present invention, a membrane electrode assembly is provided including an electrocatalyst layer, wherein the layer comprises 20 to 40 volume percent electrocatalyst, 20 to 40 volume percent proton conducting polymer and at least about 30 volume percent porosity.

According to another embodiment of the present invention, a membrane electrode assembly is provided including an anode, a cathode and a membrane separating the anode and the cathode, wherein the cathode includes an electrocatalyst layer having a supported active species loading of not greater than about 0.2 mg/cm$^2$, and wherein the cell voltage of the membrane electrode assembly is at least about 0.6 V at a constant current density of about 600 mA/cm$^2$ at 50° C. and atmospheric pressure, using a feed gas of pure air to the cathode and pure hydrogen to the anode at a substantially constant flow rate and with external humidification. According to this embodiment, the reference voltage can decrease in average by not more than about 7.5 μ-volts per hour when the membrane electrode assembly is run for a continuous period of about 4000 hours at 50° C. and atmospheric pressure with a feed gas of pure air to the cathode and a feed gas of pure hydrogen to the anode at a substantially constant flow rate and with external humidification. The feed gas to the cathode can be pure air (2.2 stoichiometry) and pure hydrogen can be supplied to the anode (1.2 stoichiometry) with substantially constant flow rates corresponding to current density of 1 A/cm$^2$ and with 100% external humidification of the gases.

According to another embodiment of the present invention, a membrane electrode assembly is provided including an anode, a cathode and a membrane separating the anode and the cathode, wherein the cathode includes an electrocatalyst layer having a supported active species loading of not greater than about 0.1 mg/cm$^2$, wherein the membrane electrode assembly has a cell voltage of at least about 0.7 V at a current density of at least about 150 mA/cm$^2$ at 50° C. and atmospheric pressure, using a feed gas of pure air to the cathode and pure hydrogen to the anode at a substantially constant flow rate and with external humidification. Preferably, the current density is at least about 200 mA/cm$^2$, such as at least about 250 mA/cm$^2$. Further, the membrane electrode assembly preferably has a cell voltage of at least about 0.5 V at a current density of at least about 550 mA/cm$^2$ and a cell voltage of at least about 0.5 V at a current density of at least about 600 mA/cm$^2$.

According to another embodiment, a membrane electrode assembly is provided including an anode, a cathode and a membrane separating the anode and the cathode, wherein the cathode includes an electrocatalyst layer having a supported active species loading of not greater than about 0.2 mg/cm$^2$, and wherein the membrane electrode assembly has a cell voltage of at least about 0.6 V at a current density of at least about 550 mA/cm² at 50° C. and atmospheric pressure, using a feed gas of pure air to the cathode and pure hydrogen to the anode at a substantially constant flow rate and with external humidification. Preferably, the current density is at least about 600 mA/cm² and more preferably is at least about 650 mA/cm².

According to another embodiment of the present invention, a membrane electrode assembly is provided including an anode, a cathode, and a membrane separating the anode and the cathode, wherein the cathode includes an electrocatalyst layer having a supported active species loading of not greater than about 0.4 mg/cm², and wherein the membrane electrode assembly has a cell voltage of at least about 0.5 V at a current density of at least about 800 mA/cm² at 50° C. and atmospheric pressure, using a feed gas of pure air to the cathode and pure hydrogen to the anode at a substantially constant flow rate and with external humidification. Preferably, the cell voltage is at least about 0.5 V at a current density of at least 850 mA/cm² and more preferably the cell voltage is at least about 0.5 V at a current density of at least 900 mA/cm². Further, the cell voltage can be at least about 0.5 V at a current density of at least 1000 mA/cm².

According to another embodiment of the present invention, a membrane electrode assembly is provided including an anode, a cathode, and a membrane separating the anode and the cathode, wherein the cathode comprises an electrocatalyst layer having a supported active species loading of not greater than about 0.5 mg/cm², and wherein the membrane electrode assembly has a cell voltage of at least about 0.5 V at a current density of at least about 800 mA/cm² at 50° C. and atmospheric pressure, using a feed gas of pure air to the cathode and pure hydrogen to the anode at a substantially constant flow rate and with external humidification. Preferably, the cell voltage is at least about 0.5 V at a current density of at least 850 mA/cm², more preferably is at least about 0.5 V at a current density of at least 900 mA/cm² and even more preferably is at least about 0.5 V at a current density of at least 1000 mA/cm².

According to another embodiment of the present invention, a membrane electrode assembly is provided including an anode, a cathode, and a membrane separating the anode and the cathode, wherein the cathode includes an electrocatalyst layer having a supported active species loading of not greater than about 0.1 mg/cm² and has a delta E value of not greater than about 50 millivolts at 200 mA/cm² and not greater than about 100 millivolts at 400 mA/cm² and not greater than about 175 millivolts at 600 mA/cm², when measured at 50° C. and atmospheric pressure, using a feed gas of pure hydrogen to the anode at a substantially constant flow rate and with external humidification. Preferably, the cell voltage is at least 0.6 V at 400 mA/cm² when measured in air. Further, the electrocatalyst layer preferably includes supported electrocatalyst particles having a platinum loading that is not greater than about 5 weight percent.

According to yet another embodiment of the present invention, a membrane electrode assembly is provided including an anode, a cathode, and a membrane separating the anode and the cathode, wherein the cathode includes an electrocatalyst layer having a supported active species loading of not greater than about 0.2 mg/cm² and has a delta E value of not greater than about 50 millivolts at 200 mA/cm² and not greater than about 100 millivolts at 600 mA/cm² and not greater than about 170 millivolts at 1000 mA/cm², when measured at 50° C. and atmospheric pressure, using a feed gas of pure hydrogen to the anode at a substantially constant flow rate and with external humidification. Preferably, the electrocatalyst layer includes electrocatalyst particles having a supported active species dispersed on a support, the support having a porosity of at least about 40 percent. Further, the cell voltage is preferably at least about 0.6 V at 600 mA/cm², when measured in air and the electrocatalyst layer preferably includes electrocatalyst particles having a supported active species dispersed on a support and wherein the electrocatalyst particles have a supported active species loading that is not greater than about 20 weight percent.

According to another embodiment of the present invention, a membrane electrode assembly is provided including an anode, a cathode, and a membrane separating the anode and the cathode, wherein the cathode includes an electrocatalyst layer having a supported active species loading of not greater than about 0.4 mg/cm² and has a delta E value of not greater than about 50 millivolts at 200 mA/cm², not greater than about 100 millivolts at 600 mA/cm² and not greater than about 250 millivolts at 1000 mA/cm², when measured at 50° C. and atmospheric pressure, using a feed gas of pure hydrogen to the anode at a substantially constant flow rate and with external humidification.

According to yet another embodiment of the present invention, a membrane electrode assembly is provided including an anode, a cathode, and a membrane separating the anode and the cathode, wherein the cathode includes an electrocatalyst layer having a supported active species loading of not greater than about 0.6 mg/cm² and has a delta E value of not greater than about 80 millivolts at 200 mA/cm², not greater than about 150 millivolts at 600 mA/cm² and not greater than about 200 millivolts at 1000 mA/cm², when measured at 50° C. and atmospheric pressure, using a feed gas of pure hydrogen to the anode at a substantially constant flow rate and with external humidification. Preferably, the membrane electrode assembly has a cell voltage of at least about 0.5 V at 700 mA/cm² in air.

These and other embodiments of the present invention will be apparent from the following description of the invention.

DETAILED DESCRIPTION OF THE INVENTION

Figure 1:
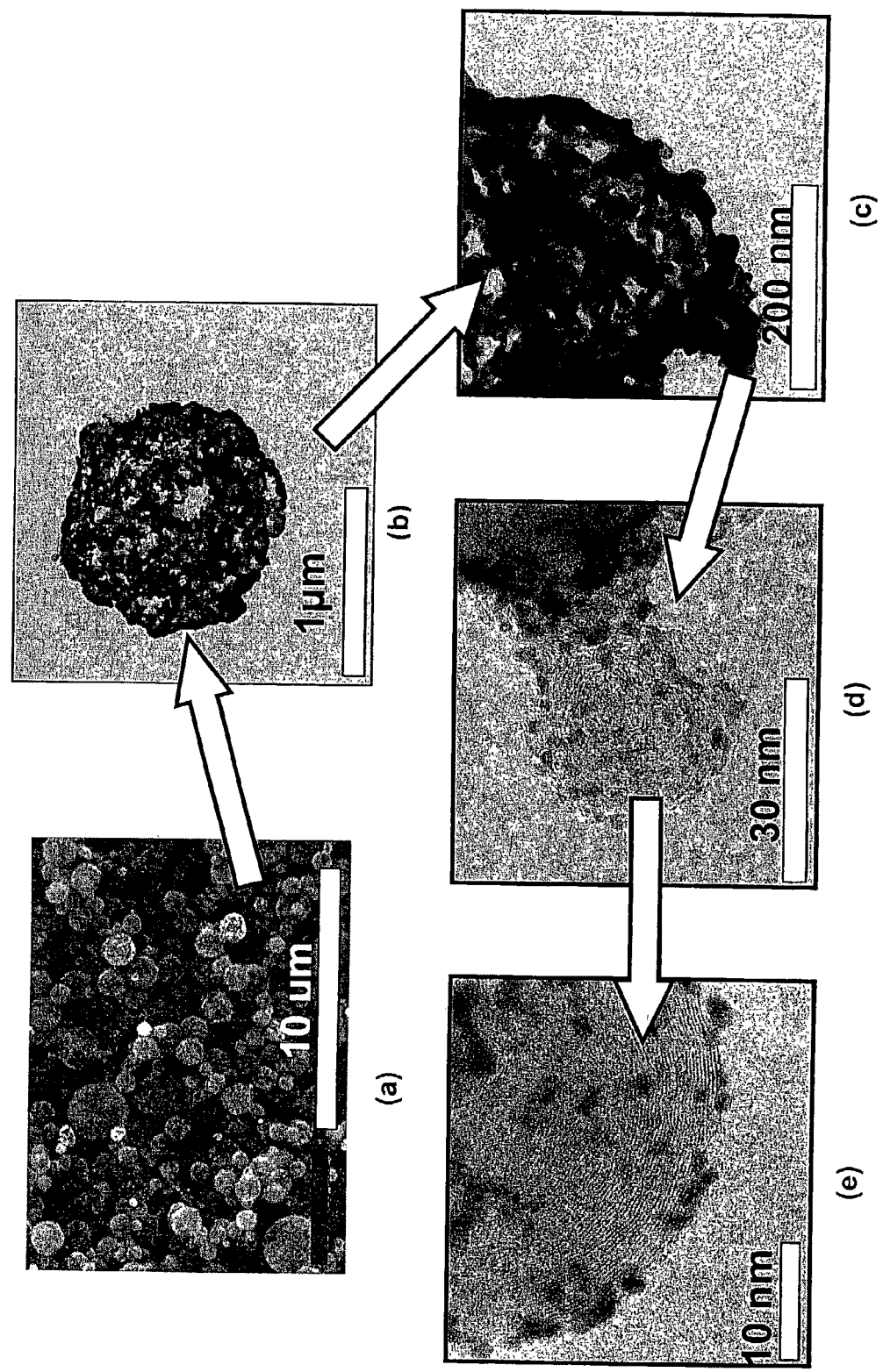
FIG. 1 illustrates the structure of aggregate electrocatalyst particles according to the present invention.

The present invention is generally directed to powders useful in the construction of energy devices, such as electrocatalyst powders useful in fuel cells, and to methods for producing the powders. One preferred embodiment of the present invention is directed to composite electrocatalyst powders that are useful in fuel cells for catalyzing chemical reactions. The present invention is also directed to novel structures and devices fabricated using the powders. One example is a fuel cell, such as a PEM fuel cell composed of a number of MEAs. The materials according to the present invention can advantageously be formed into thin layers using direct write deposition and similar techniques to form unique structures.

As used herein, the term electrocatalyst particles or powders refers to aggregate particles that include one or more highly dispersed phases, typically metal or metal oxide clusters or crystallites, with dimensions on the order of about 1 nanometers to 10 nanometers that are dispersed over the surface of the support particles. Support particles can be chosen from a metal oxide (e.g., $RuO_2$, $In_2O_3$, $ZnO$, $IrO_2$, $SiO_2$, $Al_2O_3$, $CeO_2$, $TiO_2$ or $SnO_2$), aerogels, xerogels, carbon or a combination of the foregoing. In the following discussion, carbon is used as an example. The carbon support particles typically have sizes in the range of about 10 nanometers to 5 μm, depending on the nature of the carbon material. However, carbon particulates having sizes up to 25 μm can be used as well. The individual carbon particles supporting the dispersed active species phase typically do not exist as discrete particles but tend to associate to form structures that contain a number of discrete particles. Throughout the present application, the larger structures formed from the association of these discrete carbon particles supporting the dispersed phase are referred to as aggregates or aggregate particles, and typically have a size in the range from 0.5 to 25 μm. In contrast, conventional methods for producing electrocatalyst powders form aggregates that can range in size from two or more carbon particles supporting the discrete metal phase to millimeter sized aggregates. In addition, the aggregates can further associate into larger "agglomerates". The aggregate morphology, aggregate size, size distribution and surface area of the electrocatalyst powders are characteristics that have a critical impact on the performance of the catalyst. The aggregate morphology, aggregate size and size distribution determines the packing density and the surface area determines the type and number of surface adsorption centers where the active species are formed during synthesis of the electrocatalyst. The inability to control the fundamental electrocatalyst powder characteristics is a major obstacle for the future development of energy storage and production devices. One of the major advantages of the electrocatalyst powders described here is that that morphology (spherical), aggregate size and aggregate size distribution is controlled by the droplet size and size distribution during powder production.

FIG. 1 illustrates the morphology and structure of the electrocataylst powders according to the present invention. FIG. 1(a) illustrates a plurality of the aggregate electrocataylst particles in a powder batch. FIG. 1(b) illustrates one electrocatalyst particle having a size of about 1.2 μm. FIG. 1(c) illustrates the structure of the particle of FIG. 1(b) in greater detail, wherein the individual support particles can be seen. FIGS. 1(d) and 1(e) illustrated the active species dispersed on the support phase of the aggregate particle.

Thus, the electrocatalyst powders of the present invention are not mere physical admixtures of different particles, but are comprised of support phase particles that include a dispersed phase of an active species. The compositions and ratios of the aggregate particle components can be varied independently and various combinations of carbons, metals, metal alloys, metal oxides, mixed metal oxides, organometallic compounds and their partial pyrolysis products can be produced. One embodiment of the present invention is directed to electrocatalyst particles with two or more different materials as the dispersed active species. As an example, combinations of Ag and $MnO_x$ dispersed on carbon can be useful for some electrocatalytic applications. Other examples of multiple active species are mixtures of porphyrins, partially decomposed porphyrins, Co and CoO. Although carbon is a preferred material for the support phase, other materials such as metal oxides can also be useful for some electrocatalytic applications, as is discussed above.

According to one embodiment of the present invention, the electrocatalyst powder includes metal-carbon electrocatalyst particles. The metal-carbon electrocatalyst particles include a catalytically active species of at least a first metal phase dispersed on a carbon support phase. The metal active species phase can include any metal and the particularly preferred metal will depend upon the application of the powder. The metal phase can be a metal alloy wherein a first metal is alloyed with one or more alloying elements. As used herein, the term metal alloy also includes intermetallic compounds between two or more metals. For example, the term platinum metal phase refers to a platinum alloy or platinum-containing intermetallic compound, as well as pure platinum metal. The metal-carbon electrocatalyst powders can also include two or more metals dispersed on the support phase as separate active species phases.

Preferred metals for the supported electrocatalytically active species include the platinum group metals and noble metals, particularly Pt, Ag, Pd, Ru, Os and their alloys. The metal phase can also include a metal selected from the group Ni, Rh, Ir, Co, Cr, Mo, W, V, Nb, Al, Ta, Ti, Zr, Hf, Zn, Fe, Cu, Ga, In, Si, Ge, Sn, Y, La, lanthanide metals and combinations or alloys of these metals. Preferred metal alloys for use according to the present invention include alloys of Pt with other metals, such as Ru, Os, Cr, Ni, Mn and Co. Particularly preferred among these is Pt—Ru for use in hydrogen anodes and Pt—Cr—Co for use in oxygen cathodes.

Another preferred embodiment of the present invention is directed to metal oxide-carbon electrocatalyst particles that include a metal oxide active species dispersed on a carbon support phase. The metal oxide can be selected from the oxides of the transition metals, preferably those existing in oxides of variable oxidation states, and most preferably from those having an oxygen deficiency in their crystalline structure.

For example, the metal oxide active species can be an oxide of a metal selected from the group consisting of Au, Ag, Pt, Pd, Ni, Co, Rh, Ru, Fe, Mn, Cr, Mo, Re, W, Ta, Nb, V, Hf, Zr, Ti or Al. A particularly preferred metal oxide active species according to the present invention is manganese oxide ($MnO_x$, where x is 1 to 2). The supported active species can include a mixture of different oxides, solid solutions of two or more different metal oxides or double oxides. The metal oxides can be stoichiometric or non-stoichiometric and can be mixtures of oxides of one metal having different oxidation states. The metal oxides can also be amorphous.

A further class of catalysts that can be useful according to the present invention are those derived from molecular compounds that can be self-supported or can be dispersed on a support phase. Examples of such materials are metal porphyrin complexes that catalyze the reduction of $O_2$ to $OH^-$ but are oxidized during the oxidation of $OH^-$. These species are suitable for fuel cells such as alkaline fuel cells. Included in this group are metal porphyrin complexes of Co, Fe, Zn, Ni, Cu, Pd, Pt, Sn, Mo, Mn, Os, Ir and Ru. Other metal ligand complexes can be active in these catalytic oxidation and reduction reactions and can be formed by the methods described herein. Such metal ligands can be selected from the class of N4-metal chelates, represented by porphyrins, tetraazulenes, phtalocyanines and other chelating agents. In some cases the organic ligands are active in catalyzing reduction and oxidation reactions. The ligands can be active when they remain intact, as might be the case for an intact porphyrin ring system, or they can be partially reacted during thermal processing to form a different species that is active in the catalytic reactions. An example of the latter is the reaction product derived from porphyrins or other organic compounds.

Carbon is required for the reduction of $O_2$ to $OH^-$ and is believed to be involved in the reduction of peroxide to hydroxide ion. Other carbon based active species include homo- and hetero-fullerene and carbon nanotube based materials.

In addition to the electrocatalystic powders, other fine powders are useful for fabricating energy device components according to the present invention. Among these are the supporting materials, hydrophobic materials, electroconductive materials and insulator materials such as dielectrics for separating membranes. For example, metals such as silver (Ag) and nickel (Ni) are useful for the current collectors.

According to one embodiment of the present invention, a polymer is incorporated within the electrocatalyst aggregate particle structure to form a polymer-modified particle. The polymer can be, for example, a hydrophobic polymer such as TEFLON (E.I. duPont de Nemours, Wilmington, Del.) or a proton-conducting polymer such as NAFION (E.I. duPont de Nemours, Wilmington, Del.). TEFLON is a tetrafluoroethylene (TFE) fluorocarbon polymer and NAFION is a hydrophobic and proton-conducting polymer, specifically a sulfonated perfluorohydrocarbon polymer. Although the terms TEFLON and NAFION are used throughout the present specification for convenience, it is understood that polymers having similar properties can also be used.

Preferably, the electrocatalyst powders are composed of an aggregate structure that includes the support phase and the dispersed active species phase. The aggregate structure includes smaller primary particles, such as carbon or metal oxide primary particles, constituting the support phase. Two or more types of primary particles can be mixed to form the support phase. For example, two or more types of particulate carbon (e.g., amorphous and graphitic carbon) can be combined to form the support phase. The two types of particulate carbon can have different performance characteristics in a selected application and the combination of the two types in the aggregate structure can enhance the performance of the catalyst.

It is an advantage of the present invention that the composition of the electrocatalyst particles can be homogeneous. That is, the different phases of the electrocatalyst can be well dispersed within a single aggregate particle. A degree of homogeneity in such composite materials is often not obtainable by traditional forming methods such as liquid precipitation. However, it is also possible to intentionally provide compositional gradients within the individual electrocatalyst aggregate particles. For example, the concentration of the dispersed active species phase in a composite particle can be higher or lower at the surface of the secondary support phase than near the center and gradients corresponding to compositional changes of 10 to 100 weight percent can be obtained. When the aggregate particles are deposited by direct-write deposition, discussed below, the aggregate particles retain their structural morphology and therefore the functionality of the compositional gradient can be exploited in the device.

In addition, the electrocatalyst particles can have a high purity, thereby increasing the electrocatalytic activity of the particles. Many impurities in prior art electrocatalyst powders are derived from the precursors and from surfactants used to fabricate the particles. In a preferred embodiment of the present invention, the electrocatalyst particles can advantageously include not greater than about 1 atomic percent surface impurities and more preferably not greater than about 0.5 atomic percent impurities, as measured by X-ray photoelectron spectroscopy (XPS).

The support phase can include primary carbon particles. Graphitic carbon is preferred for long-term operational stability of fuel cells. Amorphous carbon is preferred when a smaller crystallite size is desired for the supported active species phase.

The overall density of the aggregate particles is related to the porosity within the aggregates. It is preferred that the accessible (i.e., open) porosity in the electrocatalyst particles is at least about 5 percent. More preferably, it is preferred that the open porosity is at least about 40 percent and even more preferably is at least about 60 percent. High porosity is advantageous for rapid transport of species into and out of the aggregate structures and lower aggregate densities allow easier suspension of the aggregates for printing techniques such as ink-jet deposition where the suspension of the aggregates for long periods is required. As an example, an aerogel carbon or metal oxide can have a density much lower than 1 $g/cm^3$.

The pore size distribution in the aggregate particles can also be controlled and the average internal pore size is preferably at least about 10 nanometers. Further, it is preferred that the average internal pore size is not greater than about 100 nanometers, more preferably is not greater than about 20 nanometers and even more preferably is not greater than about 15 nanometers.

Agglomeration of the aggregate particles can affect the properties of the powder batch, such as the ability to disperse the powder into liquids used to deposit the particles. The powders of the present invention advantageously have a controlled degree of agglomeration through defined size of the aggregates that reduces uncontrolled further agglomeration of the aggregate particles.

It is also an advantage of the present invention that the electrocatalyst aggregate particles are substantially spherical in shape. That is, the particles are preferably not jagged or irregular in shape. Spherical aggregate particles can advantageously be deposited using a variety of techniques, including direct write deposition, and can form layers that are thin and have a high packing density. In some cases, however, a low packing density is more preferable to achieve a highly porous feature. A narrow aggregate particle size distribution is more likely to give such a low packing density when the pores (spaces) between the aggregate particles have dimensions that are on the same length scale as the particles themselves. Preferably, the aggregates retain the spherical morphology when incorporated into a device, such as a fuel cell electrode. It has been found that when a substantial fraction of the aggregate particles retain their spherical morphology in the electrocatalyst layer, the device has improved electrocatalytic properties.

In addition, the electrocatalyst powders according to the present invention preferably have a well-controlled surface area. In one embodiment, the electrocatalyst particles have a surface area of at least about 10 $m^2/g$, more preferably at least about 25 $m^2/g$, more preferably at least about 90 $m^2/g$ and even more preferably at least about 600 $m^2/g$. Surface area is typically measured using the BET nitrogen adsorption method, which is indicative of the surface area of the powder including the internal surface area of accessible pores within the aggregate particles. High surface area combined with high dispersion of the active species generally leads to increased catalytic activity in an energy device.

As is discussed above, the electrocatalyst particles consist of an aggregate structure having a supported active species dispersed on and within the support phase. According to one embodiment of the present invention, the aggregate electrocatalyst particles preferably include a carbon support phase with at least about 1 weight percent active species phase, more preferably at least about 5 weight percent active species phase and even more preferably at least about 10 weight percent active species phase. In one embodiment, the particles include from about 20 to about 80 weight percent of the active species phase dispersed on the support phase. It has been found that such compositional levels give rise to the most advantageous electrocatalyst properties for many applications. However, the preferred level of the active species supported on the carbon support will depend upon the total surface area of the carbon, the type of active species phase and the application of the electrocatalyst. A carbon support having a low surface area will require a lower percentage of active species on its surface to achieve a similar surface concentration of the active species compared to a support with higher surface area and higher active species loading.

It is preferred that the average size of the active species is such that the aggregate particles include small single crystals or crystallite clusters, collectively referred to herein as clusters, of the active species dispersed on the support phase. According to one embodiment, the average active species cluster size (diameter) is preferably not greater than about 10 nanometers, more preferably is not greater than about 5 nanometers and even more preferably is not greater than about 3 nanometers. In one embodiment, the average cluster size of the active species is from about 0.5 to 5 nanometers. According to another embodiment of the present invention, at least about 50 percent by number, more preferably at least about 60 percent by number and even more preferably at least about 70 percent by number of the active species phase clusters have a size of not greater than about 3 nanometers. Electrocatalyst powders having a dispersed active species phase with such small crystallite clusters advantageously have enhanced catalytic properties as compared to powders including an active species phase having larger clusters. The method of the present invention advantageously permits control over the crystallinity by controlling the reaction temperature and/or residence time during particle formation.

When the active species includes a metal, the oxidation state of the metal in the metal phase is preferably close to zero, i.e., a pure metal. It is believed that higher oxidation states are detrimental to electrocatalytic activity. The method of the present invention advantageously enables good control over the oxidation state of the metal.

The electrocatalyst powders of the present invention preferably have a well-controlled average aggregate particle size. According to one embodiment of the present invention, the volume average aggregate particle size (diameter) is not greater than about 100 µm, preferably is not greater than about 20 µm and more preferably is not greater than about 10 µm. Further, it is preferred that the volume average aggregate particle size is at least about 0.3 µm, more preferably is at least about 0.5 µm and even more preferably is at least about 1 µm. As used herein, the average particle size is the median particle size ($d_{50}$). Powder batches having an average aggregate particle size satisfying the preferred parameters disclosed herein enable the formation of thin electrocatalytic layers which are advantageous for producing unique energy devices such as fuel cells according to the present invention.

The particle size distributions of the aggregate particles, the support phase particles, and the supported active species are important in determining catalytic performance and can be well controlled according to the present invention. Narrower aggregate particle size distributions are preferred to allow deposition of the aggregate particles through a narrow orifice without clogging and to enable the formation of thin layers. For example, it is preferred that at least about 75 volume percent of the particles have a size of not greater than about two times the volume average particle size. The particle size distribution can also be bimodal or trimodal. A bimodal or trimodal particle size distribution can advantageously provide improved packing density and hence a denser aggregate particle layer structure in the device.

The powders produced by the processes described herein, namely spray processing, do not contain agglomerates of the spherical aggregate particles. Therefore, no further processing is required to achieve unagglomerated suspensions. In fact, further processing methods such as ball milling and high-energy ultrasound will tend to break the aggregates, which is detrimental to their performance in an MEA. The aggregate size distributions described herein are measured by mixing samples of the powders in a medium such as water. The particle size of the agglomerates is then measured using light scattering, such as in a MICROTRAC particle size analyzer (Honeywell Industrial Automation and Control, Fort Washington, Pa.).

In one aspect, the present invention provides a method for preparing a powder batch, such as an electrocatalyst powder batch. A liquid precursor is converted to aerosol form and liquid from the droplets in the aerosol is removed while the aerosol is suspended to permit formation of the desired aggregate particles in a dispersed state.

The method for the production of the electrocatalyst powders according to the present invention, collectively referred to herein as spray processing, spray conversion or spray pyrolysis, generally includes the steps of: providing a liquid precursor which includes a precursor to the support phase (e.g., carbon) and a precursor to the active species (e.g., Pt); atomizing the precursor to form a suspension of liquid precursor droplets; and removing liquid from liquid precursor droplets to form the powder. For electrocatalysts that are not supported, the precursor to the support phase is not necessary. Typically, at least one component of the liquid precursor is chemically converted into a desired component of the powder.

According to the present invention, the drying of the precursors and the conversion to a catalytically active species are advantageously combined in one step, where both the removal of the solvent and the conversion of a precursor to the active species occur essentially simultaneously. Combined with a short reaction time, this enables control over the distribution of the active species on the support, the oxidation state of the active species and the crystallinity of the active species. By varying reaction time, temperature, type of support material and type of precursors, the method of the present invention can produce catalyst morphologies and supported active species structures that yield improved catalytic performance.

Thus, one important aspect of the method of the present invention is that the electrocatalyst aggregate particles are formed while the precursor to the active species phase is in intimate contact with the surface of the support phase particles that ultimately form the aggregate particle.

Another important aspect of the method in accordance with the present invention is that the active species precursor is rapidly reacted on the surface of the support phase particles. The reaction and formation of the supported active species preferably occurs over a very short period of time such that the growth of large active species clusters is reduced. Preferably, the active species precursor is exposed to the elevated reaction temperature to form the active species for not more than about 600 seconds, more preferably not more than about 100 seconds and even more preferably not more than about 10 seconds. The means by which the active species precursor is reacted is discussed in detail below.

Another unique aspect of spray processing according to the present invention is the simultaneous formation of a spherical aggregate particle structure. The spherical aggregate particles form as a result of the formation and drying of the droplets during spray processing and the properties of the support structure are influenced by the characteristics of the support phase particles such as the particle size, particle size distribution and surface area of the support phase particles.

The spray processing methods for electrocatalyst production according to the present invention can be grouped by reference to several different attributes of the apparatus used to carry out the method. These attributes include: the main gas flow direction (vertical or horizontal); the type of atomizer (submerged ultrasonic, ultrasonic nozzle, two-fluid nozzle, single nozzle pressurized fluid); the type of gas flow (e.g., laminar with no mixing, turbulent with no mixing, co-current of droplets and hot gas, countercurrent of droplets and gas or mixed flow); the type of heating (e.g., hot wall system, hot gas introduction, combined hot gas and hot wall, plasma or flame); and the type of powder collection system (e.g., cyclone, bag house, electrostatic or settling).

Figure 2:
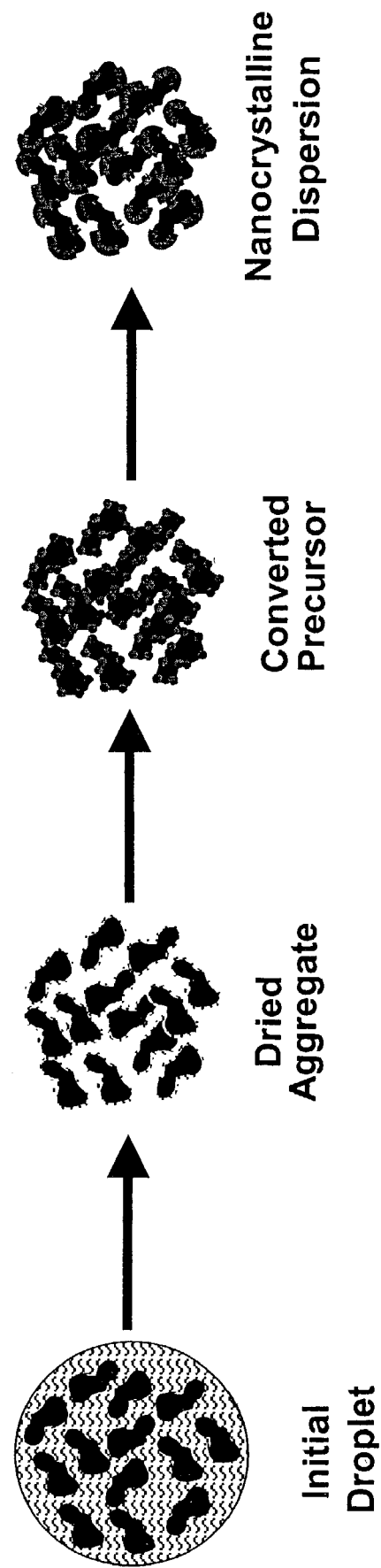
FIG. 2 illustrates the formation steps of a supported electrocatalyst formation according to an embodiment of the present invention.

For example, metal/carbon or metal oxide/carbon electrocatalyst powders can be prepared by starting with an aqueous-based precursor liquid consisting of colloidal carbon and a dissolved metal salt. The processing temperature of the precursor droplets can be controlled so the metal salt precursor decomposes leaving the carbon intact. FIG. 2 illustrates a schematic of the formation of a platinum on carbon (Pt/C) electrocatalyst particle.

The first step in the process is the evaporation of the solvent (typically water) as the droplet is heated resulting in a particle of dried solids and metal salts. A number of methods to deliver heat to the particle are possible: horizontal hot-wall tubular reactors, spray drier and vertical tubular reactors can be used, as well as plasma, flame and laser reactors. As the particles experience either higher temperature or longer time at a specific temperature, the metal precursor decomposes. Using the spray processing method of the present invention, the temperature and time that the droplets/particles experience can be controlled and therefore the degree of crystallinity and dispersion of the supported active species phase can also be controlled.

The atomization technique for generating the precursor droplets has a significant influence over the characteristics of the final electrocatalyst powder such as the spread of the aggregate particle size distribution (PSD), as well as the production rate of the powder. In extreme cases, some techniques cannot atomize fluids with even moderate particle loadings or high viscosities.

Several methods exist for the atomization of precursor compositions containing suspended particulates such as carbon. These methods include but are not limited to: ultrasonic transducers (usually at a frequency of 1-3 MHz); ultrasonic nozzles (usually at a frequency of 10-150 KHz); rotary atomizers; two-fluid nozzles; and pressure atomizers.

Ultrasonic transducers are generally submerged in a liquid and the ultrasonic energy produces atomized droplets on the surface of the liquid. Two basic ultrasonic transducer disc configurations, planar and point source, can be used. Deeper fluid levels can be atomized using a point source configuration since the energy is focused at a point that is some distance above the surface of the transducer. The scale-up of submerged ultrasonic transducers can be accomplished by placing a large number of ultrasonic transducers in an array. Such a system is illustrated in U.S. Pat. No. 6,103,393 by Kodas et al., the disclosure of which is incorporated herein by reference in its entirety.

Scale-up of nozzle systems can be accomplished by either selecting a nozzle with a larger capacity or by increasing the number of nozzles used in parallel. Typically, the droplets produced by nozzles are larger than those produced by ultrasonic transducers. Particle size is also dependent on the gas flow rate. For a fixed liquid flow rate, an increased airflow decreases the average droplet size and a decreased airflow increases the average droplet size. It is difficult to change droplet size without varying the liquid or airflow rates. However, two-fluid nozzles have the ability to process larger volumes of liquid per time than ultrasonic transducers.

Ultrasonic spray nozzles also use high frequency energy to atomize a fluid. Ultrasonic spray nozzles have some advantages over single or two-fluid nozzles such as the low velocity of the spray leaving the nozzle and lack of associated gas flow. The nozzles are available with various orifice sizes and orifice diameters that allow the system to be scaled for the desired production capacity. In general, higher frequency nozzles are physically smaller, produce smaller droplets, and have a lower flow capacity than nozzles that operate at lower frequencies. A drawback of ultrasonic nozzle systems is that scaling up the process by increasing the nozzle size increases the average particle size. If a particular particle size is required, then the maximum production rate per nozzle is set. If the desired production rate exceeds the maximum production rate of the nozzle, additional nozzles or complete production units will be required to achieve the desired production rate.

The shape of the atomizing surface determines the shape and spread of the spray pattern. Conical, microspray and flat atomizing surface shapes are available. The conical atomizing surface provides the greatest atomizing capability and has a large spray envelope. The flat atomizing surface provides almost as much flow as the conical but limits the overall diameter of the spray. The microspray atomizing surface is for very low flow rates where narrow spray patterns are needed. These nozzles are preferred for configurations where minimal gas flow is required in association with the droplets.

Particulate carbon suspensions that are often used for spray conversion according to the present invention present several problems with respect to atomization. For example, submerged ultrasonic atomizers re-circulate the suspension through the generation chamber and the suspension concentrates over time. Further, some fraction of the liquid atomizes without carrying the suspended carbon particulates. Other problems encountered when using submerged ultrasonic transducers is that the transducer discs can become coated with the particles over time. Further, the generation rate of carbon suspensions is very low using submerged ultrasonic transducer discs. This is due in part to energy being absorbed or reflected by the suspended particles.

Submerged ultrasonic transducers are useful for the production of electrocatalyst aggregate particles having a low carbon support phase content, such as not greater than about 40 wt. %, more preferably not greater than 20 wt. % and even more preferably not greater than 10 wt. % carbon in the final electrocatalyst. They are also preferred for particles that are formed exclusively from dissolved precursors as opposed to particulate precursors.

For spray drying, the aerosol can be generated using three basic methods. These methods differ in the type of energy used to break the liquid masses into small droplets. Rotary atomizers (utilization of centrifugal energy) make use of spinning liquid droplets off of a rotating wheel or disc. Rotary atomizers are useful for co-current production of droplets in the range of 20 to 150 µm in diameter. Pressure nozzles (utilization of pressure energy) generate droplets by passing a fluid under high pressure through an orifice. These can be used for both co-current and mixed-flow reactor configurations and typically produce droplets in the range of 50 to 300 µm. Multiple fluid nozzles such as a two fluid nozzle (utilization of kinetic energy) produce droplets by passing a relatively slow moving fluid through an orifice while shearing the fluid stream with a relatively fast moving gas stream. As with pressure nozzles, multiple fluid nozzles can be used with both co-current and mixed-flow spray dryer configurations. This type of nozzle can typically produce droplets in the range of 5 to 200 µm.

For example, two-fluid nozzles are used to produce aerosol sprays in many commercial applications, typically in conjunction with spray drying processes. In a two-fluid nozzle, a low-velocity liquid stream encounters a high-velocity gas stream that generates high shear forces to accomplish atomization of the liquid. A direct result of this interaction is that the droplet size characteristics of the aerosol are dependent on the relative mass flow rates of the liquid precursor and nozzle gas stream. The velocity of the droplets as they leave the generation zone can be quite large which may lead to unacceptable losses due to impaction. The aerosol also leaves the nozzle in a characteristic pattern, typically a flat fan, and this may require that the dimensions of the reactor be sufficiently large to prevent unwanted losses on the walls of the system.

Figure 3:
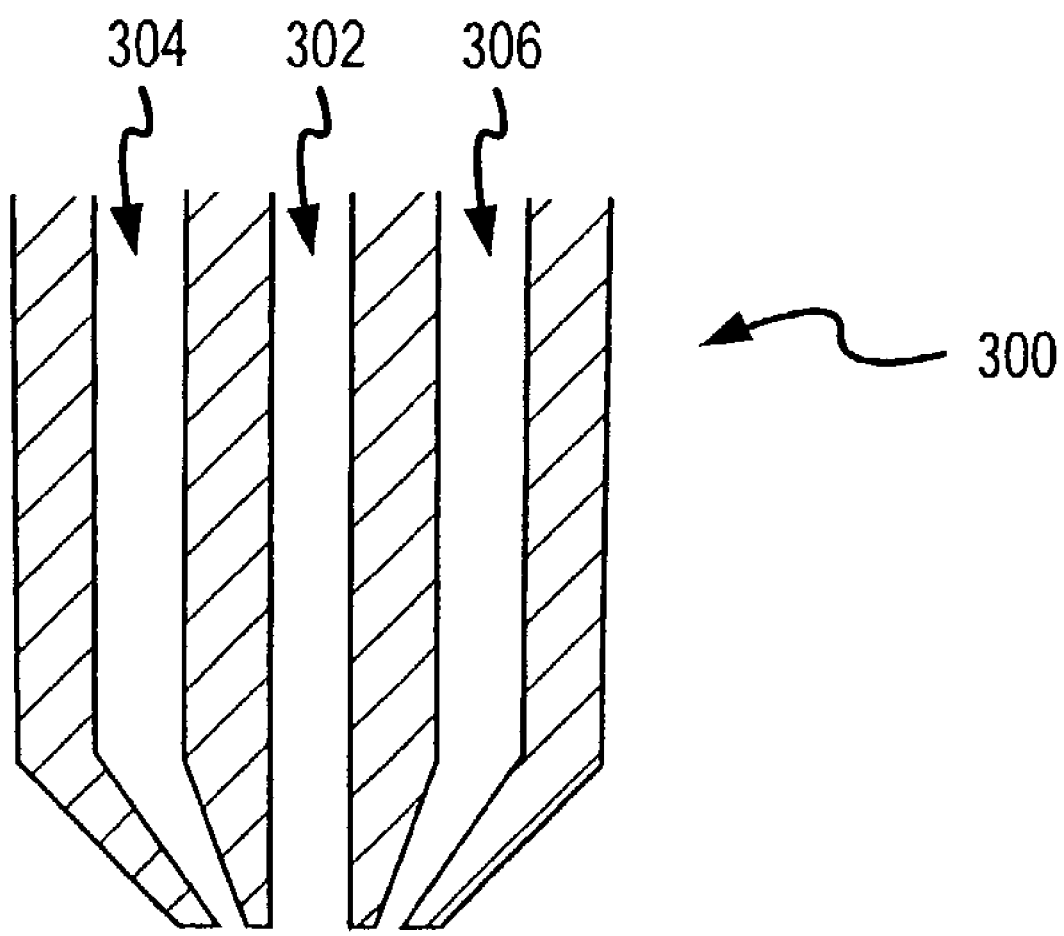
FIG. 3 illustrates a two-fluid nozzle that is useful for the production of electrocatalyst powders according to the present invention.

A two-fluid nozzle is illustrated in FIG. 3. The two fluid nozzle 300 includes a central aperture 302 for directing the liquid precursor into the chamber. Two outer apertures 304 and 306 direct a jet of air or other gas toward the liquid precursor stream as the liquid precursor is sprayed out of the central aperture 302 and the large shear forces form an aerosol. The droplet size characteristics of the aerosol are dependent on the relative mass flow rates of the liquid precursor and nozzle gas stream.

Thus, a variety of atomization techniques for spray conversion processes is possible for electrocatalyst powder production and different versions are preferred for different feed streams and products.

The atomized precursor must be heated to remove solvents and react precursor components. For example, a horizontal, tubular hot-wall reactor can be used to heat a gas stream to a desired temperature. Energy is delivered to the system by maintaining a fixed boundary temperature at the wall of the reactor and the maximum temperature of the gas is the wall temperature. Heat transfer within a hot wall reactor occurs through the bulk of the gas. Buoyant forces that occur naturally in horizontal hot wall reactors aid this transfer. The mixing also helps to improve the radial homogeneity of the gas stream. Passive or active mixing of the gas can also increase the heat transfer rate. The maximum temperature and the heating rate can be controlled independent of the inlet stream with small changes in residence time. The heating rate of the inlet stream can also be controlled using a multi-zone furnace.

The use of a horizontal hot-wall reactor according to the present invention is preferred to produce particles with a size of not greater than about 5 µm. Above about 5 µm, settling of particles can cause significant material losses. One disadvantage of such reactors is the poor ability to atomize particulate carbons when using submerged ultrasonics for atomization. As is discussed above, this approach is preferred for products with high metal loadings corresponding to low carbon contents where atomization is sufficient to enable economical production.

In another embodiment, the horizontal hot-wall reactor can be used with a two-fluid nozzle to atomize the droplets. This approach is preferred for precursor feed streams containing higher levels of carbon. A horizontal hot-wall reactor can also be used with ultrasonic nozzle atomization techniques. This allows atomization of precursor containing particulate carbons, however the large droplet size leads to losses of materials on reactor walls and other surfaces making this an expensive method for powder production.

While horizontal hot-wall reactors are useful according to the present invention, spray processing systems in the configuration of a spray drier are the generally preferred production method for large quantities of electrocatalyst powders according to the present invention.

Spray drying is a process wherein powders are produced by atomizing a precursor to produce droplets and evaporating the liquid to produce a dry aerosol, wherein thermal decomposition of one or more precursors may take place to produce the powder. The residence time in the spray dryer is the average time the process gas spends in the drying vessel as calculated by the vessel volume divided by the process gas flow using the outlet gas conditions. The peak excursion temperature (i.e., the reaction temperature) in the spray dryer is the maximum temperature of a particle, averaged throughout its diameter, while the particle is being processed and/or dried. The droplets are heated by supplying a pre-heated carrier gas.

Three types of spray dryer systems are useful for the spray drying of electrocatalyst powders according to the present invention. An open system is useful for general spray drying of electrocatalyst powders using air as an aerosol carrier gas and an aqueous feed solution as a precursor. A closed system is useful for spray drying of electrocatalyst powders using an aerosol carrier gas other than air. A closed system is also useful when using a non-aqueous or a semi-non-aqueous solution as a precursor. A semi-closed system, including a self-inertizing system, is useful for spray drying of electrocatalyst powders that require an inert atmosphere and/or precursors that are potentially flammable.

In addition, two spray dryer designs are particularly useful for the production of electrocatalyst powders. A co-current spray dryer is useful for production of electrocatalyst powders that are sensitive to high temperature excursions (e.g., greater than about 350° C.) or that require a rotary atomizer to generate the aerosol. Mixed-flow spray dryers are useful for producing powders that require relatively high temperature excursions (e.g., greater than about 350° C.) or require turbulent mixing forces.

In a co-current spray dryer, the hot gas is introduced at the top of the unit where the droplets are generated with any of the atomization techniques mentioned above. The maximum temperature that a droplet/particle is exposed to in a co-current spray dryer is the temperature of the outlet. Typically, the outlet temperature is limited to about 200° C., although some designs allow for higher temperatures. In addition, since the particles experience the lowest temperature in the beginning of the time-temperature curve and the highest temperature at the end, the possibility of precursor surface diffusion and agglomeration is high.

A more preferred spray conversion system is based on a mixed-flow spray dryer. A mixed-flow spray dryer introduces the hot gas at the top of the unit and the precursor droplets are generated near the bottom and are directed upwardly. The droplets/particles are forced towards the top of the unit then fall and flow back down with the gas back down, increasing the residence time in the spray dryer. The temperature the particles experience is also higher as compared to a co-current spray dryer. This is important, as most spray dryers are not capable of reaching the higher temperatures that are required for conversion of some precursor salts.

These conditions are advantageous for aggregate electrocatalyst particle synthesis at a wide range of metal active species loadings, such as up to about 90 wt. % metal on carbon. For mixed flow spray dryers the reaction temperatures can be high enough for the decomposition of metal active species precursors such as Pt precursors (e.g., between 250° C. and 300° C.). The highest temperature in these spray dryers is the inlet temperature (e.g., 600° C. and higher), and the outlet temperature can be as low as 90° C. Therefore, the electrocatalyst particles reach the highest temperature for a relatively short time, which advantageously reduces precursor migration or surface diffusion. This spike of high temperature quickly converts the metal or metal oxide precursor and is followed by a mild quench since the spray dryer temperature quickly decreases after the maximum temperature is achieved. Thus, the spike-like temperature profile is advantageous for the generation of highly dispersed metal or metal oxide active species clusters on the surface of the support phase.

The range of useful residence times for producing electrocatalyst powders depends on the spray dryer design type, atmosphere used, nozzle configuration, feed liquid inlet temperature and the residual moisture content. In general, residence times for the production of electrocatalyst powders can range from 5 seconds up to 5 minutes. According to one embodiment, the residence time is from about 15 to about 45 seconds using a mixed flow spray dryer with air as a carrier gas, a two-fluid nozzle with greater than 2:1 air to feed mass ratio and an aqueous feed solution at a 530° C. inlet temperature with less than 2% residual moisture content.

The range of inlet temperatures for producing electrocatalyst powders depends on the spray dryer design type, atmosphere used, nozzle configuration, feed liquid, and energy required to perform drying and/or decomposition functions. Useful inlet temperatures should be sufficiently high to accomplish the drying and/or decomposition functions without promoting significant surface diffusion of catalytic material to reduce its performance.

In general, the outlet temperature of the spray dryer determines the residual moisture content of the powder. For the production of electrocatalyst powder, the range of useful outlet temperatures depends on the spray dryer design type, atmosphere used, nozzle configuration, feed liquid, inlet temperature, and residual moisture content. For example, a useful outlet temperature according to one embodiment of the present invention ranges from about 200° C. to about 350° C.

Other equipment that is desirable for producing electrocatalyst powders using a spray dryer includes a heater for the gas and a collection system. Either direct heating or indirect heating, including burning fuel, heating electrically, liquid-phase heating or steam heating, can accomplish heating of the gas. The most useful type of heating for the production of electrocatalyst powders processed with an inlet temperature greater than 350° C. is direct fuel burning.

Many collection methods are useful for collecting electrocatalyst powders produced on a spray dryer. These methods include, but are not limited to those using cyclone, bag/cartridge filter, electrostatic precipitator, and various wet collection techniques.

Figure 4:
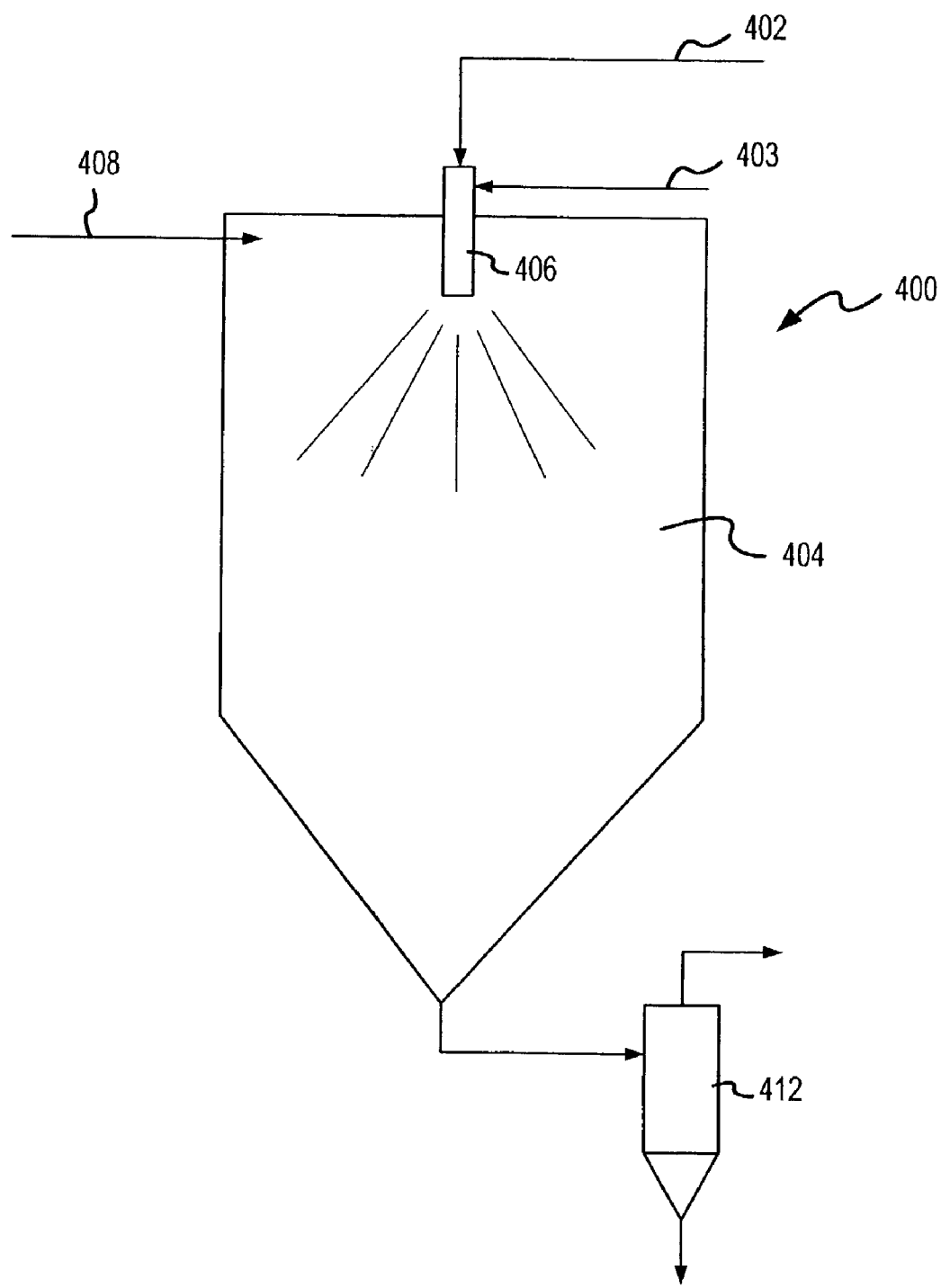
FIG. 4 illustrates a mixed-flow spray dryer that is useful for the production of electrocatalyst powders according to the present invention.

A mixed flow spray dryer system that is useful according to the present invention is schematically illustrated in FIG. 4. The spray dryer 400 includes a precursor feed line 402 for delivering liquid precursor to the drying chamber 404 and a drying gas line 403. The precursor feed 410 is fed to a pump 411, which moves the precursor feed up the precursor feed line 402. The liquid precursor is dispersed into droplets through a spray nozzle 406. Drying air is introduced at the top of the chamber 404 through a hot gas inlet 408. The liquid droplets are dried and collected in a cyclone 412.

In the foregoing description of the basic components of a spray dryer, it should be noted that during spray drying the precursor mixture actually undergoes a chemical conversion. For example, a platinum precursor, such as platinum amine nitrate, is converted to platinum metal. Minor variations in reaction temperature and precursor composition can result in electrocatalyst powders with different electrocatalytic activities.

In accordance with the foregoing, it has been advantageously found according to the present invention that relatively low conversion temperatures (e.g., the peak excursion temperature) can be used to obtain high quality electrocatalyst powder. In one embodiment, it is preferred that the conversion temperature is not greater than about 400° C., more preferably not greater than about 300° C. and even more preferably not greater than about 250° C. Further, it is preferred that the conversion temperature is at least about 100° C. and more preferably at least about 150° C. Increasing the conversion temperature to over 400° C. can remove excess surfactant that may remain on the powder and poison the oxide active sites.

According to another embodiment of the present invention, a hybrid vertical hot-wall/hot-gas tubular reactor can be used. In the case of powders generated with submerged ultrasonic transducers, particle settling is not a problem due to the low settling velocity of the micrometer-sized particles generated in this fashion. However, not all liquid precursors atomize well using an ultrasonic transducer, such as colloidal carbon suspensions. Therefore, a different atomization technique is preferred, such as an ultrasonic spray nozzle or a two-fluid nozzle, which tend to produce droplets with sizes larger than about 5 μm to 10 μm. This requires a vertical reactor system to avoid settling losses.

Figure 5:
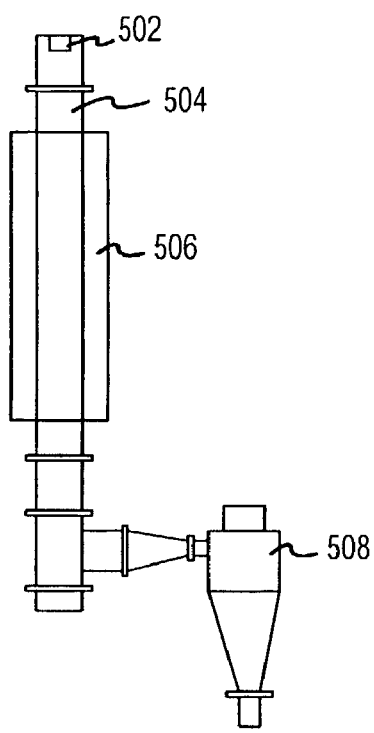
FIG. 5 illustrates a hybrid vertical reactor system that is useful for spray conversion to form particles according to the present invention.

A hybrid vertical reactor system, such as that illustrated in FIG. 5, takes advantage of both a high-temperature hot-wall system and a large capacity spray drying system that uses hot air introduction along with a larger nozzle to produce larger droplets that increase the overall output rate. The preferred system also has an increased radial size as compared to a standard horizontal system. A longer furnace, with adequate power (typically three times the thermodynamic requirement) is required to insure a proper time/temperature history. The system can be operated up to a sufficiently high conbversion temperature, such as up to about 700° C., to decompose most molecular precursors. A stainless steel tube that is resistant to high temperatures is a preferred reaction tube. High-temperature gaskets with water-cooling are also preferred. Once the high-temperature drying/conversion has taken place, a rapid cool-down or quench can be implemented before powder collection to minimize active species cluster growth. Another preferred aspect is the ability to use high-temperature gas as the drying/conversion means, independent of a hot wall. This high-temperature gas can provide any type of desired atmosphere, from reducing to oxidizing.

Referring to FIG. 5, a nozzle 502 delivers precursor into the top of the system. A carrier gas is pre-heated to a controlled temperature, up to about 1000° C. and is then introduced at the top of the system through a cylindrical dispersion 504 just below the nozzle 502. The hot carrier gas and the droplets then flow down through a vertical hot-wall reactor tube 506 where the wall temperature can be controlled. After the droplets are dried and converted, the powder is then cooled and collected in a cyclone or filter bag 508. This configuration increases the production rate relative to other spray conversion systems by allowing larger droplets (with higher settling velocities) to be generated while decreasing losses as compared to a horizontal reactor system. The hybrid vertical system can provide an order of magnitude increase in production rate over horizontal systems. Another advantage of a vertical system is the ability to tailor the time-temperature history of the aerosol to virtually any useful profile.

This hybrid system allows for operation in three modes. The first mode is as a hot wall tubular reactor. The second mode is co-current flow hot gas drying similar to a spray dryer. The third mode uses both a hot wall and a hot gas. Hot or cold gas flows can be introduced before or after the furnace to maintain the desired particle temperature.

Operation with three types of nozzles in the hybrid system were compared: a large capacity 25 kHz nozzle (12.5 Lph max) with a conical spray pattern; a medium capacity 48 kHz nozzle (4.5 Lph max) with a flat cylindrical spray pattern; and a low capacity 120 kHz nozzle (1.3 Lph max) with a conical spray pattern.

Conical tip nozzles have a spray pattern that is generally too wide for tubular systems, and low frequency ultrasonic nozzles produce droplets that are generally too large to dry in a short time period. The medium and large capacity nozzles (lower frequencies) generated droplets that were too large for complete evaporation even at reduced liquid throughputs. Using a small 120 kHz nozzle, complete liquid evaporation was achievable at liquid flow rates less than 0.8 Lph at maximum gas and wall temperatures. Thus, in one preferred embodiment, a flat, high frequency ultrasonic nozzle is used. This type of nozzle gives a fairly narrow, monomodal size distribution and relatively small droplets, which evaporate and convert to electrocatalyst. In contrast to other systems of similar size, the hybrid reactor furnace is capable of drying and converting up to 0.7 Lph of a 5 wt. % carbon precursor resulting in 35 g/hour catalyst production rate.

Regardless of the selected reactor system, the first step in the fabrication of the electrocatalyst particles according to the present invention is to form a liquid precursor to the particles. In the case of supported electrocatalyst powders, the liquid precursor includes a precursor to both the active species and the support phase. Proper selection of the precursors enables the production of particles having well-controlled chemical and physical properties.

For the production of aggregate electrocatalyst particles including a metal active species on a carbon support phase according to the present invention, the precursor solution includes at least one metal precursor. The metal precursor may be a substance in either a liquid or solid phase. Preferably, the metal precursor will be a metal-containing compound, such as a salt, dissolved in a liquid solvent of the liquid feed. For example, the precursor solution can include nitrates, chlorides, sulfates, hydroxides, or carboxylates of a metal. However, chloride salts may lead to detrimental catalytic properties overtime. The metal precursor will undergo one or more chemical reactions when heated to convert to a metallic state and form the catalytically active species. It may be desirable to either add an acid or a base to the precursor solution to increase the solubility, such as by adding hydrochloric acid or ammonium hydroxide.

A preferred catalytically active metal species according to one embodiment of the present invention is platinum (Pt). Preferred precursors for platinum metal according to the present invention include chloroplatinic acid ($H_2PtCl_6 \cdot xH_2O$), tetraamineplatinum (II) nitrate ($Pt(NH_3)_4(NO_3)_2$), tetraamineplatinum (II) hydroxide ($Pt(NH_3)_4(OH)_2$), tetraamineplatinum (II) bis(bicarbonate) ($Pt(NH_3)_4(HCO_3)_2$), platinum nitrate ($Pt(NO_3)_2$) and hexa-hydroxyplatinic acid ($H_2Pt(OH)_6$). Other platinum precursors include Pt-nitrates, Pt-amine nitrates, Pt-hydroxides, Pt-carboxylates, $Na_2PtCl_4$, and the like. Chloroplatinic acid is soluble in water and the solutions advantageously maintain a low viscosity. $H_2Pt(OH)_6$ is advantageous since it converts to platinum metal at relatively low temperatures.

According to another embodiment of the present invention, palladium (Pd) is preferred as a catalytically active metal species. Palladium precursors include inorganic Pd salts such as palladium (II) chloride ($PdCl_2$), palladium (II) nitrate ($Pd(NO_3)_2$), $H_2PdCl_4$, or $Na_2PdCl_4$. Complex Pd salts such as tetraaminepalladium (II) nitrate ($Pd(NH_3)_4(NO_3)_2$), $Pd(NH_3)_4Cl_2$ or $Pd(NH_3)_2(OH)_2$, Pd-trifluoroacetate, Pd-carboxylates, and the like are also useful.

Silver (Ag) is also useful as a catalytically active metal. For silver, inorganic salts can be used including Ag-nitrate ammine complexes, Ag-carboxylates and Ag-oxalate. Particularly preferred are silver carbonate ($Ag_2CO_3$), silver nitrate ($AgNO_3$), silver acetate ($AgOOCCH_3$) and silver trifluoroacetate ($AgOOCCF_3$).

Other useful catalytically active metals include osmium (Os) and copper (Cu). For osmium, inorganic salts such as $OsCl_3$ can be used. For copper, copper (II) acetate ($Cu(OOCH_3)_2$), copper (II) chloride ($CuCl_2$), copper formate, copper (II) nitrate ($Cu(NO_3)_2$), copper (II) perchlorate ($Cu(ClO_4)_2$) and copper carboxylates can be used.

For the production of metal oxide-containing electrocatalyst powders, including supported and unsupported metal oxides, a precursor to the metal oxide must be included in the precursor solution. For metal oxides, including oxides of Au, Ag, Pt, Pd, Ni, Co, Rh, Ru, Fe, Mn, Cr, Mo, Re, W, Ta, Nb, V, Hf, Zr, Ti or Al, inorganic salts including nitrates, chlorides, hydroxides, halides, sulfates, phosphates, carboxylates, oxalates and carbonates can be used as precursors. Oxides of the metals can also be used as a precursor to a metal oxide in the final powder.

Particularly preferred metal oxide precursors include: $K_2Cr_2O_7$, Cr-carboxylates and Cr-oxalate for chrome oxide; $KMnO_4$, Mn-nitrate, Mn-acetate, Mn-carboxylates, Mn-alkoxides and $MnO_2$ for manganese oxide; $Na_2WO_4$ and $W_2O_3$ for tungsten oxide; $K_2MoO_4$ and $MoO_2$ for molybdenum oxide; Co-amine complexes, Co-carboxylates and cobalt oxides for cobalt oxide; Ni-amine complexes, Ni-carboxylates and nickel oxides, for nickel oxide; and Cu-amine complexes, Cu-carboxylates and copper oxides for copper oxide.

According to one preferred embodiment of the present invention, the precursor to the metal or metal oxide is a cationic precursor. A cationic precursor is a precursor wherein the metal (e.g., Pt) is part of the cationic species of the precursor salt. For example, a preferred cationic precursor for platinum metal is tetraamineplatinum (II) nitrate.

The reactor systems described above are not commonly used for spray processing wherein precursors to a material component are dried and reacted in one step. Converting the precursors in a spray dryer or similar apparatus is possible according to the present invention due to the use of precursors and/or additives that convert (e.g., decompose) at a reduced temperature, such as not greater than about 400° C., more preferably not greater than about 300° C. and even more preferably not greater than about 250° C.

Low thermal decomposition temperature precursors that are useful at such low conversion temperatures according to the present invention to form metals include carboxylates, hydroxides, halides, nitrates, metal-organic complexes, amine adducts, isonitrile compounds, Schiff base complexes, beta-diketonates, alkyls, phosphine complexes, phosphite complexes and carbonyl complexes of metals such as Ni, Ag, Pd, Pt, Rh, Sn, Cu, Au, Co, Ir, Ru and Os.

For metal oxides, useful low temperature precursors include oxocomplexes, alkoxides, amides, carboxylates, hydroxides, halides, nitrates, metal-organic complexes, amine adducts, isonitrile compounds, Schiff base complexes, beta-diketonates, alkyls, phosphine complexes, phosphite complexes and carbonyl complexes of metals such as Sc, Y, La, lanthanides, Ti, Zr, Hf, V, Nb, Ta, Cr, Mo, W, Mn, Re, Fe, Ru, Os, Co, Rh, Ir and Sn.

When a metal is the supported active species phase, additives to ensure reduction to the metal at a low temperature can advantageously be used and will generally be in the form of soluble reducing agents and may either reduce the dissolved complex before spraying or during spraying. Preferably, the reducing agent will not substantially reduce the precursor at room temperature, but will cause reduction at an elevated temperature between about 100° C. and 400° C. These reducing agents should also be water stable and any volatile species that form from the reduction should be capable of being removed from the system. Examples include boranes, borane adducts (e.g., trimethylaminaborane, $BH_3NMe_3$), silane derivatives, e.g., $SiH_{(4-x)}R_x$ (where R=an organic group, aryl, alkyl, or functionalized alkyl or aryl group, polyether, alkyl carboxylate) borohydrides, e.g., $NaBH_4$, $NH_4BH_4$, $MBH_{(3-x)}R_x$ (where R=an organic group, aryl, alkyl, or functionalized alkyl or aryl group, polyether, alkyl carboxylate), alanes and tin hydrides.

According to a particularly preferred embodiment, a reducing agent for platinum metal is selected from the group consisting of primary alcohols (e.g., methanol and ethanol), secondary alcohols (e.g., isopropanol), tertiary alcohols (e.g., t-butanol), formic acid, formaldehyde, hydrazine and hydrazine salts. For example, an acidified solution of $H_2Pt(OH)_6$ in the presence of formic acid is stable at room temperature but is reduced to platinum metal at low reaction temperatures, such as about 100° C.

The metal precursors may also be reduced prior to spray processing of the material to enable processing at lower temperatures and the incorporation of other species. For example, platinum can be dispersed on a carbon support, as it is in the normal solution precipitation process referred to above. This dispersion of platinum on carbon can then be spray converted to spherical aggregates, which avoids the need for lengthy filtration and other processing steps to form a powder having a controlled aggregate particle size and size distribution. Furthermore, additional materials can be added to the mixture to achieve additional functionality in the aggregate electrocatalyst particles. The additional materials can include organic polymers that control hydrophobicity (e.g., a polytetrafluoraethylene compound, such as TEFLON) or proton-conducting polymers that control proton transport characteristics. In this particular case, where organic materials are added with the intention of retaining their functionality in the final product, the pre-reduction and dispersion of the active species on the carbon support enables the liquid mixture to be spray processed at low temperature conditions to form an aggregate structure combined with the other advantages of spray processing such as the formation of controlled aggregate size and size distribution, fewer processing steps and the elimination of filtration steps.

The catalyst aggregates containing one type of active species and formed in one spray-processing step can be further re-dispersed in a solvent to which additional precursors (e.g., TEFLON, NAFION, soluble precursors to metal or metal oxides other than the one deposited in the first processing step) can be added to form multi-component or multifunctional catalyst particles. This suspension of spray processed particles in combination with new precursors can then be further spray processed to form functional structures which are otherwise unattainable by a single step spray processing. This procedure can be repeated a number of times until the desired catalyst microstructure is achieved.

For a metal oxide as the active species phase, additives to ensure oxidation to the metal oxide at low temperature can also be used and will generally be in the form of soluble oxidizing agents and may either oxidize the dissolved complex before spraying or during spraying. Preferably, the oxidizing agent will not oxidize the precursor to the metal oxide at room temperature, but will cause reduction at elevated temperature between about 100° C. and 400° C. These species should also be water stable and form volatile species that can be removed from the system. Examples include amine oxides, e.g., trimethylamine-N-oxide ($Me_3NO$), oxidizing mineral acids such as nitric acid, sulfuric acid and aqua regia, oxidizing organic acids such as carboxylic acids, phosphine oxides, hydrogen peroxide, ozone or sulfur oxides.

The precursor solution can include other additives such as surfactants, wetting agents, pH adjusters or the like. It is preferred to minimize the use of such additives, however, while maintaining good dispersion of the precursors. Excess surfactants, particularly high molecular weight surfactants, can remain on the electrocatalyst particle surface and degrade the catalytic activity if not fully removed.

For the production of aggregate electrocatalyst particles having a carbon support phase, the precursor solution also includes at least one carbon precursor. The carbon precursor can be an organic precursor such as carboxylic acid, benzoic acid, polycarboxylic acids such as terephthalic, isophthalic, trimesic and trimellitic acids, or polynuclear carboxylic acids such as napthoic acid, or polynuclear polycarboxylic acids. Organic precursors can react by a mechanism such as:

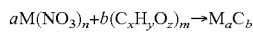

$$aM(NO_3)_n + b(C_xH_yO_z)_m \rightarrow M_aC_b$$

However, the use of a liquid organic carbon precursor typically results in the formation of amorphous carbon.

Preferably, the carbon support phase precursor is a dispersion of suspended carbon particles. The carbon particles can be suspended in water, with additives such as surfactants if necessary to stabilize the suspension. The carbon particles used as the precursor are the support phase particles that constitute the aggregate electrocatalyst particles.

The properties of the support phase particles strongly influence the properties of the electrocatalyst particles. For example, according to one embodiment, the carbon support phase particles preferably have a BET surface area of at least about 20 m²/g, more preferably at least about 80 m²/g, even more preferably at least about 250 m²/g and most preferably at least about 1200 m²/g. The surface area of the particulate carbon precursor strongly influences the surface area of the aggregate electrocatalyst powder, and therefore strongly influences the electrocatalytic activity of the electrocatalyst powder.

The particulate carbon is small enough to be dispersed and suspended in the droplets generated from the liquid precursor. According to one embodiment, the particulate carbon preferably has an average size of from about 10 to about 100 nanometers, more preferably from about 20 to about 60 nanometers. However, carbon particulates having larger sizes, such as larger than about 0.3 µm and up to about 25 µm, can also be used. The carbon can be crystalline (graphitic), amorphous or a combination of different carbon types. The particles can also have a graphitic core with an amorphous surface or an amorphous core with a graphitic surface.

The surface characteristics of the carbon particles constituting the support phase can also be varied. It is preferred that the particle surfaces enhance the dispersion of the precursor particles into the precursor liquid before processing to form the final particles. After processing to form the aggregate particle structures, it is preferred that the surfaces have a controlled surface chemistry. Oxidized carbon surfaces can expose hydroxyl, carboxyl, aldehyde, and other functional groups, which make the surface more hydrophilic. Reduced carbon surfaces terminate in hydrogen, which promotes hydrophobicity. The ability to select the surface chemistry allows tailoring of the hydrophobicity of the surfaces, which in turn allows the formation of gradients in hydrophobicity within layers of deposited particles. Oxidized carbon surfaces also tend to be microetched, corresponding to a higher surface area while reduced carbon surfaces have a lower surface area. Oxidized carbon surfaces can be derivatized by reaction with various agents that allow coupling of various oxygen containing groups to the surface to further tailor the surface chemistry. This allows the addition of inorganic, organic, metal organic or organometallic compounds to the carbon surface.

Among the convenient sources of dispersed carbon are commercially available carbon-based lubricants that are a suspension of fine carbon particles, commonly referred to as carbon blacks, in an aqueous medium. Particularly preferred are acetylene carbon blacks having high chemical purity and good electrical conductivity. Examples of such carbon suspensions that are available commercially are GRAFO 1322 (Fuchs Lubricant, Co., Harvey, Ill.), which is a suspension of VULCAN XC-72 furnace black (Cabot Corp., Alpharetta, Ga.) having an average size of about 30 nanometers and a surface area of about 254 m²/g. GRAFO 1300 (Fuchs Lubricant Co., Harvey, Ill.) is a suspension of SHAWINIGAN BLACK (Chevron Chemical Co., Houston, Tex.), an acetylene carbon black having an average particle size of about 55 nanometers. Also preferred are BLACKPEARLS 2000 (Cabot Corp., Alpharetta, Ga.) and KETJENBLACK (Akzo Nobel, Ltd., Amersfoort, Netherlands), each of which includes carbon having a specific surface area of from about 1300 m²/g to 1500 m²/g. Another preferred class of carbon materials are activated carbons which have a degree of catalytic activity. Examples include NORIT NK (Cabot Corp., Alpharetta, Ga.) and PWA (Calgon Carbon Corp., Pittsburgh, Pa.) having an average particle size of about 20 µm and a surface area of about 700 m²/g to 820 m²/g.

A stable precursor suspension is necessary to ensure a homogeneous feedstock. A precursor that is unstable will settle in the feed reservoir during processing, resulting in droplets of varying composition, and ultimately will affect the electrocatalyst powder characteristics. In this case, a preferred mode of operation is one in which the suspension of carbon particles with molecular precursors to the metal, metal oxide or other catalytically active material is stirred to keep the particles from settling.

It is preferable to mechanically dissociate agglomerates of the carbon powders by using, for example, a blade grinder or other type of high-speed blade mill. Thus, dispersing the carbon powder in water preferably includes: 1) if not already provided in suspension, wetting of the carbon black powder by mixing a limited amount of the dry powder with a wetting agent and a soft surfactant; 2) diluting the initial heavy suspension with the remaining water and a basic surfactant diluted in the water; and 3) breaking secondary agglomerates by sonification of the liquid suspension in an ultrasonic bath.

The precursor to the metal or metal oxide supported active species is preferably dissolved separately in the solvent and added in an appropriate amount to the carbon suspension, prior to breaking the secondary agglomerates. Adding the metal salt in this manner advantageously facilitates breaking the larger agglomerates and the mixing results in a less viscous slurry. After sonification, the slurries are stable for several months without any apparent sedimentation or separation of the components.

Spray processing is a valuable processing method because the particles are raised to a high temperature for a very short period of time. The relatively high temperature achieves conversion of the molecular precursor to the final desired phase, but the short time ensures little surface diffusion that can cause agglomeration of the nanometer-sized active species phase. Hence, the support structure is formed with a nanometer-sized active species phase dispersed on the support.

In many applications, the electrocatalyst powders and other powders are formed into a layer, often in combination with other materials as part of a device such as a fuel cell. The method by which these materials are deposited has a strong influence on the characteristics of the deposited electrode layer. In turn, the characteristics of the deposited electrode layer also have a strong influence on the performance of the device. Layer characteristics that are important include average thickness of the layer, porosity of the layer, compositional homogeneity, nature of the interface with other layers, control over the compositional gradient within the layer and the hydrophobicity, hydrophilicity, wettability and accessible surface area within the layer. The electrocatalyst powders according to the present invention exhibit a high catalytic activity and also have a morphology and microstructure that enables the particles to be formed into layers by methods that are not useful with electrocatalyst powders having different characteristics. The high catalytic activity enables thinner layers of these materials to be deposited since a reduced mass of the electrocatalyst is required to achieve the same level of performance. However, it is also important that the performance advantages of the powders, such as access to the open porosity of individual aggregate particles, is retained in the layers after printing.

The electrocatalyst powders of the present invention can be deposited onto device surfaces or substrates by a number of different deposition methods that involve the direct deposition of the dry powder such as dusting, electrophotographic deposition or electrostatic precipitation. Other deposition methods such as ink jet printing, syringe dispensing, toner deposition, slurry deposition, paste-based methods and electrophoresis require that the powder be dispersed in a liquid vehicle. In all these deposition methods, the powders according to the present invention have a number of advantages over the powders produced by other methods. For example, small, spherical, narrow size distribution particles are more easily dispersed in liquid vehicles, they remain dispersed for a longer period of time and allow printing of smoother and finer features compared to powders made by alternative methods.

One way of depositing the powders of the electrocatalyst present invention is to apply the powders to a substrate through the use of a thick-film paste. In the thick film process, a viscous paste that includes a functional particulate phase (e.g., an aggregate electrocatalyst powder) is screen printed onto a substrate. More particularly, a porous screen fabricated from stainless steel, polyester, nylon or similar inert material is stretched and attached to a rigid frame. A predetermined pattern is formed on the screen corresponding to the pattern to be printed. The screen is then affixed to a screen printing device and the thick film paste is deposited on top of the screen. The substrate to be printed is then positioned beneath the screen and the paste is forced through the screen and onto the substrate by a squeegee that traverses the screen. Thus, a pattern of traces and/or pads of the paste material is transferred to the substrate. The substrate with the paste applied in a predetermined pattern is then subjected to a drying and firing treatment to solidify and adhere the paste to the substrate.

The different components of the thick film paste are mixed in the desired proportions in order to produce a substantially homogenous blend wherein the electrocatalyst powder is well dispersed throughout the paste. Typically, the thick film paste will include from about 5 to about 95 weight percent such as from about 60 to 85 weight percent of the functional phase.

Examples of thick film pastes are disclosed in U.S. Pat. Nos. 4,172,733; 3,803,708; 4,140,817; and 3,816,097 all of which are incorporated herein by reference in their entirety.

Some applications of thick film pastes require higher tolerances than can be achieved using standard thick-film technology, as is described above. As a result, some thick film pastes have photo-imaging capability to enable the formation of lines and traces with decreased width and pitch (distance between lines). In this type of process, a photoactive thick film paste is applied to a substrate substantially as is described above. The paste can include, for example, a liquid vehicle such as polyvinyl alcohol, that is not crosslinked. The paste is then dried and exposed to ultraviolet light through a patterned photomask to polymerize the exposed portions of paste. The paste is then developed to remove unwanted portions of the paste. This technology permits higher density lines and features to be formed. The combination of the foregoing technology with the composite powders of the present invention permits the fabrication of devices with higher resolution and tolerances as compared to conventional technologies using conventional powders.

According to one preferred embodiment of the present invention, it is advantageous to print the layers containing the powders of the present invention using a direct-write tool (e.g., a printing method). Constructing an energy device such as a fuel cell using such printing methods offers a number of advantages. Printing methods enable the formation of layers that are thinner and with smaller feature sizes than those that can be produced by current manufacturing methods such as rolling and pressing. The thinner layers result in reduced mass and volume and therefore an increase in the volumetric and gravimetric energy density of the device. Thinner layers can also facilitate faster transport of chemical species such as ions, electrons and gases due to the reduced diffusional distances. This can lead to improved performance where, for example, the diffusion of a chemical species is otherwise a rate-limiting factor.

Printing methods can also facilitate better control over the construction of interfaces and layer compositions giving rise to tailored gradients in composition and layer surface morphology that facilitate chemical transport and electrochemical reactions. Certain printing methods facilitate the construction of features with combined functionalities such that multiple layers may be combined into a single layer with multiple functionalities that provide benefits in both performance and energy density.

As used herein, a direct-write tool is a device that deposits a liquid or liquid suspension onto a surface by ejecting the liquid through an orifice toward the surface without the tool making substantial contact with the surface. The direct-write tool is preferably controllable over an x-y grid relative to the printed surface (i.e., either or both the substrate and device may move). One preferred direct-write tool according to the present invention is an ink-jet device. Other examples of direct-write tools include automated syringes, such as the MICROPEN tool, available from Ohmcraft, Inc., of Honeoye Falls, N.Y. and the DOTLINER dispense system (Manncorp, Huntingdon Valley, Pa.) which is capable of dispensing lines, dots and areas down to 200 μm or smaller at speeds of up to 10,000 dots/hour.

According to the present invention, the orifice of the direct-write tool can have a reduced diameter to enable the formation of finer features. This is a direct result of the aggregate particle characteristics discussed hereinabove, such as narrow particle size distribution and the spherical shape of the particles.

One preferred direct-write tool according to the present invention is an ink-jet device. Ink-jet devices operate by generating droplets of ink and directing the droplets toward a surface. Ink-jet printing, when applied to the particulate suspensions in accordance with the present invention is a means for delivering controlled quantities of the layer components to a variety of substrates.

The position of the ink-jet head is carefully controlled and can be highly automated so that discrete patterns of the ink can be applied to the surface. Ink-jet printers are capable of printing at a rate of 10,000 drops per second or higher and can print linear features with good resolution at a rate of 10 cm/sec or more, up to about 1000 cm/sec. Each drop generated by the ink-jet head includes approximately 2 to 200 picoliters of the liquid that is delivered to the surface. For these and other reasons, ink-jet devices are a highly desirable means for depositing materials onto a surface.

Typically, an ink-jet device includes an ink-jet head with one or more orifices having a diameter of less than about 100 µm, such as from about 50 µm to 75 µm. Ink droplets are generated and are directed through the orifice toward the surface being printed. Ink-jet printers typically utilize a piezoelectric driven system to generate the droplets, although other variations are also used. Ink-jet devices are described in more detail in, for example, U.S. Pat. No. 4,627,875 by Kobayashi et al. and U.S. Pat. No. 5,329,293 by Liker, each of which is incorporated herein by reference in their entirety. However, such devices have primarily been used to deposit inks of soluble dyes.

Ideally, the droplet generated by the printer head is identical in composition to the bulk fluid. However, some filtration of suspensions may occur if the particles are too large to pass through the channels or onboard filters. The small particle size and reduced number of aggregate particle agglomerates in the powder batches according to the present invention reduces the amount of particles collected by the filter and can enable removal of the filter.

According to the present invention, it is possible to deposit gradient layers of material wherein the composition of the layer changes through the thickness of the layer. In order to deposit such layers, it is preferred to form the layer using multiple direct-write deposition steps wherein the composition of the suspension being deposited changes through the layer. Utilizing the direct-write method of the present invention, it is also possible to form features and create device components on a non-planar surface, if required for a specific application or product geometry.

Thus, the electrocatalyst particles and other materials according to the present invention such as polymer-modified particles can advantageously be deposited using a direct-write tool. In one embodiment, the particles must be carried in a liquid vehicle to be deposited using a direct-write tool. The particles should remain well-dispersed in the liquid vehicle for extended periods of time such that the cartridge or reservoir into which the suspension is placed will have a long shelf-life. In some instances, substantially fully dense particles can be adequately dispersed and suspended. Depending upon the density of the particle compound, however, particles with a high density relative to the liquid in which they are dispersed and with a size in excess of about 0.5 µm cannot be suspended in a liquid that has a sufficiently low viscosity to be deposited using a direct-write tool, particularly an ink-jet device. In most cases, the apparent density of the particles must therefore be substantially lower than the theoretical density.

More specifically, it is desirable to maintain a substantially neutral buoyancy of the particles in the suspension while maintaining a relatively large physical size. The buoyancy is required for ink stability while the larger size maintains ink properties, such as viscosity, within useful ranges. Stated another way, it is desirable to provide particles having a low settling velocity but with a sufficiently large particle size. The settling velocity of the particles is proportional to the apparent density of the particle ($\rho_S$) minus the density of the liquid ($\rho_L$). Ideally, the particles will have an apparent density that is approximately equal to the density of the liquid, which is typically about 1 g/cm³ (i.e., the density of water). It is preferable that the apparent density of such particles be a small percentage of the theoretical density. According to one embodiment, the particles have an apparent density that is not greater than about 50 percent of the particles theoretical density, more preferably not greater than about 20 percent of the theoretical density. Such particles would have small apparent sizes when measured by settling techniques, but larger sizes when measured by optical techniques.

In another embodiment, the direct write process does not require a liquid vehicle. This is the case, for example, when the electrocatalyst powder is incorporated into an electrostatic, electrophotographic or tape transfer deposition process.

In the case of electrocatalyst powders, especially carbon-based aggregate electrocatalyst powders, the particles have a high degree of porosity and therefore relatively low density. This aids in the ability to suspend these powders in low viscosity, high powder loading inks.

Some electrocatalyst formulations may include materials with a relatively high density. One preferred method for obtaining a reduced apparent density of such particles according to the present invention is to produce the particles with either a hollow or a porous microstructure (or a combination thereof). Hollow electrocatalyst particles can include carbon, metal or metal oxide based materials where the surface area of these materials is high with a desire to maintain a relatively low apparent density. That is, one preferred particle morphology is a particle comprised of a dense shell having an inner radius and an outer radius. Preferably, the shell has a high density and is substantially impermeable. Assuming that air fills the interior of such a hollow particle, the equation representing the conditions for neutral buoyancy can be written:

$$r_2 = \left[\sqrt[3]{\frac{\rho_P}{\rho_P - 1}}\right] r_1$$

where: $r_2$=outer radius
$r_1$=inner radius
$\rho_L$=1 (water)
$\rho_P$=theoretical density of the particle For example, if a hollow particle has an outer radius of 2 µm (4 µm diameter) and a density of 5 g/cm³, then the optimum average wall thickness would be about 0.15 µm for the particle to be neutrally buoyant in a liquid having a density of 1 g/cm³. According to one preferred embodiment, the hollow particles have an average wall thickness that is not greater than about 10 percent of the particle diameter, and more preferably not greater than about 5 percent of the particle diameter.

It will be appreciated that other particle morphologies can be utilized while maintaining an apparent density within the desired range. For example, the electrocatalyst particles can have a sufficient porosity to yield a particle having an apparent density that is lower than the theoretical density. Open (surface) porosity can also decrease the apparent density if the surface tension of the liquid medium does not permit penetration of the surface pores by the liquid.

Thus, the particles according to the present invention preferably have a low settling velocity in the liquid medium. The settling velocity according to Stokes Law is defined as:

$$V = \frac{D_{st}^2(\rho_s - \rho_l)g}{18\eta}$$

where:
$D_{st}$=Stokes diameter
$\eta$=fluid viscosity
$\rho_s$=apparent density of the particle
$\rho_l$=density of the liquid
V=settling velocity
g=acceleration due to gravity Preferably, the average settling velocity of the particles is sufficiently low such that the suspensions have a useful shelf-life without the necessity of frequent mixing. Thus, it is preferred that a large mass fraction of the particles, such as at least about 50 weight percent, remains suspended in the liquid. The particles preferably have an average settling velocity that is not greater than 50 percent and more preferably not greater than 20 percent of a theoretically dense particle of the same composition. Further, the particles can be completely redispersed after settling, such as by mixing, to provide the same particle size distribution in suspension as measured before settling.

According to the present invention, more than one type of particle can be dispersed in a single liquid vehicle for deposition with a direct-write tool. The particles can be dispersed into the liquid vehicle by lightly mixing or, for example, by using ultrasound. For use in an ink-jet device, the viscosity of the suspension is preferably not greater than about 30 centipoise, more preferably not greater than about 20 centipoise. It is also important to control the surface tension of the liquid suspension and preferably the surface tension is from about 20 to 25 dynes/cm for an ink-jet device.

The solids loading of particles in the suspension is preferably as high as possible without adversely affecting the viscosity or other necessary properties of the direct-write composition. For example, the direct-write composition can have a particle loading of up to about 75 weight percent, such as from about 5 to about 50 weight percent.

The direct-write compositions are typically water-based, although other solvents or liquids may be used. Such compositions can include other chemicals including, but not limited to, surfactants, dispersion agents, defoamers, chelating agents, humectants and the like.

More specifically, ink-jet compositions generally include water and an alcohol. Organic solvent based systems can also be used and ink-jet print heads are often tailored for either organic or aqueous systems. Surfactants are also used to maintain the particles in suspension. Co-solvents, also known as humectants, are used to prevent the ink from crusting and clogging the orifice of the ink-jet head. Biocides can also be added to prevent bacterial growth over time. Examples of such ink-jet liquid vehicle compositions are disclosed in U.S. Pat. No. 5,853,470 by Martin et al.; U.S. Pat. No. 5,679,724 by Sacripante et al.; U.S. Pat. No. 5,725,647 by Carlson et al.; U.S. Pat. No. 4,877,451 by Winnik et al.; U.S. Pat. No. 5,837,045 by Johnson et al.; and U.S. Pat. No. 5,837,041 by Bean et al. Each of the foregoing U.S. patents is incorporated by reference herein in their entirety. The selection of such additives is based upon the desired properties of the composition, as is known to those skilled in the art. The fine particles are mixed with the liquid vehicle using a mill or, for example, an ultrasonic processor.

According to one embodiment of the present invention, the liquid vehicle into which the particles are dispersed can include soluble molecular precursors, such as metal precursors, that have a relatively low decomposition temperature. The molecular precursor is preferably a soluble inorganic compound that can be co-deposited with the powders and then thermally treated to form either an essentially continuous phase filling any void space between particles or a porous layer in which the particles are either fully or partially incorporated. Low temperature decomposition precursors such as those described herein with respect to spray drying can be used. A preferred type of precursor compound is an alpha hydroxycarboxylate (glycolate) derivative. Metal carboxylates are often advantageous in this respect for the formation of metal compounds. It will be appreciated that the molecular precursors will have a composition that is specific to the material being deposited. Ligands on the molecular precursors can act as a surfactant or the actual liquid vehicle.

In one embodiment, the molecular precursor forms essentially the same compound as the particles. In this embodiment, the particles in the liquid vehicle can advantageously catalyze the molecular precursor to form the desired compound. The addition of precursors with decomposition temperatures below about 300° C. allows the formation of functional features on a polymeric substrate, including polyamide, fluoro-polymers, epoxy laminates and other substrates. In a related embodiment, an ink including carbon particles, a precursor to a metal and a proton conducting polymer, or a precursor to a proton conducting polymer, can be processed at low temperature to formed the desired electrode layer structure.

The liquid vehicle can also include carriers to hold the particles together once the particles are deposited. Such a liquid vehicle would be advantageous when the particles are to be deposited and will not be sintered to adhere the particles to one another. The liquid vehicle could also include a polymer that, after deposition, would yield a polymer layer with particles dispersed throughout the polymer. Further, the liquid vehicle could also include a molecular species that can react with the dispersed particles to modify the properties of the particles.

Figures 6A, 6B:
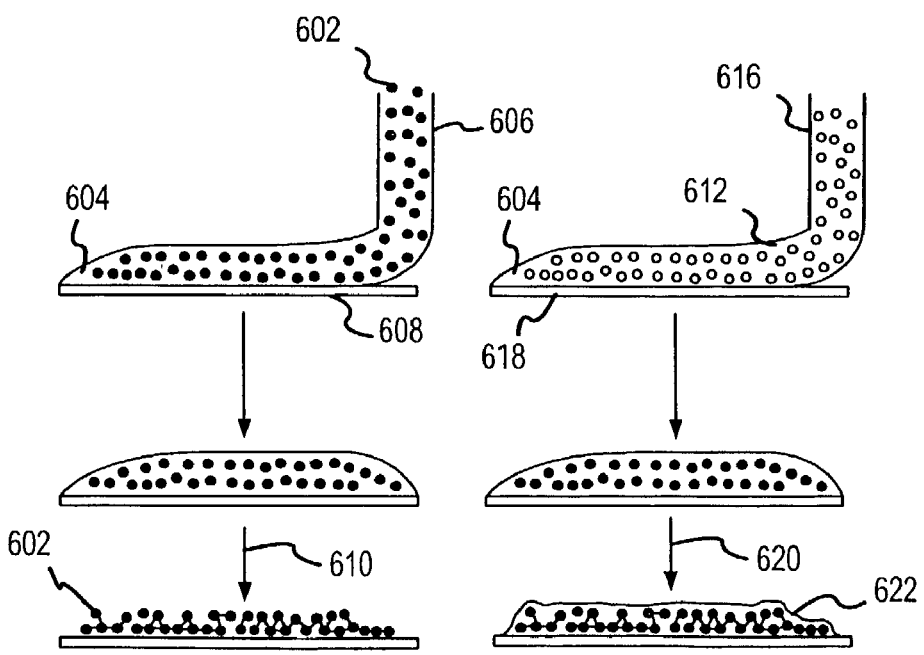
FIGS. 6(a) and (b) illustrates direct-write deposition methods according to the present invention.

A direct-write deposition method according to the present invention is illustrated schematically in FIG. 6. In FIG. 6(a), a fine powder 602 is dispersed in an organic vehicle 604 including water and various organics to aid in the dispersion of the fine powder 602. The direct-write tool 606 ejects the suspension through an orifice and onto a substrate 608. After deposition, the substrate 608 can be thermally treated 610 to remove the liquid vehicle 604 including the organics and form a thin layer of fine particles 602.

In the embodiment illustrated in FIG. 6(b), the particles 612 are dispersed in a liquid vehicle 614 which include water, organics and at least one molecular precursor to a compound or a metal. The liquid suspension including the particles 612 and the precursor-containing liquid vehicle 614 are deposited using a direct-write tool 616 onto a substrate 618. After deposition, the substrate 618 is thermally treated 620 to remove liquids and convert the precursors to their respective compound or metal. The resulting layer 622 includes particles dispersed throughout a film of the compound or metal.

Other processes that can be utilized to fabricate the energy devices of the present invention include laser transfer. In a laser transfer method, a material that is to be deposited is placed onto a transfer substrate such as a glass disc or an organic polymer-based ribbon. The transfer substrate is then placed over the substrate upon which the material is to be deposited. A laser is then used to controllably transfer the material to the substrate from the transfer substrate. The material to be deposited may contain the electrocatalyst particles, proton-conducting polymer, or other components of the electrode layer and may or may not require additional processing after it has been transferred.

The particles can also be deposited electrophoretically or electrostatically. The particles are charged and are brought into contact with the substrate surface having localized portions of opposite charge. The layer is typically lacquered to adhere the particles to the substrate. Shadow masks can be used to produce the desired pattern on the substrate surface.

Patterns can also be formed by using an ink jet or small syringe to dispense a pattern of sticky material onto a surface. Powder is then transferred to the sticky regions. For example, a sheet covered with powder can be applied to the surface with the sticky pattern. The powder will stick to the pattern and will not stick to the rest of the surface. Alternatively, a nozzle can be used to transfer powder directly to the sticky regions.

Many methods for directly depositing materials onto surfaces require heating of the particles once deposited to sinter them together and densify the layer. The densification can be assisted by including a molecular precursor in the liquid containing the particles. The particle/molecular precursor mixture can be directly written onto the surface using ink jet, syringe-dispense, and other liquid dispensing methods. This can be followed by heating in a furnace or heating using a localized energy source such as a laser or a heat lamp. The heating converts the molecular precursor into the functional material contained in the particles thereby filling in the space between the particles with functional material.

A number of other methods may be employed to construct layers containing the electrocatalyst powders according to the present invention. For example, the powders can be deposited by doctor blading, slot die or curtain coater methods. In these methods, an ink or paste containing the electrocatalyst powder is applied to the surface using a blade that is held at a specified height from the substrate. The thickness of the layer can be controlled down to several micrometers in thickness. For slot die and curtain coater methods, the ink or paste is dispensed through a small gap onto a substrate that may be moving on a web drive.

Roll pressing methods can also be used. Roll pressing methods involve mixing components including the electrocatalyst powder, binders and other property modifiers and feeding them through a roll mill to form a pressed film. Roll pressing is often done directly on other active parts of the energy device such as a nickel mesh current collector.

Electrostatic printing methods can be used wherein the electrocatalyst particles are charged with an electric charge, transferred to the drum of a roller, then transferred to a substrate which has the opposite electric charge to that of the particles. This transfer can be carried out in a fashion that results in a blanket layer over the entire substrate or in a patterned manner with the pattern determined by the distribution of the electrical charge on the substrate surface. Typically this method enables the transfer of layers down to one particle thick and therefore enables very good control over the layer thickness.

Gravure, rotogravure and intaglio printing methods can also be used wherein an ink or paste containing the electrocatalyst powder is transferred to a sunken surface feature, often on a cylinder, that defines the pattern to be transferred to the substrate surface. The substrate is often a continuous feed from a web drive. Relief and flexographic printing methods can also be used which are the reverse of gravure printing in that a material, often in the form of a paste or ink, is transferred from a raised pattern on a surface, often a roller, to a substrate.

Lithographic printing methods can also be used. In lithographic printing methods, a photosensitive ink or paste is placed on the substrate and exposed to a source of illumination or electromagnetic radiation, generally UV light, wherein the exposed areas interact with this radiation to undergo a material change. The change may result in creation of a soluble or insoluble feature depending on the reactivity of the paste and the desire for positive or negative lithography. After removal of the unwanted matter the patterned layer containing the electrocatalyst powder remains for further processing.

Laser transfer methods can be used in which the electrocatalyst containing material is dispersed on a tape or ribbon and a laser is used to transfer material from the underneath surface of the ribbon or tape to the surface of the desired substrate which is positioned in close proximity to the tape. Using this method, features can be built with controlled dimensions.

Spray deposition methods can also be used. In spray deposition methods, a liquid vehicle containing the electrocatalyst powder is fed through a spray nozzle and atomized to form droplets that are directed to a surface where the electrocatalyst layer is to be deposited.

The electrocatalyst powders produced according to the present invention result in thinner and smoother powder layers when deposited by such liquid or dry powder based deposition methods. Smoother powder layers are the result of the smaller average particle size, spherical particle morphology and narrower particle size distribution compared to powders produced by other methods.

The present invention is also directed to improved energy devices incorporating such thin layers, including fuel cells. The fuel cells according to the present invention can include multiple functional layers, two or more of which may be combined into a single multi-function layer. The functional layers can include, for example, a membrane layer, current collector, hydrophobic layer, electrocatalyst layer, an electrolyte, separator and anode.

Figure 7:
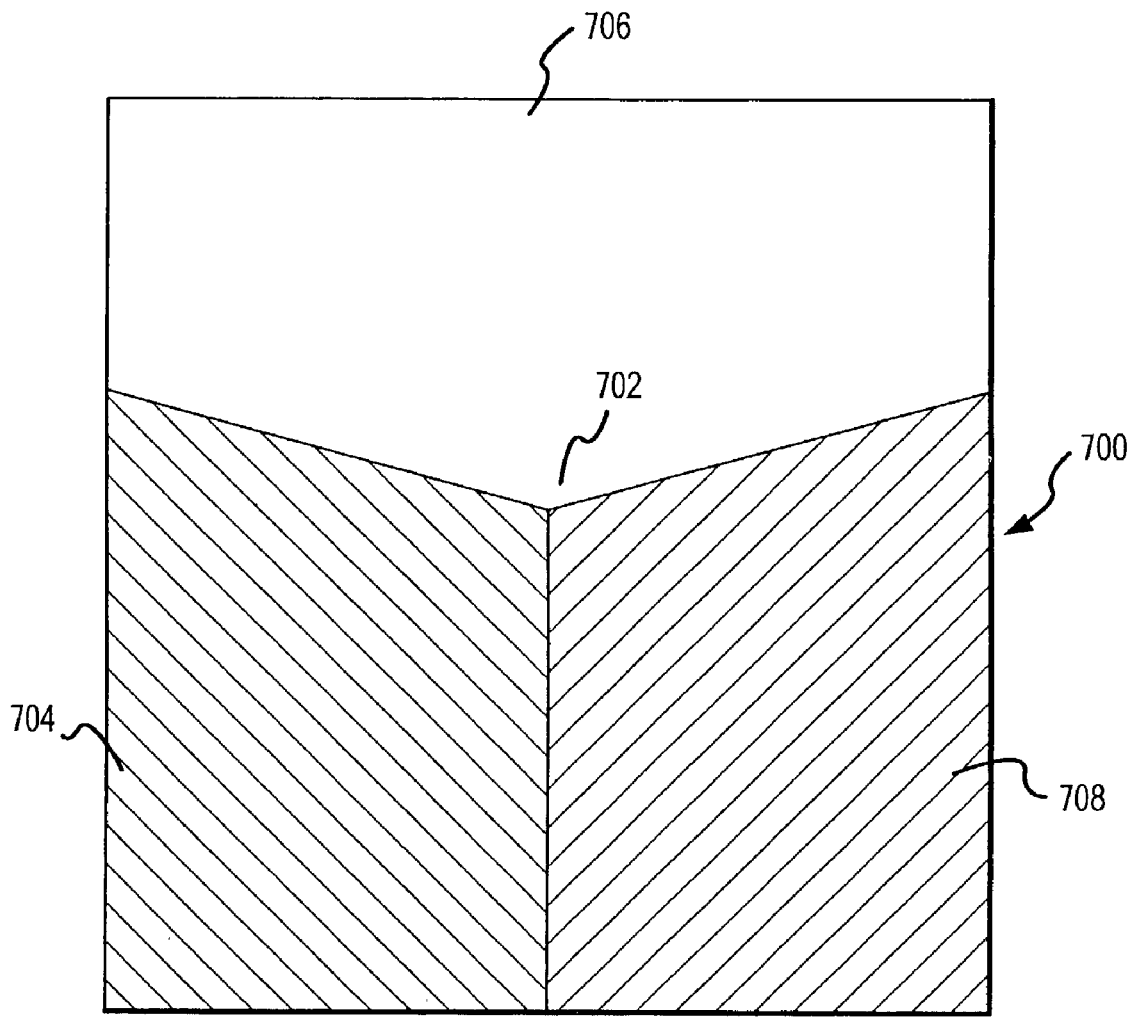
FIG. 7 illustrates the 3-phase boundary within an energy device such as a fuel cell.

The main electrocatalytic processes in devices such as a PEM fuel cell, take place in a 3-phase boundary comprising the electrode, air and the electrolyte. The three-phase boundary is graphically illustrated in FIG. 7. The electrocatalyst must populate the zone of 3-phase contact 702 and be in electrical contact with the electrode 704 and in diffusional contact with the electrolyte 706 and the air 708. To accomplish this, present devices include a gas-diffusion layer, a catalytic layer and a current collection system. The gas-diffusion layer is characterized by high gas permeability and a porous structure optimized for water management. The catalytic layer consists of a porous conductive matrix with a highly dispersed electrocatalyst to yield a distribution of hydrophobic pores for oxygen supply and hydrophilic pores for electrolyte exposure. The current collector is usually made from graphite plates that also contain flow field channels or from an inert metal mesh, such as nickel or nickel alloy mesh in intimate mechanical contact with the conductive gas-diffusion layer.

It is desirable to maximize the exposure of the active electrocatalytic sites to both air and the electrolyte. According to the present invention, a gradient of hydrophilic/hydrophobic properties across the catalytic layer in the zone of 3-phase contact can be utilized to enhance the properties of the device, as is discussed in more detail below.

The electrocatalyst powders and other materials that can be fabricated according to the present invention are particularly useful in fuel cells and the present invention includes fuel cells and fuel cell components having improved performance. Examples of fuel cells include proton exchange membrane fuel cells (PEMFC) and phosphoric acid fuel cells.

One class of fuel cell reactions that are catalyzed is the reaction of a fuel such as hydrogen gas ($H_2$) to form $H^+$ where, in the case of a PEMFC, the $H^+$ is transported through a H+ ion transport membrane to the cathode where it reacts with reduced $O_2$ to form water. In this case, the fuel cell generally operates in acidic media. Other fuels may also be employed such as methanol, natural gas or other hydrocarbons such as methane.

One aspect of the present invention will now be described with respect to a PEMFC. A PEMFC comprises the following sections: the fuel processor, or reformer; the power section, or fuel cell stack; the power conditioner; and the balance of plant.

The fuel processor, or reformer, converts natural gas or other fuels into a hydrogen-rich gas stream with low carbon monoxide levels. The composition and performance of the electrocatalyst powders in the PEMFC has a strong influence on the design requirements for this component. High quality electrocatalysts of certain compositions are able to withstand some level of otherwise deleterious species in the gas, such as CO. The ideal case is to supply pure hydrogen to the PEMFC in which case there is no need for a reformer. But this is unlikely to be the case for the foreseeable future due to a lack of an existing hydrogen distribution infrastructure.

The power section, or fuel cell stack, is where the electrochemical reactions occur that produce the power. Each fuel cell stack includes a number of membrane electrode assemblies (MEAs). The gases (fuel and air) are delivered to the MEA's where the conversion of chemical to electrical energy takes place, catalyzed by the electrocatalysts. Each MEA in the fuel cell stack will generate a voltage of around 0.6 V to 0.8 V and the number of MEAs connected in series dictates the overall voltage of the system.

Figure 8:
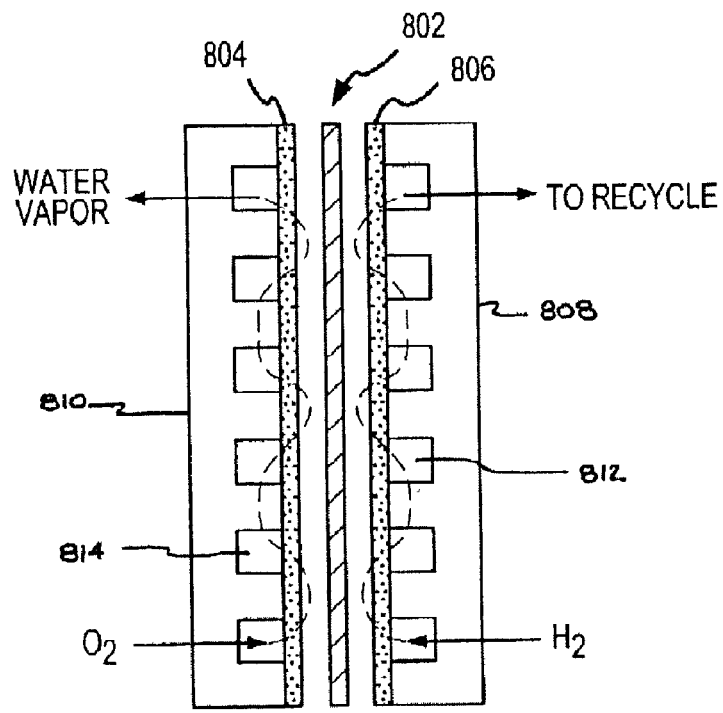
FIG. 8 schematically illustrates a membrane electrode assembly.

A MEA is schematically illustrated in FIG. 8. Each MEA is comprised of a number of components. The anode includes a catalyst layer 806 to catalyze the reaction that breaks the hydrogen molecule down to protons and electrons. The proton exchange membrane 802 is a proton conductive and electronically insulative membrane that selectively transports protons formed at the anode to the cathode where an electrocatalyst layer 804 catalyzes the reaction with oxygen ions to form water. The proton exchange membrane 802 is typically a sulfonated perfluorohydrocarbon polymer such as NAFION.

The anode and cathode are comprised mainly of electrocatalyst in which the active catalyst, such as platinum or platinum group metals, is supported on a conductive support such as carbon. This structure is referred to herein as metal/C, for example Pt/C in the case of a platinum active species dispersed on carbon. The requirements for the composition of the electrode catalyst are different because a different reaction occurs at each electrode.

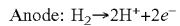

Anode: $H_2 \rightarrow 2H^+ + 2e^-$

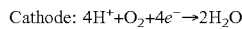

Cathode: $4H^+ + O_2 + 4e^- \rightarrow 2H_2O$

The cathode electrocatalyst 804 is generally Pt/C. For the case of pure hydrogen, the anode catalyst 806 is also Pt/C, which simplifies and lowers the cost of the fuel cell. However, due to the unreliability of reformers, which could produce a temporary increase in CO concentration and poison the active centers in the Pt/C catalysts, an alloy catalyst is typically used containing ruthenium/platinum alloy on carbon (PtRu/C). As mentioned above, the performance of these materials and their design to accommodate the reformer performance is critical to cost reliability and performance of the fuel cell. The cost and performance of these precious metal-based electrocatalysts is the one of the major contributors to the cost and performance of the fuel cell.

The MEA is sandwiched between bipolar plates 808 and 810 that mechanically support the MEA and include current collectors to capture electrons. The bipolar plates 808 and 810 also include gas delivery channels (e.g., channels 812 and 814) to deliver gas to the electrodes. A gas diffusion layer (GDL) is disposed between each electrode and the associated gas delivery channels. The GDL is a layer of porous hydrophobic material, generally carbon-based, that evenly distributes the gas over the surface of the electrode without creating a substantial pressure drop.

The power conditioner converts the DC electricity created by the fuel cell stack into AC electricity. The balance of plant entails the remainder of the fuel cell such as operational modules, electrical and fuel interfaces and the like.

The operation of a PEMFC will be explained in further detail with the focus on the operation of the MEA. An understanding of the operational requirements of the materials systems involved is critical for the successful performance and reliability of the fuel cell and provides the rationale for the significant contribution of the electrocatalyst materials of the present invention as well as the associated direct-write technologies. There is a critical interplay between the need for advanced materials systems and the method by which these materials are deposited to achieve optimum structure and function in these layers. In many cases there are multiple functions that, in principle, require competing structures. This is the basis of the present invention, which enables deposition of high-performance, multifunctional layers through direct-write processes.

Figure 9:
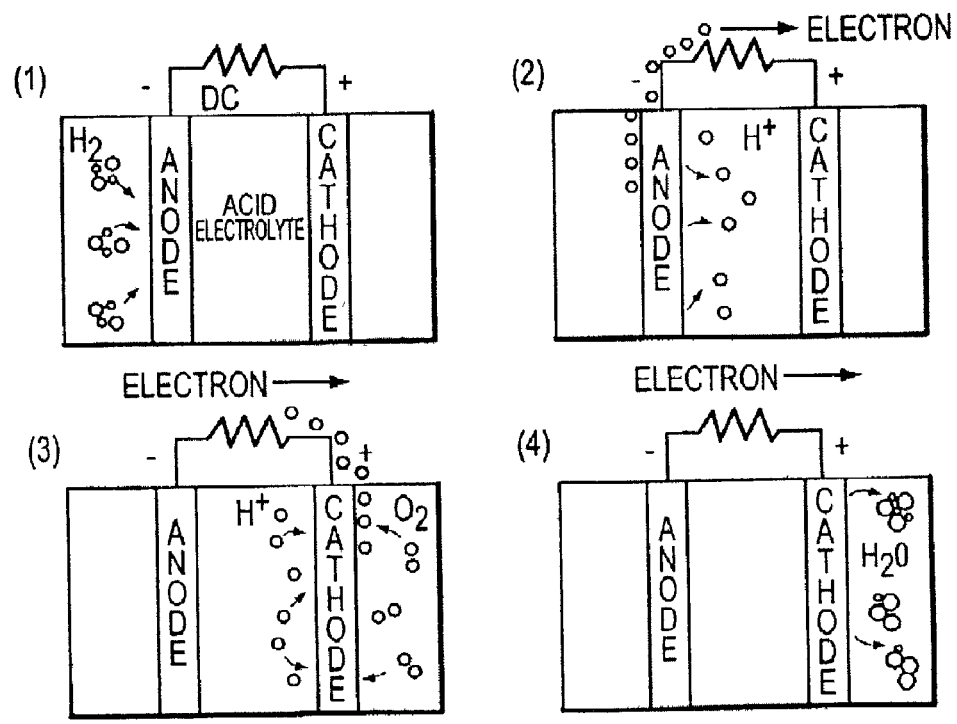
FIG. 9 illustrates the reactions in a membrane electrode assembly.

The operation of a PEMFC MEA can be understood in terms of the four stages illustrated in FIG. 9. It should be noted that a fuel cell operates continuously and these stages are identified here for purposes of understanding the process. The cell operates at a steady state at a given load, thus the processes are connected and balanced.

In Stage 1, hydrogen is supplied as a pure fuel or is derived from the reformer uncontaminated. The hydrogen is delivered from its source via the flow field channels in the bipolar plates and is distributed over the face of the GDL. The hydrogen diffuses through the GDL until it reaches the anode layer. The hydrogen gas is generally humidified in order to prevent drying of the anode layer, which would result in a loss of ionic conductivity. Thus, the GDL must be capable of handling water without significantly affecting the gas diffusion capability. Therefore, the GDL must have the necessary materials combination to achieve a balance of hydrophobic and hydrophilic properties with a distribution of pores that are not blocked by varying levels of water.

Both the anode and cathode layers contain a mixture of electrocatalyst (e.g., Pt/C), water and proton conduction polymer. The layers must have a complex structure with the following attributes: gas diffusion; selective ionic diffusion and conductivity; and selective electronic conductivity. The role of the anode layer is to catalytically oxidize the hydrogen to form hydrogen ions and electrons at the lowest possible temperature. The layer must be designed to be porous to $H_2$ gas so that all the catalytically active Pt surfaces are accessible to the $H_2$ molecules for maximum efficiency. As is illustrated by Stage 2 in FIG. 9, once the protons and electrons have been formed, the electrons are selectively removed to the current collector through a conducting network of the carbon electrocatalyst support. Therefore, the layer must not be so porous that the carbon particles are not well connected.

The protons formed at the Pt catalyst must be transported through the remainder of the anode layer to the membrane. The medium must facilitate this kind of ionic diffusion, the requirements for which are almost completely opposed to optimization of the gaseous diffusion. The ionic proton diffusion requires that the catalytically active sites are also in intimate contact with a liquid or solid network, such as aqueous proton conducting polymer, that transports the protons to the proton exchange membrane. This situation is commonly referred to as the 3-phase interface. (See, for example, FIG. 7)

The construction of the 3-phase interface has been a problem for a long time in electrochemical systems in general. The materials systems and deposition methods of the present invention provide the enabling solution to this problem of tailoring-the structure and function of the 3-phase interface.

As is illustrated by Stage 3 of FIG. 9, the protons are selectively transported through the proton exchange membrane to the cathode. This is achieved by using a membrane that is electrically insulating (to avoid electron conduction) but which selectively enables proton transport. Issues associated with the performance of the PEM include the operational temperature and the mechanical strength of the PEM. Operating the fuel cell at a higher temperature allows for higher current density, but the operating temperature of the fuel cell is limited by the thermal stability of the PEM. With respect to mechanical strength, it will be necessary to use a high speed manufacturing process for large volumes of MEA's, which is likely to be based on reel-to-reel web drives. After being selectively transported by the PEM, the protons must be transported to the cathode electrocatalyst where they react with oxygen ions to form water, as is illustrated by Stage 4 of FIG. 9. This ionic transport requires a facilitating medium analogous to the ionic transport medium required in the anode. Oxygen is supplied to the cathode and must diffuse through the gas diffusion layer to reach the cathode in a uniformly distributed manner. However, since water is formed at the cathode, the oxygen source (usually air) is supplied with various degrees of humidification for various operating conditions (e.g., stoichiometry, gas flow temperature, etc.) to mangage water content in the cathode layer.

The electrons produced at the anode are transported via their workload in the outside environment to the cathode where the current collector distributes them back to the cathode layer. The conductive carbon particles in the cathode distribute the electrons to the active sites in the electrocatalyst, where the oxygen atoms arrive and are reduced to form oxygen ions ($O^{2-}$). Two protons react with each oxygen ion to form one molecule of water. The design requirements for the cathode are therefore similar to those of the anode in that gas and ion diffusion are required together with electronic conductivity. The cathode must also be able to accommodate the formation and removal of water without being adversely affected.

The GDL associated with the cathode must be capable of removing the water produced in the cathode and capable of delivering dry air from which the $O_2$ selectively reacts. This must also be achieved with the appropriate choice of materials, layer structure and layer deposition method as described above for the anode GDL.

Figure 10:
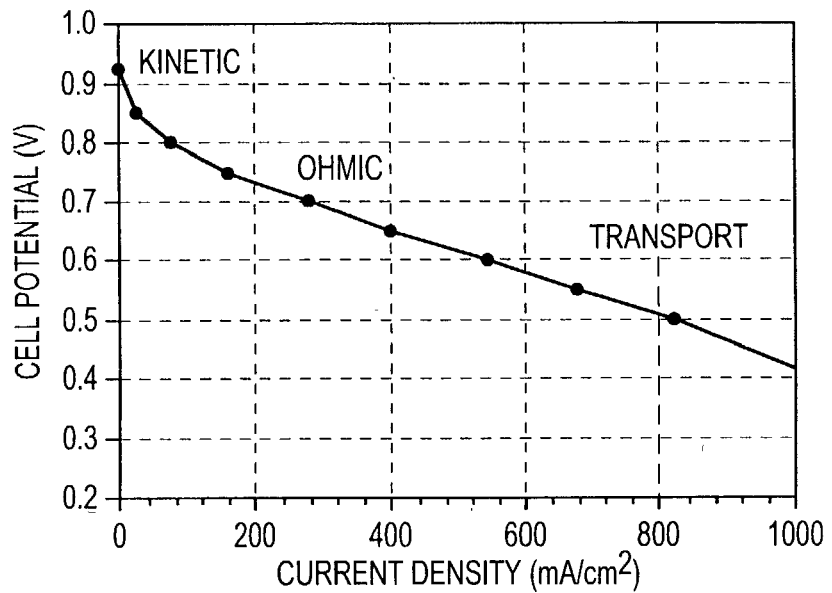
FIG. 10 illustrates a polarization curve for a membrane electrode assembly.

The performance of an MEA is primarily judged by reference to the relationship between MEA cell potential in volts and current density in milliamps per square centimeter ($mA/cm^2$). This relationship can be represented graphically in the form of a polarization curve and an example of a polarization curve is illustrated in FIG. 10. The polarization curve shows the typical relationship between cell potential and current density. For a given level of MEA performance (e.g., a specific polarization curve), if better fuel efficiency and operating efficiency are required, then it is desirable to move to a higher voltage. Operating a PEMFC at higher voltage generally leads to higher efficiency, but also requires a larger cell because the power density is lower. This increases capital cost in the construction of the cell but results in a lower operating cost. For a given polarization curve, operating at lower voltage generally leads to lower efficiency, but requires a smaller cell (because the power density is higher) and therefore smaller capital costs, but higher operating costs. It is particularly advantageous to move the vertical position of the curve higher, that is, to achieve a higher current density at a higher voltage.

The vertical position of the polarization curve is strongly influenced by a number of materials and operating factors, including the level of platinum active species loading. More platinum yields better results, but increasing the amount of platinum significantly contributes to the capital cost. Other operating parameters include temperature, gas composition and gas utilization, all of which influence the cost and reliability of the PEMFC. The goal in designing an MEA is to maximize the vertical position of the polarization curve (i.e., performance) while minimizing the cost of the materials components, the capital cost and operating costs.

The connection between the shape of the polarization curve and the structure of an MEA is well understood and can be divided into different regions of the polarization curve. As is illustrated in FIG. 10, these regions are the kinetic region, ohmic region and transport-limited region.

In the kinetic region, the performance of the MEA is primarily dictated by the kinetic performance, or reactivity, of the catalyst. A catalyst having high activity yields a higher cell potential at a given current density. The electrocatalyst structure and the number of active sites dictate the overall activity of the electrocatalyst. This also has an effect on the performance in the ohmic and transport regions.

In the ohmic region, the performance is primarily dictated by the ability to transport ions and electrons. Better performance results from good connectivity between highly conductive carbon particles for electrical conductivity and a good network of proton conducting polymer connecting the catalytically active sites in the electrocatalyst to the PEM. The performance of the MEA in this region strongly depends on the membrane layer thickness and its proton conductivity.

In the transport region, the performance is primarily dictated by the diffusion of gaseous species to and from the active species sites on the electrocatalyst. Better performance is manifest by rapid diffusion of the gas from the gas distribution channels in the bipolar plates through the gas diffusion layer and the electrode. The performance in this region is largely affected by the fuel cell operating conditions such as gas pressure, gas flows and the like.

From this description, it is clear that the materials and the structure of the layer comprising these materials have a very strong influence on the performance and cost of the PEMFC system.

One of the primary goals in the design of these structures is to increase the utilization of the Pt such that performance is maximized at a low Pt loading. Low Pt loadings are desirable due to the high cost associated with Pt. The total Pt loading can be controlled by controlling the concentration of the Pt on the carbon support structure and controlling the loading of the electrocatalyst particles in the electrode layer (e.g., controlling the layer thickness). As is described above, there is a subtle trade-off in terms of performance and Pt utilization depending on the operating conditions of the fuel cell.

Figure 11:
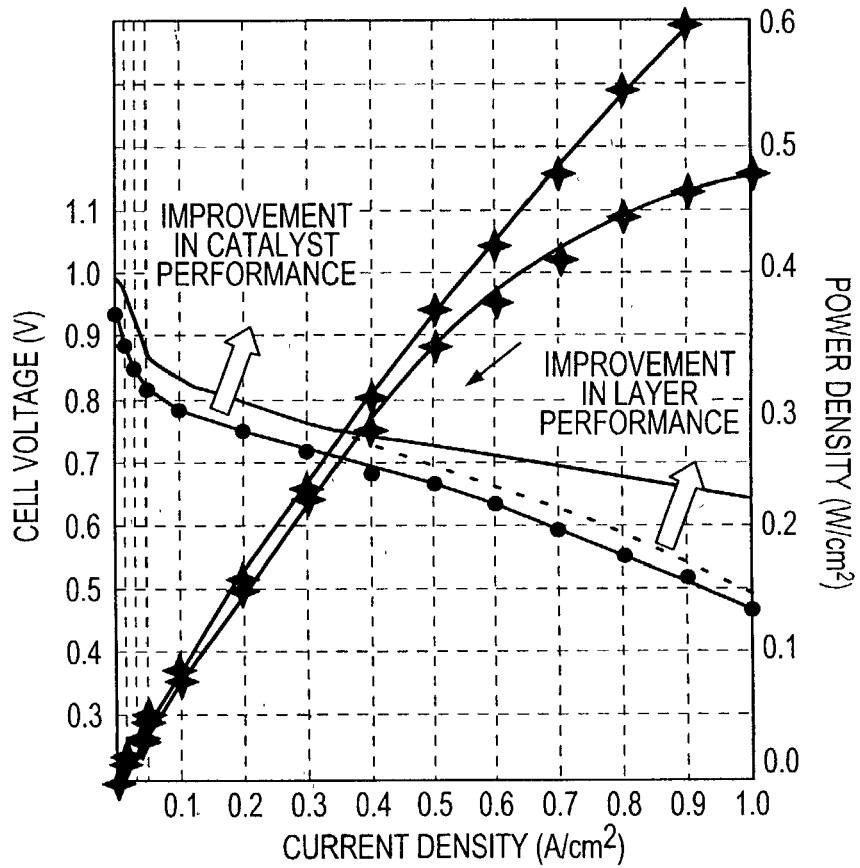
FIG. 11 illustrates a polarization curve and power density curve for a membrane electrode assembly.

A purely kinetic improvement derived from the improved utilization of Pt can result in a meaningful improvement in cell performance below about 200 mA/cm$^2$. Therefore, if the operational goal is to run the fuel cell with a current density lower than 200 mA/cm$^2$ or a voltage higher than about 0.75 V, an improvement in the kinetic region is typically sufficient. However, for operation under different conditions such as voltages lower than 0.75 V and current densities above 200 mA/cm$^2$, the performance is dominated by ohmic and transport characteristics and a kinetic improvement has a less significant impact than an improvement in the layer structure and materials. Under these conditions, an improvement in the layer structure could lead to a polarization curve such as the upper curve illustrated in FIG. 11. The importance of this improvement is magnified by the power curve, which is also illustrated in FIG. 11.

Figure 12:
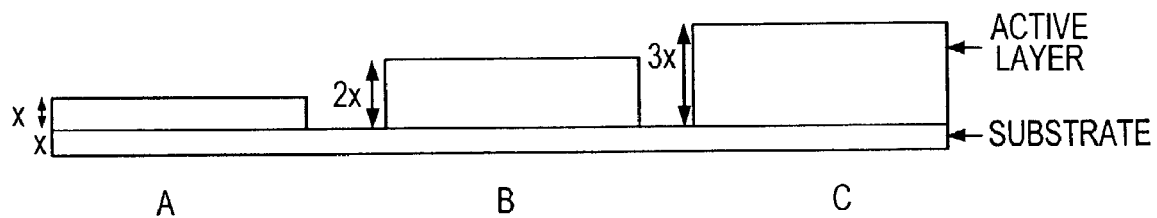
FIG. 12 illustrates electrocatalytic layers of varying thickness.

This background is important for an understanding of the method of optimization of the platinum utilization by varying both the Pt content in the electrocatalyst and the thickness and structure of the electrode layer. FIG. 12 graphically illustrates three layers (A, B and C) of active material, which could be an electrocatalyst layer deposited onto a support such as a gas diffusion layer or an ion conducting membrane. If the same electrocatalyst loading of Pt on carbon is used, for example 20 wt. % Pt on carbon, then the total weight loading of Pt in layer B measured in mgPt/cm$^2$ would be twice the layer loading in layer A and layer C would have three times the layer loading of A. The polarization curve measured for each of these three layers will appear quite different in the kinetic region (i.e., at low current or power density) with a higher performance expected for the higher Pt loading. However, the performance at higher current densities will likely be worse for the thicker layers (at the higher Pt loading). Therefore, it is important to define the conditions over which the MEA is designed to operate in order to optimize the performance by altering Pt loading and layer thickness.

As an alternative approach, the same layer loading as described in the foregoing example for layer B could be achieved using 40 wt. % Pt on C and a layer half the thickness (i.e., layer A). Assuming the same Pt utilization for the 40 wt. % Pt on C as the 20 wt. % Pt on C (i.e., the same kinetic performance of the electrocatalyst), then the performance at higher current and power densities would be expected to be superior for the 40 wt. % Pt on C layer, all other factors being equal. Therefore, it is clearly important to optimize the Pt utilization at higher Pt mass loadings while simultaneously optimizing layer thickness.

Typical cathode electrocatalyst layers can include compositions that range from pure Pt black (e.g., DMFC and electrochemical sensor applications) to very low Pt loadings on carbon, such as 1 wt. % Pt on C (e.g., for some electrochemical sensors or catalytic applications). Typical layer thickness can vary between 1 μm and 100 μm.

One aspect of the present invention relates to the production of complex, multi-component aggregate particles for use in MEAs and similar structures. Such aggregate particles can include an electrocatalytically active species dispersed on a support phase, such as carbon, a hydrophobic polymer, a proton conducting polymer and other components. As is discussed above, MEAs are most often constructed from particulates of electrocatalyst, electrically conducting carbon powders and suspensions of colloidal NAFION and TEFLON in various liquids. This current palette of materials that an MEA designer has to choose from is very limited. It would be highly advantageous to have other starting materials that combine these materials in different manners to allow fabrication of MEAs with characteristics that address the problems outlined above.

MEAs are currently fabricated from particulates of conducting carbon that support a precious metal active species composition such as Pt or a Pt alloy. These particulates must be combined with a variety of other materials using complex MEA fabrication recipes to attempt to form the idealized structure. However, the characteristics of these particles do not allow for straightforward fabrication of the optimum structures.

It would be highly advantageous to be able to use more complex aggregate particle structures containing:

Pt/C aggregate particles with controlled aggregate particle size and size distribution;

PCP-Pt/C polymer-modified aggregate particles (PCP=proton conducting polymer);

PTFE-Pt/C polymer-modified aggregate particles (PTFE=polytetrafluoroethylene hydrophobic polymer);

PCP-PTFE-Pt/C polymer-modified aggregate particles;

PCP-ECP-Pt/C polymer-modified aggregate particles (ECP=electrically conducting polymer)

Figure 13:
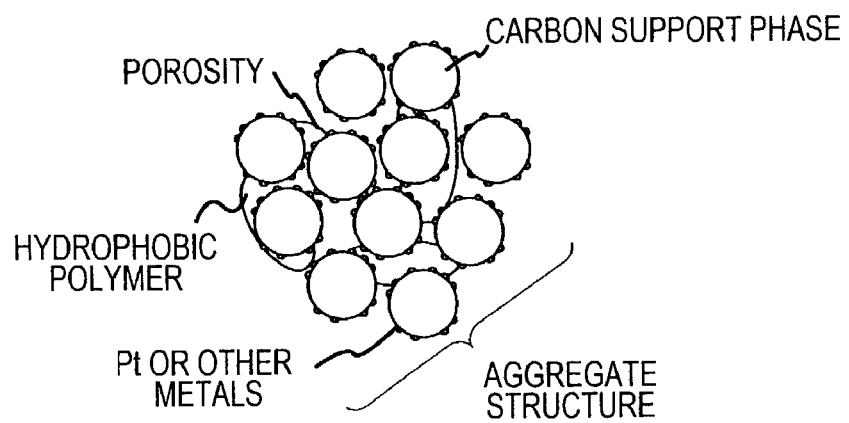
FIG. 13 illustrates an aggregate particle structure according to an embodiment of the present invention.
Figure 14:
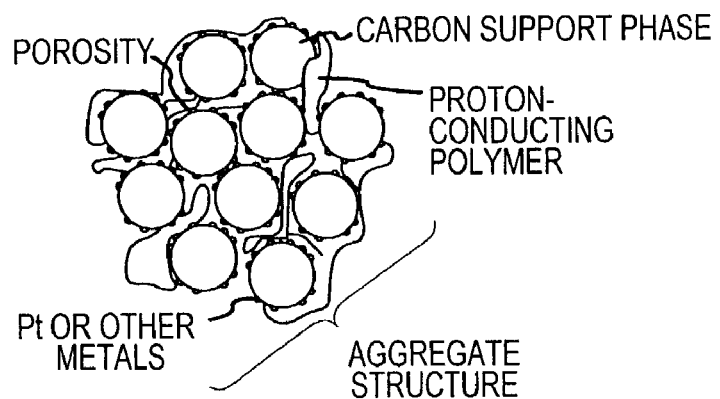
FIG. 14 illustrates an aggregate particle structure according to an embodiment of the present invention.
Figure 15:
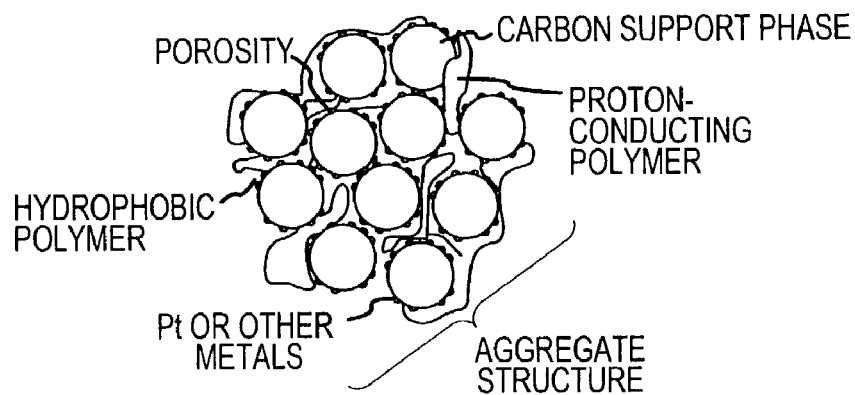
FIG. 15 illustrates an aggregate particle structure according to an embodiment of the present invention.

Examples of the foregoing particulate structures are illustrated in FIGS. 13-15. The aggregate structure of the electrocatalyst particles is micron-sized (e.g., 1 μm to 20 μm) while the primary carbon support particles are on the order of 30 nanometers to 5 μm in size and include clusters of the active species (e.g., Pt) dispersed thereon. The hydrophobic polymer and/or proton-conducting polymer are dispersed throughout the structure of the aggregate particle.

The PTFE-Pt/C polymer-modified particle illustrated in FIG. 13 offers the following advantages. The hydrophobic material is already incorporated into the powders and does not have to be mixed in later allowing for better control over the uniformity of the hydrophobicity. The PCP-Pt/C polymer-modified particle illustrated in FIG. 14 offers the following advantages in addition to those described above. The PCP is incorporated into the aggregate structure providing intimate contact of reaction sites (i.e., the active species phase) with the polymer that transports the protons to the reaction sites. The PCP-PTFE-Pt/C polymer-modified particle illustrated in FIG. 15 combines the advantages of all the materials described above and offers the possibility of fabricating an electrode using a single multi-component aggregate particle material. The functions of the PCP and PTFE can also be combined through the use of a polymer that is a conductor of both electrons and protons.

As is discussed above, the polymer-modified particles are produced by spray processing, for example by starting with the precursors for the particles that are dissolved and suspended into a liquid. The liquid is atomized to form droplets that are then thermally processed to form the particle structure. It is also possible to pre-fabricate high-quality Pt/C aggregate electrocatalyst particles, suspend them in a liquid along with the other desired components and then spray process the suspension to form the final polymer-modified material. The starting particulate carbon material can have different degrees of initial hydrophobicity. For example, acetylene blacks such as SHAWINIGAN BLACK (Chevron Chemical Co., Houston, Tex.) are more hydrophobic than furnace blacks such as VULCAN XC-72 (Cabot Corp., Alpharetta, Ga.). The volumetric weight ratio of the polymer material to carbon in the polymer-modified aggregate particles can be varied from 5:95 to 95:5.

Figure 16:
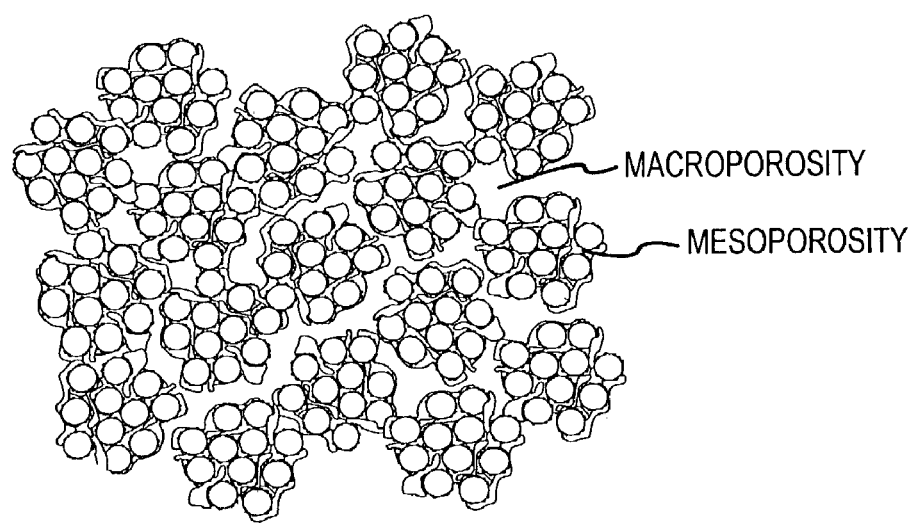
FIG. 16 illustrates aggregate particles in a layer according to an embodiment of the present invention.

A conceptually ideal electrode layer including such polymer-modified particles is illustrated in FIG. 16. It is widely accepted that the ideal solution must provide several features including: a connected pathway of conducting carbon particles from the gas diffusion layer to allow electron transport; a connected pathway of proton conducting polymer to allow transport of hydrogen ions to electrocatalyst sites; hydrophobic passages to allow water to escape thereby avoiding flooding from water generated at the catalyst sites; active species sites exposed to the proton conducting polymer to allow the protons to be readily transported to the reaction sites; sufficiently large pores to allow oxygen gas transport from the gas diffuser to all locations in the electrode; and finer scale porosity in the aggregate electrocatalyst particles to allow transport of oxygen over shorter distances to reaction sites. Existing attempts at achieving this ideal situation are hindered by the lack of engineered particles, the limited printing processes dictated by the types of materials available and the types of structures derived from conventional materials.

Various deposition techniques for layer structures are discussed hereinabove. The preferred deposition technique for the active layer of an MEA structure depends on the structure and morphology of the catalyst particles and the hydrophobic component. For particle sizes smaller than about 25 μm, syringe dispensing is more appropriate while for particles greater than about 25 μm, techniques such as screen-printing or coating with wire-cators may be more appropriate. A wire-cator is a device that applies a uniform coating of an ink or paste to a substrate.

The deposition method that is selected dictates the components of the flowable medium that is used. For example, isoproponal is not suitable for syringe dispensing due to its low viscosity and high vapor pressure. An example of a formulation suitable for syringe dispensing is a metal oxide catalyst mixed with TEFLON powder in a 5:1 weight ratio and dispersed in alpha-terpineol. The resulting active layer is composed of 20 to 40 wt. % solids. Similarly, a formulation made for screen-printing can include a metal oxide supported on carbon and mixed with polymer-modified carbon, which are then dispersed in isoproponal. The solids loading of this formulation can be varied from 10 to 40 wt. %.

Figure 17:
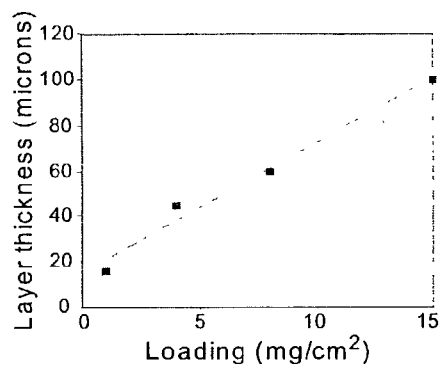
FIG. 17 illustrates average layer thickness as a function of the catalyst loading of electrode layers according to the present invention.

The thickness of a layer can be controlled by controlling the solids loading of the active material in the flowable medium and the writing speed during deposition. Layers having a wide range of thickness can be deposited. FIG. 17 illustrates the average layer thickness as a function of solids loading. As the layer thickness increases, there is a linear increase in the total loading of solids in the layer. A gradient in the layer composition can also be formed by controlling the composition of the ink, the writing speed and the number of sub-layers that are deposited.

While the kinetics of the electrode are controlled by the dispersion and composition of the electrocatalyst, the ohmic and transport limitations of the electrode arise mainly due to the thickness, composition and porosity of the layers. The thickness of the layers can be controlled by changing weight loadings of the active species metal in the electrocatalysts in the layer, the aggregate size and size distribution and by changing the deposition method. The deposition method and the composition of the layer will in turn determine the porosity of the layer and the accessibility of the catalytic layers. Electrocatalyst loadings from as small as 0.05 $mg/cm^2$ up to 20 $mg/cm^2$ and higher are enabled by this approach. Correspondingly, the loading of active species can vary depending on the weight per cent active species on the catalyst support, and can be up to about 20 $mg/cm^2$ if unsupported electrocatalyst is used.

The energy densities that are obtained by the power device depend on the volume of the different layers in the power device and hence the thickness of the various layers. Higher volumetric densities are obtained from the power device when thinner layers are utilized.

Figure 18:
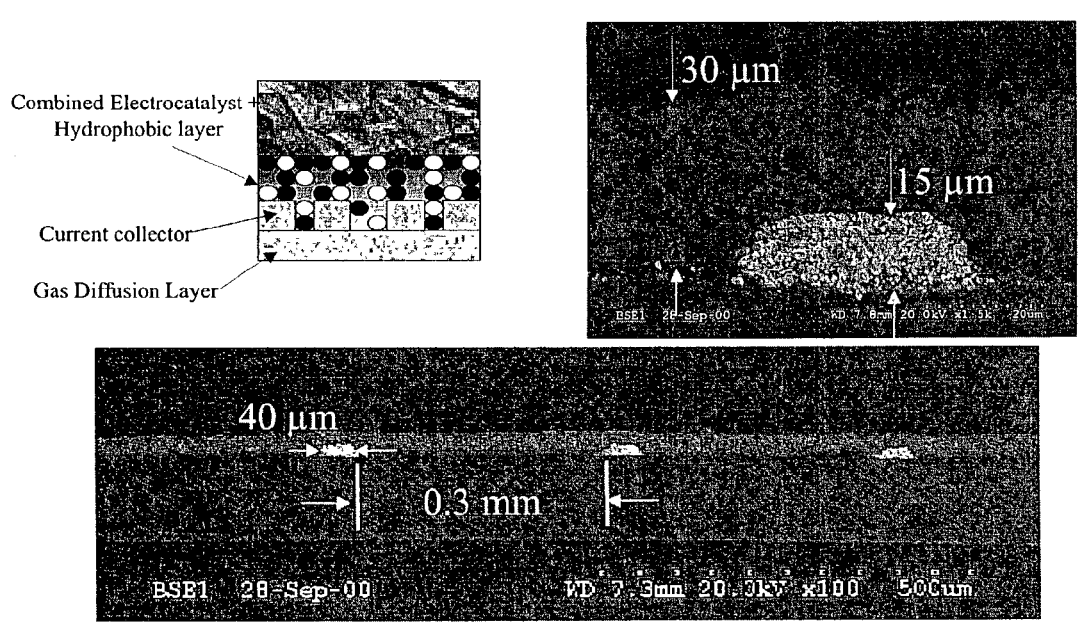
FIG. 18 illustrates a printed gas diffusion electrode according to the present invention.

As a result of the ability to rapidly determine the optimum structure-performance relationship, a complete gas diffusion electrode can be constructed using the foregoing approaches. A printed gas diffusion electrode in cross-section is illustrated in FIG. 18. The gas diffusion electrode is comprised of a porous gas diffusion layer on which a silver current collector has been printed. The current collector lines (lighter areas in FIG. 18) have dimensions of 40 μm wide, 15 μm in height with a 300 μm spacing between lines. The active layer deposited onto the current collector/gas diffusion layer is comprised of materials that catalyze the chemical conversion of the gas and materials that control the hydrophobicity of the layer. The active layer illustrated in FIG. 18 is about 30 μm thick. The control over hydrophobicity in these layers is important to control the transport of liquid water in the presence of a gas such as oxygen or hydrogen to avoid flooding or drying out of the electrode layer.

As is discussed above, graded hydrophobicity layers can include unmodified carbon material, such as activated carbon, or an electrocatalyst such as one including an active species dispersed on a carbon support phase. Graded hydrophobicity layers having an average layer thickness of from 5 μm up to 200 μm for each individual layer can be formed in accordance with the present invention for a total layer thickness of 5 μm up to 1 mm or higher.

If the graded hydrophobicity layer consists of a single sublayer and this layer is placed between the electrocatalyst layer and a gas diffusion layer, the hydrophobicity of this layer is substantially different than the hydrophobicity of the gas diffusion layer or the electrocatalyst layer. For example, if the electrocatalyst layer contains 5 wt. % TFE fluorocarbon polymer and the gas diffusion layer is pure TFE fluorocarbon polymer, the graded hydrophobicity layer would contain at least 25 wt. % and less than 95 wt. % of the TFE fluorocarbon polymer. In another example, if the electrocatalyst layer contains 20 wt. % TFE fluorocarbon polymer and the gas diffusion layer contains 35 wt. % of the TFE fluorocarbon polymer, the graded hydrophobicity layer would have a TFE fluorocarbon polymer content anywhere between 25 wt. % and 95 wt. %. These examples are suitable for fuel cell as well as metal-air battery applications.

For applications using liquid electrolytes, the graded hydrophobicity layer may consist of more than one sublayer. The sublayer with the highest hydrophobicity would interface the gas diffusion layer and the lowest hydrophobicity layer would interface the electrocatalyst layer. For example, if the electrocatalyst layer includes 10 wt. % TFE fluorocarbon polymer and the graded hydrophobicity layer consists of 3 sublayers, the sublayer interfacing the electrocatalyst layer would have at least 25 wt. % TFE fluorocarbon polymer or more, the intermediate sublayer would have 30 wt. % TFE fluorocarbon polymer or more and the sublayer interfacing the gas diffusion electrode would have at least 35 wt. % TFE fluorocarbon polymer or more.

The graded hydrophobicity layer may serve as a microscopic gas diffusion layer in combination with macroscopic gas distribution layers such as carbon cloth or carbon paper. For example, if the electrocatalyst layer does not contain TFE fluorocarbon polymer but a proton conductive material, and the gas distribution layer is a carbon cloth or carbon paper with hydrophilic properties, the graded hydrophobicity layer can consist of several sublayers with increasing or decreasing TFE fluorocarbon polymer content towards the gas distribution layer.

In a PEMFC membrane electrode assembly in which the electrocatalyst layer contains a proton conductive material and a carbon cloth or carbon paper is used for a gas distribution layer, the graded hydrophobicity layer can consist of a single sublayer with 35 wt. % TFE fluorocarbon polymer and 65 wt. % carbon black, or can include several sub layers wherein the one with the lowest TFE fluorocarbon polymer content interfaces the electrocatalyst layer, and the one with the highest TFE fluorocarbon polymer content interfaces the gas distribution layer.

In another embodiment, for direct methanol fuel cells (DMFC), and more specifically for the anode of a DMFC, the graded hydrophobicity layer may consist of several sublayers, where the lowest hydrophobicity sublayer interfaces the gas distribution layer at the anode side and the highest hydrophobicity layer interfaces the electrocatalyst. Alternatively, there can be a single layer having a TFE fluorocarbon polymer concentration between 5 and 95 wt. % TFE fluorocarbon polymer.

In one embodiment the graded hydrophobicity layer can be combined with the current collector of the electrochemical device and serve as a gas distribution layer with hydrophilic/hydrophobic properties tailored to the particular application.

The ultimate goal of the graded hydrophobic layers is to provide an electrode design solution for humidity control. Hydrophobicity gradients developed within an intermediate layer between the catalytic and the gas-diffusion layers enables conditions that permit capillary condensation of water to take place within its length. Such conditions create difference in the rate of transport of water through the gas-diffusion electrode and the transport of oxygen or other gas species not subject to capillary condensation.

Thus, using improved electrocatalyst powders and other material components of an MEA, the present invention provides MEAs for use in fuel cells having improved properties over a wide range of voltage and current density.

According to one embodiment of the present invention, the membrane electrode assembly includes an electrocatalyst layer including from about 20 to 40 volume percent electrocatalyst, from about 20 to 40 volume percent proton conducting polymer and at least about 30 volume percent porosity, more preferably at least about 50 volume percent porosity. The electrocatalyst layer has a reduced average thickness and in one embodiment has an average thickness of not greater than about 50 µm and more preferably not greater than about 25 µm.

As is discussed in detail hereinabove, the membrane electrode assembly includes an anode, a cathode and a membrane separating the anode and cathode. The cathode includes an electrocatalyst layer having supported electrocatalyst particles including an active species phase dispersed on a support phase. According to one embodiment of the present invention, the total supported active species loading in the cathode electrocatalyst layer is not greater than about 0.2 mg/cm$^2$. Even at this low loading, the membrane electrode assembly can have a cell voltage of at least about 0.6 volts at a constant current density of about 600 mA/cm$^2$ measured at 50° C. and atmospheric pressure using a feed gas of pure air to the cathode (2.2 stoichiometry) and pure hydrogen to the anode (1.2 stoichiometry) with substantially constant flow rates corresponding to 1A/cm$^2$ and 100% external humidification of the gases. Cell voltage (V) is the potential difference between the cathode and the anode of a single MEA fuel cell when operating at a given current density (mA/cm$^2$). The stoichiometric ratio at which hydrogen and oxygen are supplied to the fuel cell correspond to the exact stoichiometry of the reaction:

$$2H_2 + O_2 \rightarrow 2H_2O$$

Thus, at stoichiometry, 2 moles of hydrogen would be provided for each mole of oxygen. Often both hydrogen and oxygen are supplied at greater than the stochiometric rate. Thus, a 2.2 stoichiometry of oxygen (air) indicates an excess of 0.2 moles oxygen and a 1.2 stoichiometry of hydrogen indicates an excess of 0.2 moles of hydrogen.

More preferably, the membrane electrode assembly has a cell voltage of at least about 0.6 volts at a constant current density of about 600 mA/cm$^2$ at the above specified testing conditions. The above membrane electrode assembly also has a long lifetime and according to one embodiment the cell voltage decreases by not more than about 30 mV, more preferably not more than about 20 mV, when the membrane electrode assembly is run for a continuous period of about 4000 hours at 50° C. and atmospheric pressure with a feed gas of pure air to the cathode and pure hydrogen to the anode with a constant flow rate and 100% external humidification.

According to another embodiment, the total supported active species loading in the electrocatalyst layer is not greater than about 0.1 mg/cm$^2$. Even at this low loading, the membrane electrode assembly has a reference voltage of at least about 0.7 volts at a constant current density of about 150 mA/cm$^2$ at 50° C. and atmospheric pressure using a feed gas of pure air to the cathode and pure hydrogen to the anode with substantially constant flow rates and external humidification. More preferably, the current density is at least about 200 mA/cm$^2$ and even more preferably is at least about 250 mA/cm$^2$. Further, at a reference voltage of at least about 0.5 volts, the current density is preferably at least about 550 mA/cm$^2$, such as at least about 600 mA/cm$^2$.

According to another preferred embodiment, the total supported active species loading in the electrocatalyst layer is not greater than about 0.2 mg/cm$^2$. According to this embodiment, the membrane electrode assembly has a reference voltage of at least about 0.6 volts at a constant current density of at least about 550 mA/cm$^2$ at 50° C. and atmospheric pressure using a feed gas of pure air to the cathode and pure hydrogen to the anode with substantially constant flow rates and external humidification. More preferably, the current density is at least about 600 mA/cm$^2$ and even more preferably is at least about 650 mA/cm$^2$.

According to another preferred embodiment, the total supported active species loading in the electrocatalyst layer is not greater than about 0.4 mg/cm$^2$. According to this embodiment, the membrane electrode assembly has a reference voltage of at least about 0.5 volts at a constant current density of at least about 800 mA/cm$^2$ at 50° C. and atmospheric pressure using a feed gas of pure air to the cathode and pure hydrogen to the anode with substantially constant flow rates and external humidification. More preferably, the current density is at least about 850 mA/cm² and even more preferably is at least about 900 mA/cm² and even more preferably at least about 1000 mA/cm².

According to another preferred embodiment, the total supported active species loading in the electrocatalyst layer is not greater than about 0.5 mg/cm². According to this embodiment, the membrane electrode assembly has a reference voltage of at least about 0.5 volts at a constant current density of at least about 800 mA/cm² at 50° C. and atmospheric pressure using a feed gas of pure air to the cathode and pure hydrogen to the anode with substantially constant flow rates and external humidification. More preferably, the current density is at least about 850 mA/cm² and even more preferably is at least about 900 mA/cm² and even more preferably at least about 1000 mA/cm².

Delta E (mV) is a parameter defined as the difference in the cell voltages when the cell is operated with oxygen as the cathode feed gas and with air as the cathode feed gas. In both cases pure hydrogen is used as anode gas. The measurements are made at constant gas flows corresponding to hydrogen 1.2 and oxygen (air) 2.2 stoichiometry for 1000 mA/cm² current density. Delta E can be used as a measure for the presence of diffusional limitations in the electrode layers at certain current densities. In the absence of diffusional limitations, delta E would be constant in the whole range of current densities studied and would reflect only the differences in the oxygen partial pressure when operating with oxygen and air at identical total cathode gas pressure. In all of the following examples, an atmospheric pressure for all gases was applied.

The membrane electrode assemblies of the present invention are also characterized by a low delta E value, as described above. According to one embodiment, the total supported active species loading in the cathode electrocatalyst layer is not greater than about 0.1 mg/cm². According to this embodiment, the membrane electrode assembly has a delta E value of not greater than about 50 millivolts at 200 mA/cm², not greater than about 100 millivolts at 400 mA/cm² and not greater than 175 millivolts at 600 mA/cm², when measured at 50° C. and atmospheric pressure using a feed gas of either pure oxygen or air to the cathode and pure hydrogen to the anode with substantially constant flow rates and 100% external humidification. The measurements are made at constant gas flows corresponding to hydrogen 1.2 and oxygen (air) 2.2 stoichiometry for 1000 mA/cm² current density. According to one embodiment, the performance of the membrane electrode assembly is at least about 0.6 volts at 400 mA/cm².

According to another embodiment, the total supported active species loading in the cathode electrocatalyst layer is not greater than about 0.2 mg/cm² and the membrane electrode assembly has a delta E value of not greater than about 50 millivolts at 200 mA/cm², not greater than about 100 millivolts at 600 mA/cm² and not greater than 170 millivolts at 1000 mA/cm². The delta E is measured at 50° C. and atmospheric pressure using a feed gas of either pure oxygen or air to the cathode and pure hydrogen to the anode with substantially constant flow rates and 100% external humidification. The measurements are made at constant gas flows corresponding to hydrogen 1.2 and oxygen (air) 2.2 stoichiometry for 1000 mA/cm² current density. According to one embodiment, the performance of the membrane electrode assembly is at least about 0.6 volts at 600 mA/cm².

According to yet another embodiment, the total supported active species loading in the cathode electrocatalyst layer is not greater than about 0.4 mg/cm² and the membrane electrode assembly has a delta E value of not greater than about 50 millivolts at 200 mA/cm², not greater than about 100 millivolts at 600 mA/cm² and not greater than 250 millivolts at 1000 mA/cm². The delta E is measured at 50° C. and atmospheric pressure using a feed gas of either pure oxygen or air to the cathode and pure hydrogen to the anode with substantially constant flow rates and external humidification. The measurements are made at constant gas flows corresponding to hydrogen 1.2 and oxygen (air) 2.2 stoichiometry for 1000 mA/cm² current density. According to one embodiment, the performance of the membrane electrode assembly is at least about 0.6 volts at 600 mA/cm².

According to yet another embodiment, the total supported active species loading in the electrocatalyst layer is not greater than about 0.6 mg/cm² and the membrane electrode assembly has a delta E value of not greater than about 80 millivolts at 200 mA/cm², not greater than about 150 millivolts at 600 mA/cm² and not greater than 200 millivolts at 1000 mA/cm². The delta E is measured at 50° C. and atmospheric pressure using a feed gas of either pure oxygen or air to the cathode and pure hydrogen to the anode with substantially constant flow rates and external humidification. The measurements are made at constant gas flows corresponding to hydrogen 1.2 and oxygen (air) 2.2 stoichiometry for 1000 mA/cm² current density. According to one embodiment, the performance of the membrane electrode assembly is at least about 0.5 volts at 700 mA/cm².

EXAMPLES

The foregoing description and the following examples make reference to a number of materials by use of a tradename for an example of that material. However, the embodiments of the present invention are not limited to the use of such specific materials.

For example, TEFLON (E.I. duPont de Nemours, Wilmington, Del.) refers to a hydrophobic polymer, more specifically a tetrafluoroethylene (TFE) fluorocarbon polymer. NAFION (E.I. duPont de Nemours, Wilmington, Del.) refers to a hydrophobic and proton-conducting polymer, specifically a sulfonated perfluorohydrocarbon polymer.

The description and examples also make reference to various forms of carbon by reference to tradenames. The general properties of these carbon supports are listed in Table 1. SHAWINIGAN BLACK is an acetylene carbon black available from Chevron Chemical Co., Houston, Tex. VULCAN XC-72 is a furnace carbon black available from Cabot Corp., Alpharetta, Ga., and is also available in graphitized form. NORIT SA-3 is an activated carbon also available from Cabot Corp., Alpharetta, Ga. PWA is an activated carbon available from Calgon Carbon Corp., Pittsburgh, Pa. BLACKPEARLS is available from the Cabot Corp., Alpharetta, Ga. and KETJENBLACK is available from Akzo Nobel, Amersfoort, Netherlands.

TABLE 1

Carbon Catalyst Supports

| Carbon Source | Average Particle Size (μm) | BET Surface Area (m²/g) |
| --- | --- | --- |
| SHAWINIGAN BLACK | 0.055 | 80 |
| VULCAN XC-72 | 0.039 | 240 |
| Graphitized VULCAN XC-72 | 0.5* | 100* |
| NORIT SA-3 | 22 | 700 |

TABLE 1-continued

Carbon Catalyst Supports

| Carbon Source | Average Particle Size (μm) | BET Surface Area (m²/g) |
|---|---|---|
| PWA | 22 | 820 |
| BLACKPEARLS | 0.4* | 1400* |
| KETJENBLACK | 0.4* | 1400* |

*These values are approximate.

GRAFO 1300 and GRAFO 1322 are aqueous dispersions containing 20 wt. % and 22 wt. % carbon respectively and are available from Fuchs Lubricant, Harvey, Ill. GRAFO 1300 is a dispersion of SHAWINIGAN BLACK and GRAFO 1322 is a dispersion of VULCAN XC-72. The GRAFO suspensions use a binder system to aid in the long-term stability of the carbon dispersions. This binder decomposes by about 300° C. and the suspensions have a long shelf life. The GRAFO dispersions are slightly alkaline, with a pH of about 9, and the dispersions are only stable at a pH above 6 due to the nature of the binder.

Metal-Carbon Supported Electrocatalyst Particles

Examples of metal-carbon aggregate electrocatalyst powders in accordance with the present invention were prepared and are described in Table 2. The powder batch examples were prepared by ultrasonic generation and the aerosol was heated in a tubular furnace reactor. All of the examples were prepared using GRAFO 1300 as a carbon source. The corresponding amount of Pt precursor was dissolved and added to the carbon suspension to form the precursor. Table 2 describes the type of Pt precursor used, the carrier gas, the conversion temperature and targeted Pt nominal concentration in the final catalyst.

TABLE 2

Conditions for Ultrasonically Generated Pt/C Powder

| Sample | Pt Precursor | Pt (wt. %) | Conversion Temperature (° C.) | Carrier Gas |
|---|---|---|---|---|
| P27B | $Pt(NH_3)_4(NO_3)_2$ | 20 | 400 | Air |
| P31C | $Pt(NH_3)_4(NO_3)_2$ | 20 | 500 | Air |
| P32A | $Pt(NH_3)_4(NO_3)_2$ | 20 | 300 | Air |
| P32B | $Pt(NH_3)_4(NO_3)_2$ | 20 | 200 | Air |
| P33B | $Pt(NH_3)_4(NO_3)_2$ | 20 | 200 | $N_2$ |
| P37C | $Pt(NH_3)_4(NO_3)_2$ | 20 | 700 | $N_2$ |
| P38A | $Pt(NH_3)_4(NO_3)_2$ | 20 | 500 | $N_2$ |
| P39A | $Pt(NH_3)_4(NO_3)_2$ | 20 | 400 | Air |
| P39B | $H_2Pt(OH)_6$ | 10 | 400 | Air |
| P40C | $H_2Pt(OH)_6$ | 10 | 300 | Air |

Figure 19:
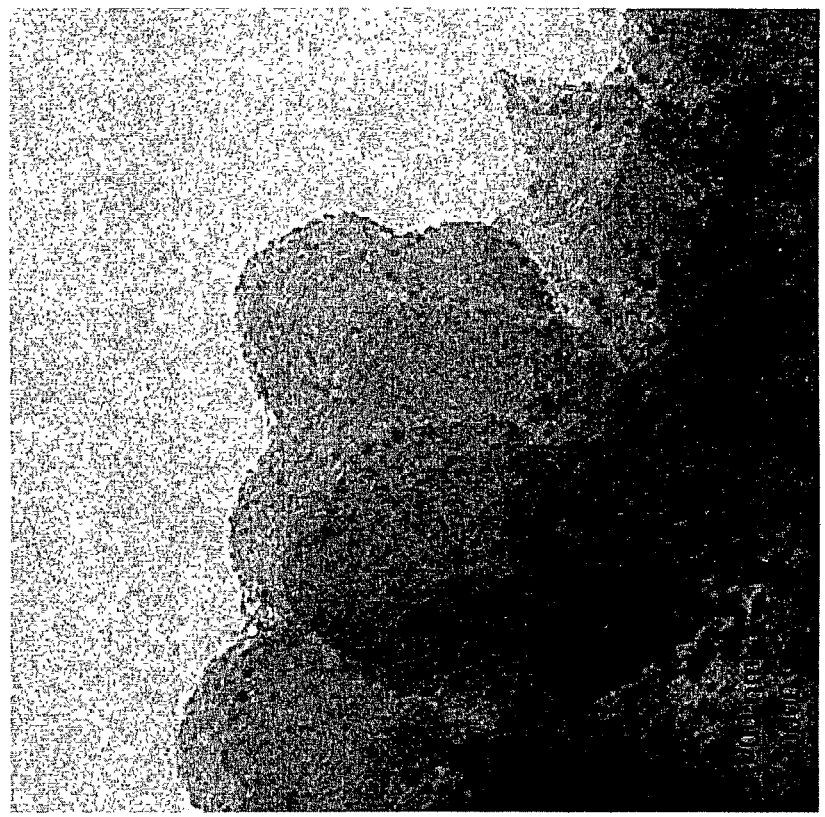
FIG. 19 illustrates transmission electron microscopy (TEM) images of prior art electrocatalyst (19a) electrocatalyst particles according to the present invention (19b).
Figure 19:
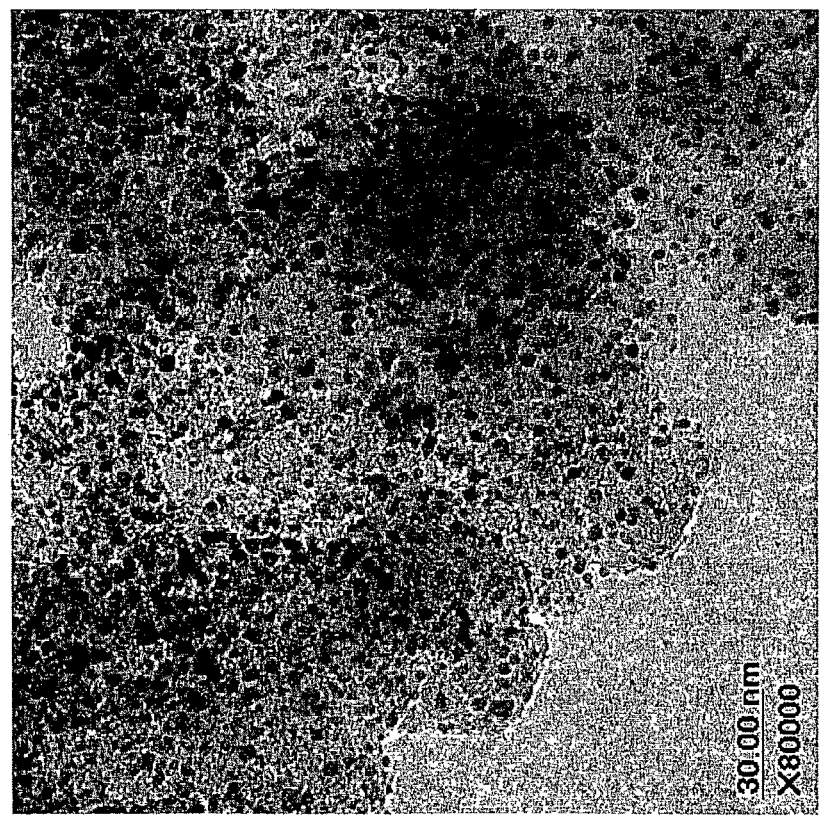

As is illustrated by FIG. 1, TEM analysis indicated that the electrocatalyst aggregate particles are substantially spherical with the particle size varying between 1 μm and 2 μm. The electrocatalyst aggregate particles consist of carbon support phase particles of about 30 to 50 nanometer diameter and various sizes of Pt particles and particle clusters dispersed thereon. The electrocatalyst aggregate particles have a highly porous structure. FIG. 19 compares TEM images of prior art 20 wt. % Pt/C catalyst (FIG. 19a) and 20 wt. % Pt/C catalyst made according to the present invention (FIG. 19b).

Figure 20:
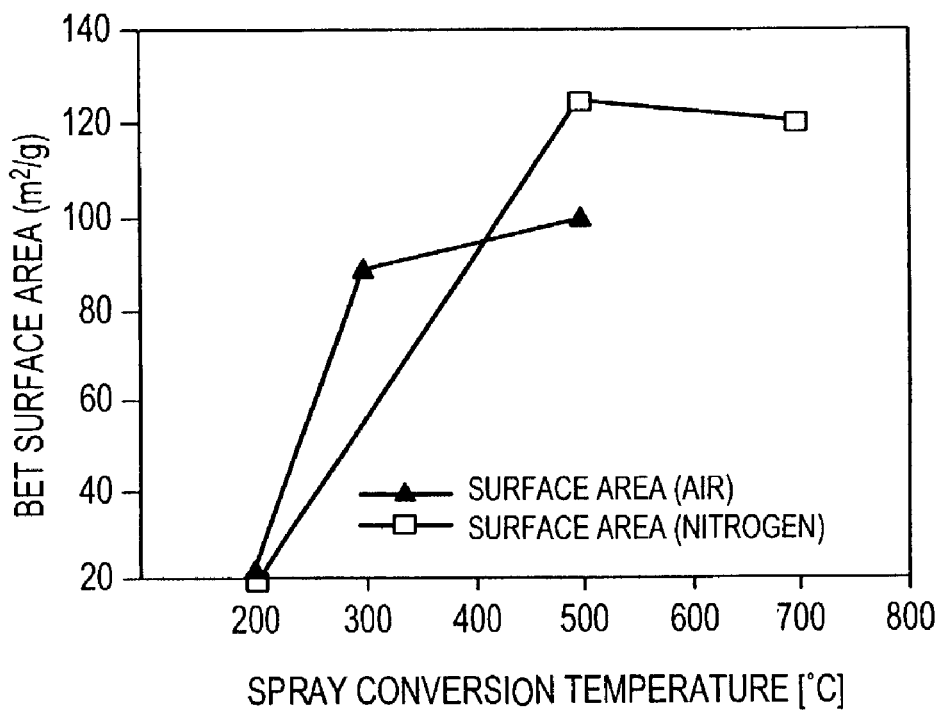
FIG. 20 illustrates the BET surface area of a 20 wt. % Pt/C electrocatalyst as a function of spray conversion temperature according to an embodiment of the present invention.

The BET nitrogen absorption method was used to analyze the surface area of some of the ultrasonically generated Pt/C aggregate electrocatalyst powders according to the present invention. The results are summarized in FIG. 20. Both the conversion temperature and the carrier gas composition had an effect on the catalyst surface area. When air is used as a carrier gas, the surface area is higher at a conversion temperature of 300° C. (89 m²/g) compared to 200° C. (22 m²/g). However, a further increase of the conversion temperature to 400° C. did not lead to significant change in the surface area. In contrast, when nitrogen is used as carrier gas, the catalyst surface area increases to 125 m²/g at 500° C. but a further increase of the conversion temperature to 700° C. decreases the surface area.

Analysis of the changes in the surface area as a function of the spray conversion temperature and carrier gas composition led to the following conclusions:

when air is used as a carrier gas, spray conversion temperatures above 300° C. are not significantly beneficial for increasing the BET surface area;

when nitrogen is used as a carrier gas, the powder surface area is generally higher compared to powders generated with air as a carrier gas;

if nitrogen is used as a carrier gas, a conversion temperature of 500° C. is advantageous for producing a high Bet surface area powder; and XPS analysis was performed on the samples to provide information about the Pt oxidation state and dispersion in the catalysts. Three main characteristics of the XPS spectra were analyzed allowing comparison between the samples generated at different conditions: the positions of the binding energy of Pt $4f_{7/2}$ photoelectrons which indicates the Pt oxidation state; the relative intensities of Pt 4f vs. C 1s photoelectron peaks, which indicates the level of Pt dispersion; and the appearance of the N 1s photoelectron peak and its relative intensity vs. the C 1s peak which indicate the level of impurities and the degree of conversion of the platinum precursor. All preparation conditions, recording of the spectra and data processing were identical for all samples.

As listed in Table 3, a Pt $4f_{7/2}$ binding energy of 71.2 eV was measured for the prior art catalyst (Sample P3A). The measured values for the Pt 4f binding energies, peak hwhm (half width at half maximum) and peak intensities closely match the theoretical and model XPS handbook values of Pt 4f peaks for Pt(0) oxidation state, i.e., for Pt metal. These values were further used for curve fitting of the Pt 4f peaks for the catalysts according to the present invention.

TABLE 3

XPS Data for Pt/C Powders

| Sample | Pt $4f_{7/2}$ peak position (eV) | I (Pt 4f)/I (C 1s) (relative intensities) | I (N 1s)/I (C 1s) (relative intensities) |
|---|---|---|---|
| P3A* | 71.2 | 0.682 | 0.028 (1.5 at. %) |
| P27B | 71.2 (80%) 72.5 (20%) | 0.305 | 0.000 |
| P31C | 71.4 | 0.481 | 0.020 (1.0 at. %) |
| P32A | 72.1 (80%) 73.2 (20%) | 0.398 | 0.000 |
| P32B | 73.4 | 0.352 | 0.149 (5.6 at. %) |
| P33B | 73.3 | 0.406 | 0.165 (7.0 at. %) |
| P37C | 71.8 | 0.489 | 0.009 (0.4 at. %) |
| P38A | 71.6 | 0.525 | 0.000 |
| P39A | 71.7 | 0.327 | 0.000 |
| P39B | 71.6 | 0.234 | 0.022 (1.1 at. %) |
| P40C | 71.9 | 0.327 | 0.025 (1.3 at. %) |

*Prior Art

Table 3 also contains information regarding the I (Pt 4f)/I (C 1s) relative intensities, which can be used as a measurement of the dispersion of the Pt active species clusters on the carbon support. Since almost all of the catalysts of the examples contain an identical amount of Pt as Example P3A (20 wt. % Pt), the relative intensities I (Pt 4f)/I (C 1s) can be used for direct comparison of their Pt dispersion relative to the one for the commercial catalyst. This is mostly accurate for the catalysts of the present invention that have comparable surface area to the commercial catalyst, e.g., those prepared at spray conversion temperatures of 300° C. and above in nitrogen and at 400° C. and above in air.

Table 3 also lists the relative intensities I (N 1s)/I (C 1s) and the surface concentration of nitrogen in atomic percent for all catalysts analyzed by XPS. Example P3A (prior art) contains small impurities of nitrogen, which could indicate the use of nitrogen-containing reagents in the preparation of the catalyst or the presence of a nitrogen-containing surfactant.

As can be seen from the Pt 4f spectrum for Example P27B, the curve fit for the Pt 4f peaks cannot be accomplished using only the doublet related to Pt(0) oxidation state. A second doublet of Pt 4f peaks is needed with binding energy of 72.5 eV for the Pt $4f_{7/2}$ peak. This Pt $4f_{7/2}$ binding energy can be related to Pt (II) oxidation state indicating that the conversion of the Pt precursor to Pt metal is not complete in Example P27B. The relative intensity of the second doublet related to Pt (II) oxidation state accounts for approximately 20% of the total Pt 4f peak area and therefore up to 20% of the Pt in the Example P27B is not converted to the Pt (0) oxidation state, indicating that spray conversion in air at 400° C. does not completely reduce the Pt precursor to Pt (0) and does not produce good dispersion of Pt clusters on the carbon support. The value of the relative intensity I (Pt 4f)/I (C 1s) for Example P27B is more than two times lower compared to the one for the commercial catalyst. No nitrogen impurities, however, were detected for Example P27B.

It should be noted that for Pt-based fuel cell electrocatalysts supported on carbon, highly dispersed Pt metal active species clusters are required for achieving high catalytic activity. Therefore, achieving high dispersion of Pt in the Pt (0) state can be used as criteria for the prediction of catalytic performance of the fuel cell catalysts.

In order to find optimal spray conversion conditions for achieving complete Pt reduction and high dispersion, the changes in these characteristics as a function of the spray conversion temperature and the carrier gas composition were analyzed. In general, a shift in the position of the Pt $4f_{7/2}$ peak towards higher than 71.2 eV binding energies was considered an indication of a non-complete reduction to Pt metal. Simultaneously, a relative intensity I (Pt 4f)/I (C 1s) lower than the commercial sample is indicative of lower Pt cluster dispersion, corresponding to higher average size of Pt clusters. For Example P38A, the XPS analysis was repeated in order to estimate the accuracy of the measurements. A comparison between the two analyses shows excellent reproducibility for the XPS peak positions and less than 2% difference in the XPS relative intensities.

Figure 21:
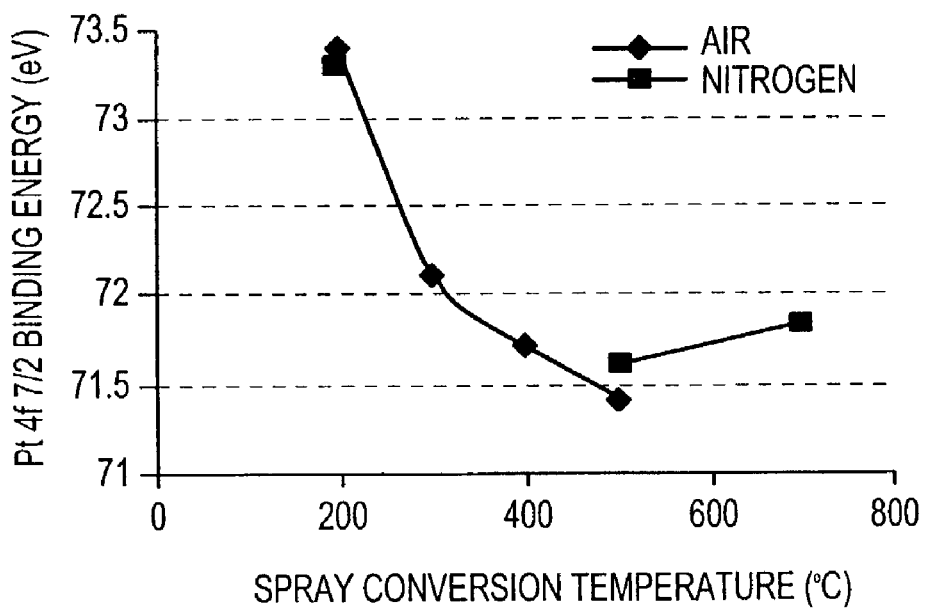
FIG. 21 illustrates the relationship between the $Pt4f_{7/2}$ XPS binding energy and spray conversion temperature and carrier gas for 20 wt. % Pt/C electrocatalyst according to an embodiment of the present invention.

FIG. 21 illustrates the dependence of the Pt $4f_{7/2}$ binding energy position for 20 wt. % Pt/C electrocatalysts (formed from SHAWINAGAN BLACK carbon and $Pt(NH_3)_4(NO_3)_2$ precursor) as a function of the spray conversion temperature and the carrier gas composition. A conversion temperature of at least 500° C. is necessary with air as a carrier gas to achieve a reasonably high degree of conversion to the Pt (0) oxidation state. There are no significant differences observed when nitrogen is used as a carrier gas. An increase of the conversion temperature to 700° C. does not lead to improved results. Therefore, when $Pt(NH_3)_4(NO_3)_2$ precursor is used, a temperature of at least about 500° C. is adequate for achieving complete conversion of the precursor and formation of Pt metal active species.

In support of that conclusion are the high-resolution XPS spectra, which were measured for Example P32B and Example P33B. Both catalysts were made at a conversion temperature of 200° C., Example P32B with air as a carrier gas and Example P33B with nitrogen as a carrier gas (Table 2). In addition to the peaks at 73.2 eV for Pt(II) oxidation state, e.g., partially converted precursor, another Pt 4f peak doublet appears with Pt $4f_{7/2}$ binding energy of approximately 75.6 eV which is very close to the value for the Pt (IV) oxidation state. In the N 1s region peaks at 404.2 eV and 406.5 eV are observed and related to $NO_2$ and $NO_3$ species, which confirms the conclusion for non-complete precursor conversion. This non-complete conversion results in a concentration of nitrogen in these electrocatalysts of up to 7 atomic percent.

An increase in the conversion temperature to 300° C. (Example P32A) leads to a significant decrease of the nitrogen impurities. However, even though the precursor conversion is more complete, approximately 20% of the Pt is in the Pt(II) oxidation state.

Figure 22:
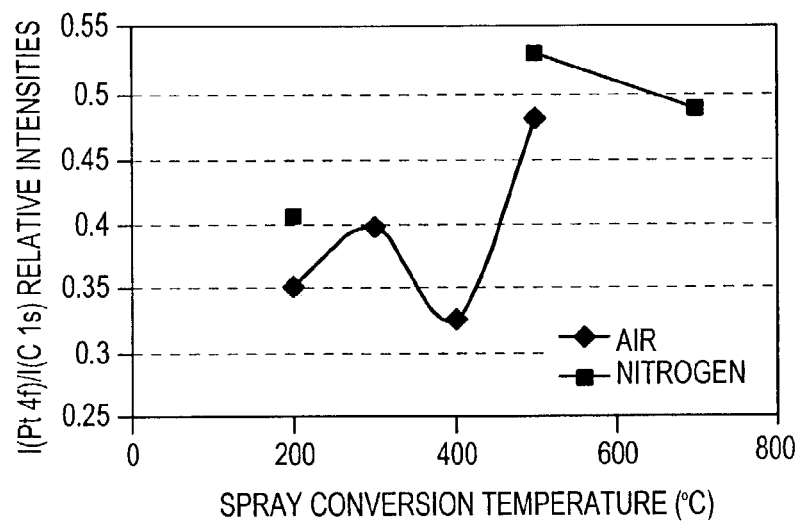
FIG. 22 illustrates relative XPS intensity as a function of spray conversion temperature for 20 wt. % Pt/C electrocatalyst according to an embodiment of the present invention.

As mentioned above, the dispersion of the Pt clusters is of significant importance for achieving high catalytic activity. FIG. 22 illustrates the dependence of the relative intensities I (Pt 4f)/I (C 1s) as a function of spray processing temperature for 20 wt. % Pt/C using SHAWINAGAN BLACK as the carbon source. In general, at identical spray processing temperatures, the catalysts made with nitrogen as a carrier gas show higher relative intensities I (Pt 4f)/I (C 1s) and therefore have better dispersion of Pt on the support structure. An increase of the spray processing temperature up to 500° C. leads to improved Pt dispersion for both air and nitrogen as the carrier gases and increasing the spray processing temperature to 700° C. is not beneficial for the Pt dispersion. The highest I (Pt 4f)/I (C 1s) relative intensity value is observed for Example P38A, which was prepared at 500° C. processing temperature in nitrogen. The relative intensity I (Pt 4f)/I (C 1s) of 0.525 for Example P38A is still lower than the one measured for Sample P3A, which suggests lower dispersion. However, no nitrogen impurities are detected for Example P38A, while about 1.5 atomic percent impurities were detected for Sample P3A.

Two of the samples listed in Table 2 were synthesized with a different Pt precursor ($H_2Pt(OH)_6$), with only 10 weight percent Pt. The XPS data for Examples P39B and P40C illustrate that a reaction temperature in air of at least 400° C. is necessary for achieving the Pt (0) oxidation state from this precursor. The Pt has higher dispersion for Example P40C, which was prepared at 300° C. compared to Example P39B, prepared at 400° C. This result is in contrast with the XPS data for samples based on $Pt(NH_3)_4(NO_3)_2$ precursor, for which higher conversion temperatures led to better Pt dispersion. This result suggests that $H_2Pt(OH)_6$ precursor converts at lower temperatures compared to $Pt(NH_3)_4(NO_3)_2$, and undesirable diffusion and agglomeration of Pt clusters occurs at higher conversion temperatures.

XPS analysis of the electrocatalyst powders provides information regarding important characteristics of the catalysts such as Pt oxidation state and dispersion, which influence the catalytic activity of the powders. However, other characteristics of the catalysts such as Pt cluster size distribution may have significant impact on the catalytic activity as well.

Samples of the Pt/C electrocatalysts were evaluated in PEM fuel cells and the results of the electrochemical characterization were compared to two commercially available electrocatalysts. The examples which were electrochemically characterized are Examples P37C, P38A, P39A and P39B (Table 2).

Cathode electrodes were fabricated by the catalyst ink deposition on a gas diffusion layer. The Pt/C electrocatalyst was dispersed in a NAFION/alcohol/water solution to form a stable ink suspension. Specifically, 1 gram of the electrocatalyst was wetted with 2 to 3 ml of water to avoid pyrogenic effects, and suspended in 10 ml of a NAFION solution (5 wt. % NAFION polymer in a water/i-propanol mix). The ink container was placed into a 250W, 40 KHz ultrasonic bath for at least 10 min to ensure uniform mixing of the electrocatalyst powder and NAFION. The ink was then deposited onto a gas diffusion electrode. The ink yielded a catalyst/NAFION ratio of 2:1 (1 mg catalyst/cm$^2$: 0.5 mg NAFION/cm$^2$), which remains in the electrode after all solvents have been removed.

The gas diffusion layer (GDL) was prepared by brush application of a suspension of SHAWINIGAN BLACK and TEFLON emulsion to give a 35 to 40 weight percent TEFLON/carbon ratio onto a carbon cloth or paper. The gas-diffusion electrode, soaked with the TEFLON/carbon suspension, is heat treated at 300° C. to 350° C. for 15 min. This temperature range is near the glass-transition point of the TEFLON material.

The above described electrocatalyst ink was applied on the TEFLON modified GDL using a brush while the electrode was mounted on a hot plate at 90° C. to 120° C. The catalyst loading is determined from the electrode weight change after removing the solvents. An additional NAFION layer was deposited on top of the above electrode layer from a 5 wt. % NAFION solution to yield an additional 0.3 mg NAFION/cm$^2$.

The platinum loading of the cathodes was 0.20±0.01 mg/cm$^2$ which is considered low by industrial standards for oxygen reduction electrocatalysts. All hydrogen electrodes (anodes) were loaded with 0.05 mg/cm$^2$ of platinum using a 10% Pt/C commercial catalyst.

Membrane electrodes assemblies (MEAs) were fabricated by symmetrically hot pressing electrodes (with the catalyst side facing the membrane) onto both sides of a NAFION 112 PEM at 155° C. and at 75 kg/cm$^2$ pressure. The performance evaluation of MEAs was carried out in test cell with a working area of 50 cm$^2$ between ribbed graphite plates and copper end plates at 50° C. and an atmospheric pressure of humidified reactant gases.

Figure 23:
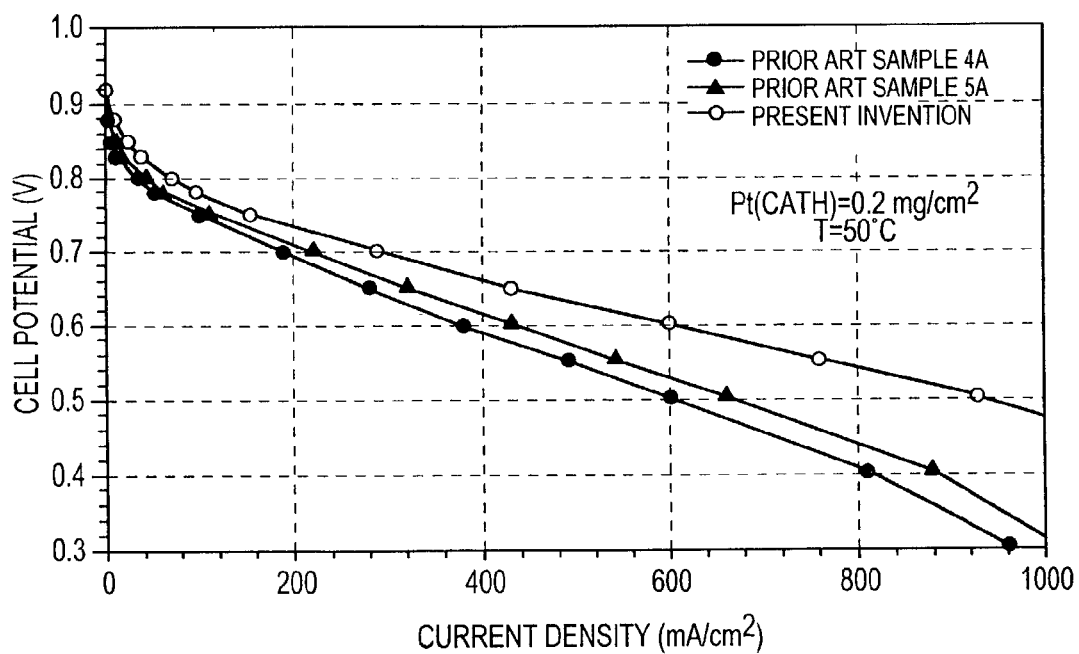
FIG. 23 illustrates a polarization curve for a membrane electrode assembly according to an embodiment of the present invention compared to prior art electrocatalysts.

FIG. 23 illustrates a polarization curve for MEAs comprising different commercial catalysts (Samples P4A and P5A) and a catalyst according to the present invention, prepared and measured under identical conditions. Both the prior art electrocatalysts and the electrocatalyst of the present invention included 20 weight percent platinum on an identical carbon black support. It is evident from these curves that the electrocatalyst of the present invention demonstrates superior performance in the MEA. For example, at a cell potential of 0.6 V both prior art electrocatalysts provide about 400 mA/cm$^2$ while the electrocatalyst of the present invention provides 600 mA/cm$^2$, a 50% improvement of MEA performance. P39A FIG. 23 illustrates that the electrode fabricated with the electrocatalyst of the present invention (example P39A) demonstrates overall higher current densities within the entire investigated range of potentials. At the same time, the polarization curve is characterized by lower dependence of the current on the potential (lower negative slope of the curve in its "linear" portion), which indicates lower ohmic resistance of the catalytic layer. The dependence of the potential on current density remains practically linear even at high current densities, indicating that there is no expression of any diffusion limitations in the investigated current density range.

Figure 24:
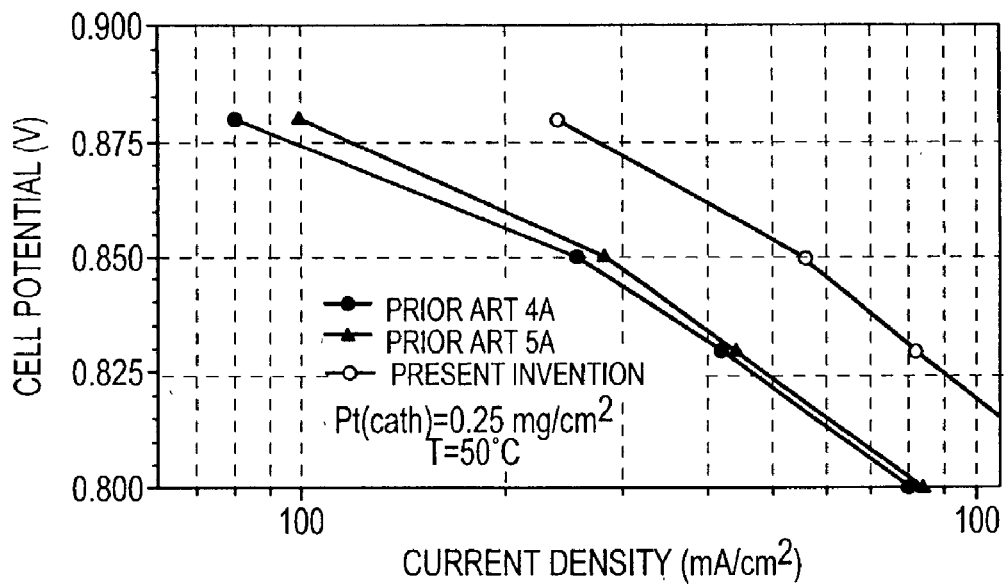
FIG. 24 illustrates a Tafel plot for the data illustrated in FIG. 23.

FIG. 24 illustrates a Tafel plot of the data from the low current density region of FIG. 23. A Tafel plot is a semi-logarithmic data representation used to establish the mechanism of the reaction (from the negative slope of the linearized dependencies) and to reveal the catalytic effects expressed as the position of the intercepts on the current density axis. FIG. 24 illustrates that the advantageous performance of the catalyst generally revealed in FIG. 23 is due to higher catalytic activity. All three curves are linear (in semi-logarithmic coordinates) with the same negative slope, suggesting a uniform mechanism of oxygen reduction. The curve corresponding to the electrocatalyst of the present invention, however, is shifted toward higher current densities with a positive difference in the current density axis cutoff of approximately 30 mA/cm$^2$. Both prior art samples demonstrate practically identical catalytic activity.

The improvement in catalytic activity of the electrocatalyst of the present invention when compared to the prior art samples can be explained by the platinum active species cluster size and the degree of dispersion of the active species on the carbon surface. TEM microphotographs of the electrocatalysts of the present invention compared to the prior art electrocatalyst show that the catalyst of the present invention possesses a significant amount of smaller size platinum clusters (1 nm to 2 nm) compared to the prior art samples. This results in an increased platinum utilization and a larger reaction interface in the active layer of the oxygen electrode.

Figure 25:
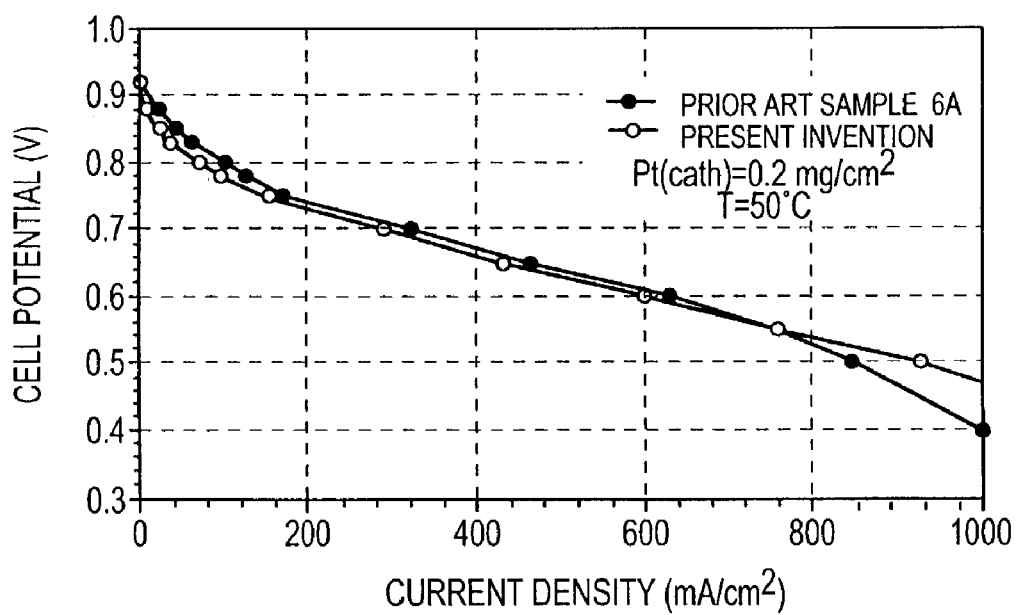
FIG. 25 illustrates a polarization curve for a membrane electrode assembly according to the present invention compared to a membrane electrode assembly utilizing a prior art electrocatalyst.

FIG. 25 illustrates a comparison of the polarization curves obtained with a 20 wt. % Pt/C catalyst of the present invention with one of the best performing research samples known to the present inventors, a 20 wt. % Pt—Co—Cr/C composite electrocatalyst (Sample 6A). This catalyst is applied to the electrode surface to give identical loading, measured as Pt metal per cm$^2$ (mgPt/cm$^2$). Due to the amount of Pt in the electrocatalyst of the present invention, the electrode is loaded with 3-times less catalyst than the Sample 6A. The polarization curves of both electrodes practically coincide demonstrating unique matching of the performance of an advanced tri-metal composite catalyst by the simpler Pt electrocatalyst of the present invention.

Figure 26:
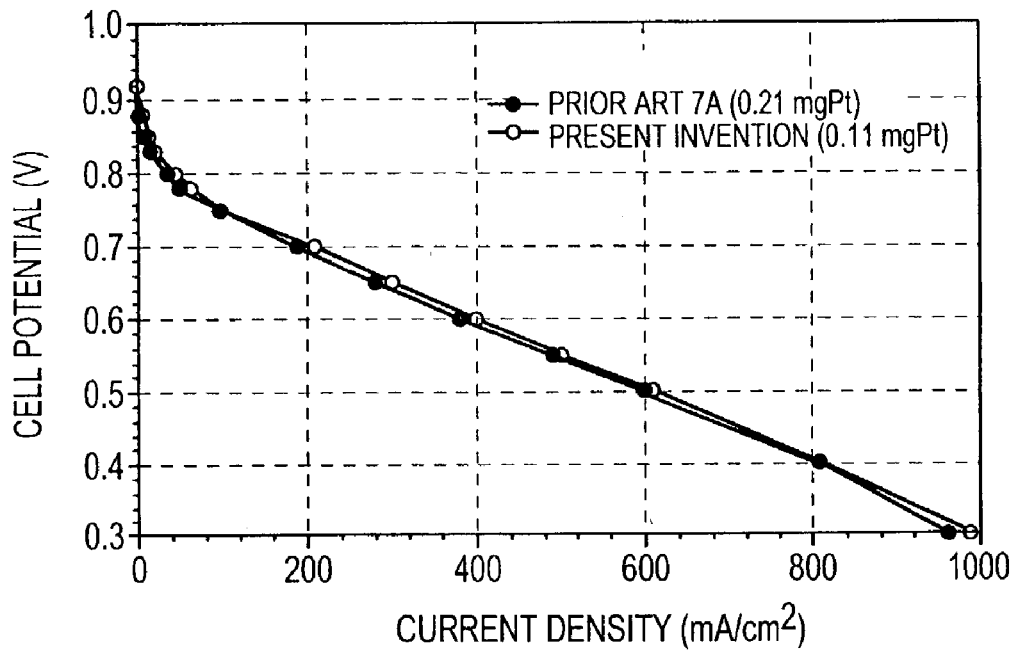
FIG. 26 illustrates a polarization curve for a membrane electrode assembly according to the present invention compared to a membrane electrode assembly utilizing a prior art electrocatalyst and having a higher loading of platinum.

FIG. 26 compares the polarization curve obtained with another prior art electrocatalyst (Sample 7A) with an electrocatalyst of the present invention having with the same wt. % Pt loading. The curves are obtained, however, with different total Pt loadings in the layer, namely 0.21 mgPt/cm$^2$ for sample 7A and 0.11 mgPt/cm$^2$ for the electrocatalyst of the present invention. Coinciding curves are observed when the Pt loading of the electrocatalyst of the present invention is about half of the amount of the commercial catalyst. This clearly indicates a significant commercial advantage of the present invention: the Pt/C catalyst meets the same performance with half of the amount of the catalyst material, thus significantly reducing the amount of Pt and its associated capital cost with no loss in performance.

Figure 27:
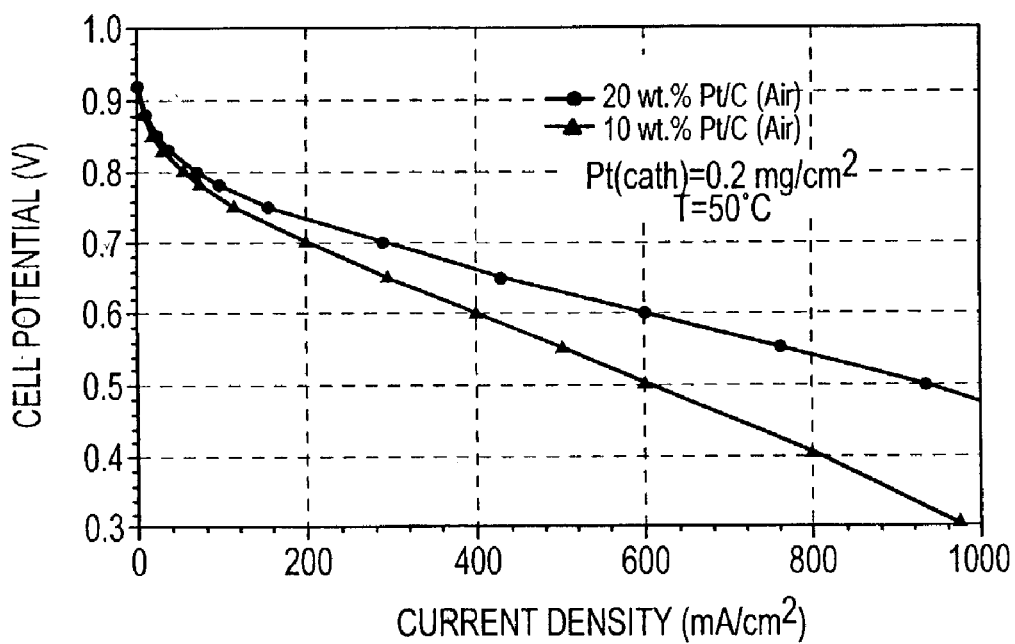
FIG. 27 illustrates polarization curves for membrane electrode assemblies according to the present invention.

FIG. 27 illustrates the performance of two examples according to the present invention with different Pt content when ambient air is used to feed the oxygen gas diffusion electrode in the cell. As expected, the electrocatalyst with the lower Pt content (10 wt. % Pt/C) provides lower current densities compared to the one with higher metal content (20 wt. % Pt/C). However, the curves were obtained with electrodes that were prepared with identical total amount of Pt. Thus, the lower Pt content electrocatalyst has been applied in an amount doubling the use of the catalyst. Reduction of the electrochemical performances however, is still to the level of those obtained with the prior art electrocatalysts. The 10 wt. % Pt/C sample curve of the present invention overlaps with the 20 wt. % Pt/C prior art samples.

Figure 28:
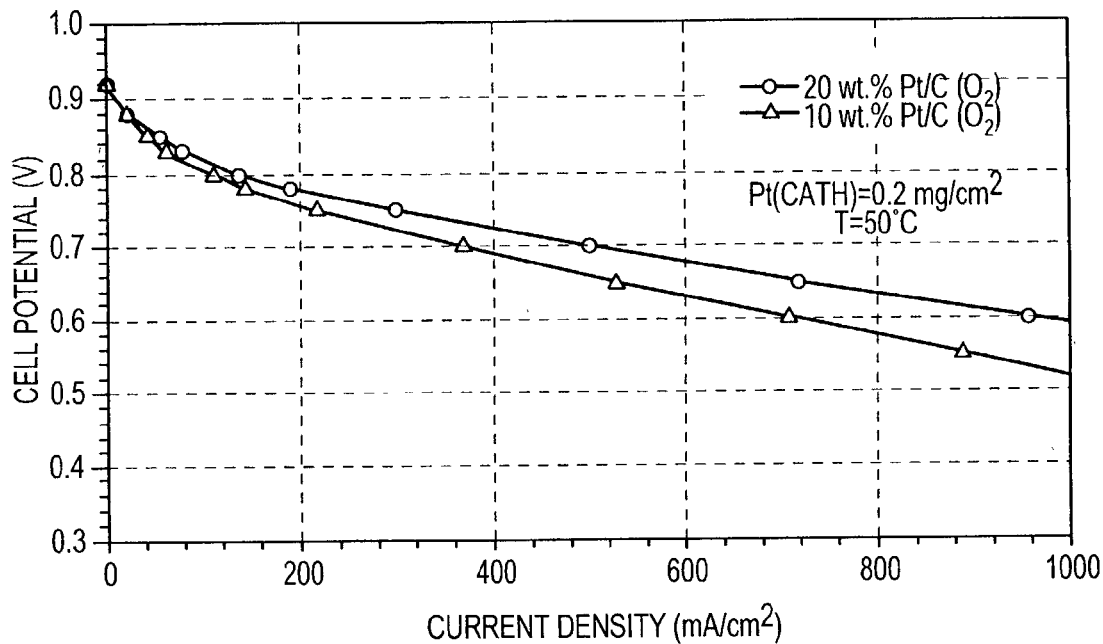
FIG. 28 illustrates polarization curves for membrane electrode assemblies according to the present invention.
Figure 29:
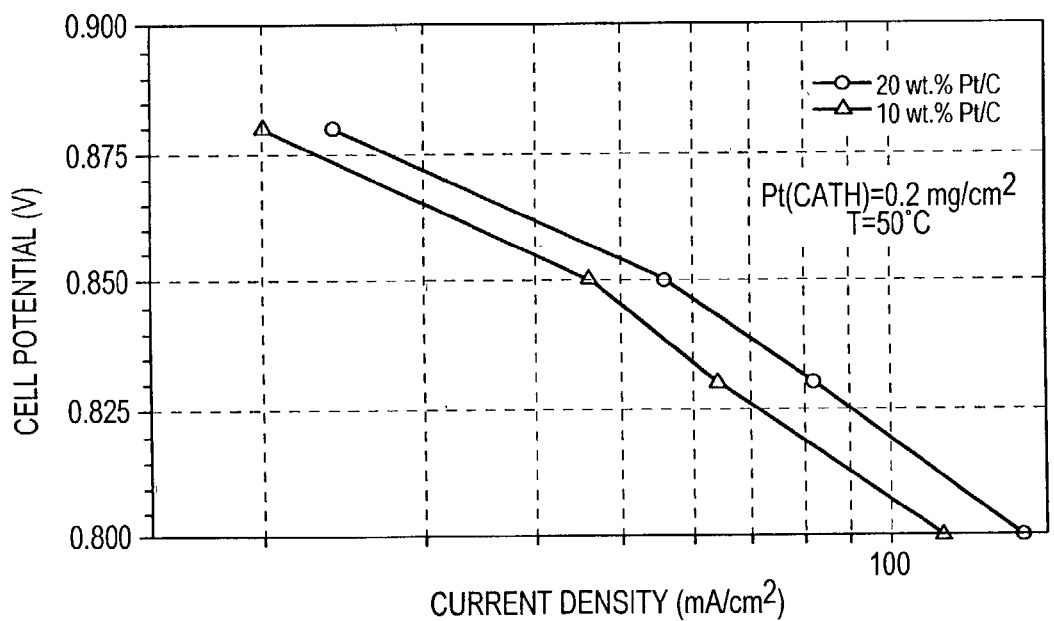
FIG. 29 illustrates a Tafel plot for the data illustrated in FIG. 28.

The curve illustrated in FIG. 28 was obtained with the same MEAs as in FIG. 27 and illustrates the performance of the electrocatalysts of the present invention with different Pt content when pure oxygen is used to feed the oxygen gas diffusion electrode in the cell. Flowing pure oxygen through the electrode largely eliminates the mass transport limitations, especially those associated with macro-diffusion processes. The curve obtained from the electrocatalysts with lower Pt content (10 wt. % Pt/C) is shifted to approximate the one obtained from the catalyst with higher metal content (20 wt. % Pt/C). Thus, FIG. 28 demonstrates that lower performance of the 10 wt. % Pt/C sample, as illustrated in FIG. 27, is associated with the thickness of the catalytic layer formed when the amount of material is doubled. This is confirmed by the Tafel plot of the data at low current densities (where the catalytic performance is not masked by the transport processes) as illustrated in FIG. 29.

The purpose of the following additional examples is to identify the optimum set of structural parameters that give the most active electrocatalyst for the oxygen reduction reaction at the air cathode of a PEMFC. The activity of the electrocatalyst is dependant on the oxidation state and dispersion of the platinum, which will be influenced by the spray conversion process conditions, carrier gas, precursor salt, and type of the carbon support.

The evaluation of Pt/C electrocatalysts was accomplished by a variety of techniques such as BET nitrogen adsorption, XRD, TEM, XPS, CO chemisorption, as well as electrochemical evaluation.

A number of electrodes were made for evaluation of the performance of 20 wt. % Pt/C electrocatalysts in an alkaline electrolyte such as 7M KOH. Examples were prepared as follows: Sample 104AO2 comprised 10 wt % Pt on SHAWINIGAN BLACK with an average Pt crystallite size of 6.3 nanometers as measured by XRD and a Pt loading of 1.43 mgPt/cm$^2$; Sample 156AO2 comprised 20 wt % Pt on SHAWINIGAN BLACK with an average Pt crystallite size of 5.2 nanometers as measured by XRD and a Pt loading of 2.66 mgPt/cm$^2$; Sample 158BO2 comprised 10 wt % Pt on VULCAN XC-72 with an average Pt crystallite size of 4.6 nanometers as measured by XRD and a Pt loading of 1.23 mgPt/cm$^2$; and Sample 142AO2 comprised 20 wt % Pt on VULCAN XC-72 with an average Pt crystallite size of 11.4 nanometers as measured by XRD and a Pt loading of 2.95 mgPt/cm$^2$.

The samples were tested in an alkaline electrolyte and a Tafel plots ware obtained and compared. Some general conclusions can be drawn from the observed data. Electrocatalysts supported on SHAWINIGAN BLACK carbon appear to have better performance than those supported on VULCAN XC-72. A smaller crystallite size performs better than a larger crystallite size. A lower Pt content electrocatalyst powder at a lower loading is as good or better than a higher Pt content electrocatalyst powder at a higher loading.

The purity of the dispersed phase on the carbon surface is also important in determining the electrocatalytic performance of powder. Typical solution precipitation processes that are used to produce precious metal-based carbon supported electrocatalysts use sulfur containing reagents or surfactants. Since sulfur is a poison to the catalytic activity of Pt, any trace amounts of residual sulfur can lead to a significant reduction in performance. The materials produced by the processes described herein do not require the use of ligands, complexing agents or surfactants that contain elements that poison the activity of the final catalyst. As a result, the processes described herein result in materials with a high purity level.

10 wt. % Pt/C and 20 wt. % Pt/C commercial catalysts were analyzed for comparison with catalysts of the present invention. The fuel cell catalysts of the present invention were prepared by one of four routes. Chronologically, they are ultrasonic transducer (single and multiple), spray dryer, ultrasonic spray nozzle and post-processing.

All samples were prepared in similar fashion regardless of the processing system used. The carbon dispersion was first diluted with water while shear mixing, and then the dissolved metal salt was slowly added. The precursor dispersion was sheared for 10 minutes following the addition of the metal salt to insure a homogeneous suspension.

Samples listed in Table 4 were prepared via ultrasonic transducers, samples listed in Table 5 were produced using an ultrasonic spray nozzle, and samples listed in Table 6 on a spray dryer.

TABLE 4

Samples Generated Using Ultrasonic Transducers

| Sample | Composition (wt. %) | Carbon Support | Pt Precursor | Furnace Temperature (° C.) | Surface Area (m$^2$/g) |
|---|---|---|---|---|---|
| PTC087049A | 60% Pt | GRAFO 1300 | Pt(NH$_3$)$_4$(NO$_3$)$_2$ | 500 | — |
| PTC087051A | 40% Pt | GRAFO 1300 | Pt(NH$_3$)$_4$(NO$_3$)$_2$ | 500 | — |
| PTC087071A | 20% Pt | GRAFO 1300 | Pt(NH$_3$)$_4$(NO$_3$)$_2$ | 500 | 90 |
| PPC097001A | 20% Pt | GRAFO 1300 | H$_2$Pt(OH)$_6$ | 450 | 80 |
| PPC056071A | 20% Pt | GRAFO 1300 | H$_2$Pt(OH)$_6$ | 350 | 62 |
| PPC056071B | 20% Pt | GRAFO 1300 | H$_2$Pt(OH)$_6$ | 250 | 42 |
| PPC056072A | 20% Pt | GRAFO 1300 | H$_2$Pt(OH)$_6$ | 300 | 44.9 |
| PPC056072B | 20% Pt | GRAFO 1300 | H$_2$Pt(OH)$_6$ | 400 | 66 |
| PPC097120A | 50% Pt | GRAFO 1300 | Pt(NH$_3$)$_4$(NO$_3$)$_2$ | 500 | — |
| PPC097120B | 60% Pt | GRAFO 1300 | Pt(NH$_3$)$_4$(NO$_3$)$_2$ | 500 | 12.9 |
| PPC093088A | 20% Pt | GRAFO 1300 | Pt(NH$_3$)$_4$(NO$_3$)$_2$ | 500 | — |
| PPC093088B | 20% Pt | GRAFO 1300 | Pt(NH$_3$)$_4$(NO$_3$)$_2$ | 550 | — |
| PPC093089A | 20% Pt | GRAFO 1300 | Pt(NH$_3$)$_4$(NO$_3$)$_2$ | 600 | — |
| PPC093090A | 20% Pt | GRAFO 1300 | Pt(NH$_3$)$_4$(NO$_3$)$_2$ | 650 | — |

TABLE 5

Electrocatalysts Produced with an Ultrasonic Spray Nozzle

| Sample | Composition (wt. %) | Carbon Support | Pt Precursor | Furnace Temperature (° C.) | Surface Area (m²/g) |
|---|---|---|---|---|---|
| PPC093101A | 20% Pt | GRAFO 1300 | $Pt(NH_3)_4(NO_3)_2$ | 550 | 52 |
| PPC093101B | 20% Pt | GRAFO 1300 | $Pt(NH_3)_4(NO_3)_2$ | 600 | — |
| PPC093101C | 20% Pt | GRAFO 1300 | $Pt(NH_3)_4(NO_3)_2$ | 625 | — |
| PPC093102A | 20% Pt | GRAFO 1300 | $Pt(NH_3)_4(NO_3)_2$ | 650 | 60 |
| PPC093102B | 20% Pt | GRAFO 1300 | $Pt(NH_3)_4(NO_3)_2$ | 700 | — |
| PPC093102C | 20% Pt | GRAFO 1300 | $Pt(NH_3)_4(NO_3)_2$ | 675 | — |
| PPC093101A | 20% Pt | GRAFO 1300 | $Pt(NH_3)_4(NO_3)_2$ | 550 | — |
| PPC093101B | 20% Pt | GRAFO 1300 | $Pt(NH_3)_4(NO_3)_2$ | 600 | — |
| PPC093101C | 20% Pt | GRAFO 1300 | $Pt(NH_3)_4(NO_3)_2$ | 625 | — |
| PPC093104A | 20% Pt, 10% susp. | GRAFO 1300 | $Pt(NH_3)_4(NO_3)_2$ | 550 | — |
| PPC093104B | 20% Pt, 10% susp. | GRAFO 1300 | $Pt(NH_3)_4(NO_3)_2$ | 600 | — |
| PPC093104C | 20% Pt, 10% susp. | GRAFO 1300 | $Pt(NH_3)_4(NO_3)_2$ | 650 | — |
| PPC093104D | 20% Pt, 10% susp. | GRAFO 1300 | $Pt(NH_3)_4(NO_3)_2$ | 700 | — |
| PPC093109A | 20% Pt | GRAFO 1300 | $Pt(NH_3)_4(NO_3)_2$ | 500 | — |
| PPC093109B | 20% Pt | GRAFO 1300 | $Pt(NH_3)_4(NO_3)_2$ | 600 | — |
| PPC056087A | 20% Pt | GRAFO 1300 | $Pt(NH_3)_4(NO_3)_2$ | 500 | 48 |
| PPC056091A | 20% Pt | GRAFO 1300 | $Pt(NH_3)_4(NO_3)_2$ | 425 | 52 |
| PPC056092A | 20% Pt | GRAFO 1300 | $Pt(NH_3)_4(NO_3)_2$ | 450 | 52 |
| PPC056093A | 20% Pt | GRAFO 1300 | $Pt(NH_3)_4(NO_3)_2$ | 475 | 49 |
| PPC056094A | 20% Pt | GRAFO 1300 | $Pt(NH_3)_4(NO_3)_2$ | 400/500/400 | — |
| PPC056095A | 20% Pt | GRAFO 1300 | $Pt(NH_3)_4(NO_3)_2$ | 400/450/500 | — |
| PPC056096A | 20% Pt | GRAFO 1300 | $Pt(NH_3)_4(NO_3)_2$ | 500 | 50 |
| PPC056097A | 60% Pt | GRAFO 1300 | $Pt(NH_3)_4(NO_3)_2$ | 500 | 31 |
| PPC056099A | 10% Pt | GRAFO 1300 | $Pt(NH_3)_4(NO_3)_2$ | 500 | — |
| PPC056100A | 20% Pt | GRAFO 1300 | $Pt(NH_3)_4(NO_3)_2$ | 500 | — |
| PPC056101A | 40% Pt | GRAFO 1300 | $Pt(NH_3)_4(NO_3)_2$ | 500 | 38 |
| PPC056102A | 60% Pt | GRAFO 1300 | $Pt(NH_3)_4(NO_3)_2$ | 500 | 30 |
| PPC056103A | 5% Pt | GRAFO 1300 | $Pt(NH_3)_4(NO_3)_2$ | 500 | 56 |
| PPC056104A | 10% Pt | GRAFO 1300 | $Pt(NH_3)_4(NO_3)_2$ | 500 | 52 |
| PPC056105A | 20% Pt | GRAFO 1300 | $Pt(NH_3)_4(NO_3)_2$ | 500 | 49 |
| PPC056106A | 30% Pt | GRAFO 1300 | $Pt(NH_3)_4(NO_3)_2$ | 500 | 44 |
| PPC056111A | 20% Pt | GRAFO 1300 | $Pt(NH_3)_4(NO_3)_2$ | 400 | 45 |
| PPC056112A | 20% Pt | GRAFO 1300 | $Pt(NH_3)_4(NO_3)_2$ | 425 | 44 |
| PPC056113A | 20% Pt | GRAFO 1300 | $Pt(NH_3)_4(NO_3)_2$ | 450 | 48 |
| PPC056114A | 20% Pt | GRAFO 1300 | $Pt(NH_3)_4(NO_3)_2$ | 475 | 47 |
| PPC056115A | 20% Pt | GRAFO 1300 | $Pt(NH_3)_4(NO_3)_2$ | 350 | — |
| PPC056126A | 20% Pt | GRAFO 1322 | $Pt(NH_3)_4(NO_3)_2$ | 500 | — |
| PPC056140A | 20% Pt | GRAFO 1300 | $H_2PtCl_6$ | 500 | — |
| PPC056141A | 20% Pt | GRAFO 1300 | $H_2PtCl_6$ | 500 | 47 |
| PPC056142A | 20% Pt | GRAFO 1300 | $H_2PtCl_6$ | 350 | 47 |
| PPC056143A | 20% Pt | GRAFO 1322 | $H_2PtCl_6$ | 500 | 35 |
| PPC056146A | 20% Pt | GRAFO 1322 | $Pt(NH_3)_4(NO_3)_2$ | 300 | — |
| PPC056153A | 20% Pt | GRAFO 1300 | $Pt(NH_3)_4(NO_3)_2$ | 500 | 52 |
| PPC056154A | 20% Pt | GRAFO 1300 | $Pt(NH_3)_4(NO_3)_2$ | 500 | 48 |
| PPC056155A | 20% Pt | GRAFO 1300 | $Pt(NH_3)_4(NO_3)_2$ | 500 | 52 |
| PPC056156A | 20% Pt | GRAFO 1300 | $Pt(NH_3)_4(NO_3)_2$ | 500 | 53 |

TABLE 6

Catalysts Produced on a Spray Dryer

| Sample | Composition (wt. %) | Carbon Suppport | Pt Precursor | Inlet/Outlet Temperature (° C.) | Surface Area (m²/g) |
|---|---|---|---|---|---|
| PPC097108C | 20% Pt | GRAFO 1300 | $Pt(NH_3)_4(NO_3)_2$ | 315 | — |
| PPC056138A | 20% Pt | GRAFO 1300 | $Pt(NH_3)_4(NO_3)_2$ | 341 | — |
| PPC056138B | 20% Pt | GRAFO 1322 | $Pt(NH_3)_4(NO_3)_2$ | 337 | 32 |
| PPC056138C | 20% Pt | GRAFO 1322 | $Pt(NH_3)_4(NO_3)_2$ | 289 | 26 |
| PPC056139A | 20% Pt | GRAFO 1300 | $Pt(NH_3)_4(NO_3)_2$ | 281 | 18 |
| PPC056157A | 20% Pt | GRAFO 1322 | $Pt(NH_3)_4(NO_3)_2$ | 482/244 | 70 |
| PPC056157B | 20% Pt | GRAFO 1322 | $Pt(NH_3)_4(NO_3)_2$ | 427/227 | — |
| PPC056157C | 20% Pt | GRAFO 1300 | $Pt(NH_3)_4(NO_3)_2$ | 482/249 | 38 |
| PPC056157D | 20% Pt | GRAFO 1300 | $Pt(NH_3)_4(NO_3)_2$ | 427/227 | — |
| PPC056158A | 5% Pt | GRAFO 1322 | $Pt(NH_3)_4(NO_3)_2$ | 518/274 | 125 |
| PPC056158B | 10% Pt | GRAFO 1322 | $Pt(NH_3)_4(NO_3)_2$ | 517/265 | 108 |

TABLE 6-continued

Catalysts Produced on a Spray Dryer

| Sample | Composition (wt. %) | Carbon Suppport | Pt Precursor | Inlet/Outlet Temperature (° C.) | Surface Area (m²/g) |
|---|---|---|---|---|---|
| PPC056158C | 40% Pt | GRAFO 1322 | Pt(NH$_3$)$_4$(NO$_3$)$_2$ | 521/279 | 64 |
| PPC056159A | 5% Pt | GRAFO 1300 | Pt(NH$_3$)$_4$(NO$_3$)$_2$ | 513/274 | 66 |
| PPC056159B | 10% Pt | GRAFO 1300 | Pt(NH$_3$)$_4$(NO$_3$)$_2$ | 515/274 | 53 |
| PPC056159C | 40% Pt | GRAFO 1300 | Pt(NH$_3$)$_4$(NO$_3$)$_2$ | 514/282 | 40 |
| PPC056163C | 20% Pt | GRAFO 1300 | Pt(NH$_3$)$_4$(NO$_3$)$_2$ | 526/282 | 46 |
| PPC056164A | 20% Pt, 10% solids | GRAFO 1300 | Pt(NH$_3$)$_4$(NO$_3$)$_2$ | 524/287 | 48 |
| PPC056164C | 20% Pt | GRAFO 1322 | Pt(NH$_3$)$_4$(NO$_3$)$_2$ | 524/287 | 104 |
| PPC056165A | 20% Pt, 10% solids | GRAFO 1322 | Pt(NH$_3$)$_4$(NO$_3$)$_2$ | 524/282 | 104 |
| PPC056166C | 20% Pt | GRAFO 1322 | H$_2$PtCl$_6$ | 523/284 | 93 |
| PPC056167A | 20% Pt | GRAFO 1300 | H$_2$PtCl$_6$ | 523/283 | 46 |
| PPC056168A | 20% Pt | GRAFO 1322 | Pt(NH$_3$)$_4$(NO$_3$)$_2$ | 523/280 | 100 |

Unless otherwise stated the solids loading in the suspension was 5 wt. %.

Figure 30:
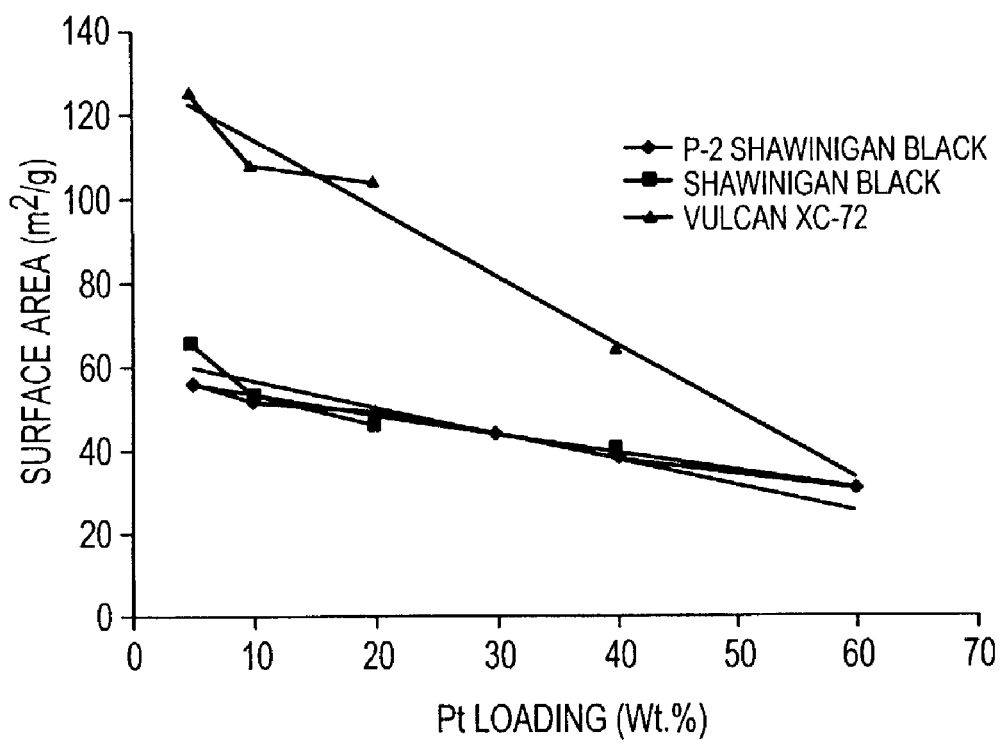
FIG. 30 illustrates BET surface area as a function of platinum loading for 20 wt. % Pt/C electrocatalyst particles according to the present invention.

FIG. 30 illustrates the inverse relationship between the platinum loading and BET surface area for 20 wt. % Pt/C electrocatalysts processed at identical spray conversion conditions. Since the surface area is normalized per gram of catalyst and the loading of the Pt increases (the density of Pt is significantly higher compared to that of the carbon support) this result is expected. It is important to note, however, that the changes in the surface area of the catalysts generated by ultrasonic spray nozzle and in the spray dryer are almost identical if the same carbon support is used. For a higher surface area support such as VULCAN XC-72, the effect is even more strongly expressed due to the lower density of the carbon support.

Figure 31:
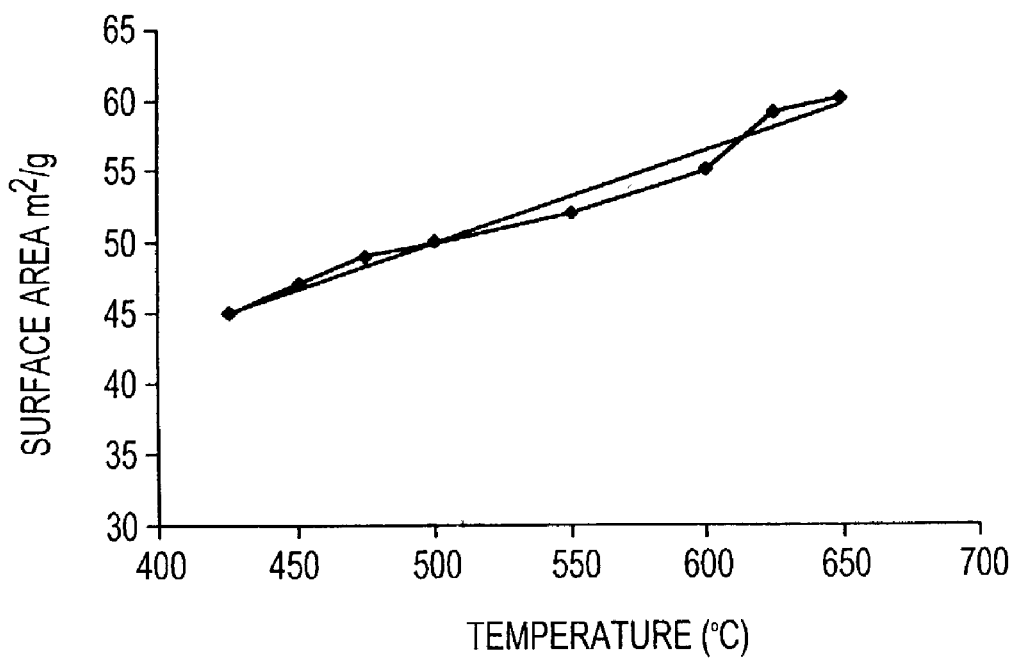
FIG. 31 illustrates BET surface area as a function of temperature for 20 wt. % Pt/C electrocatalyst according to the present invention.

FIG. 31 illustrates that the surface area of the powder increases as the spray conversion temperature is increased. Although this may suggest using the highest temperature possible, the loss of highly disperse Pt active species due to agglomeration also results from higher processing temperatures and therefore the increased BET area is not beneficial.

It is generally accepted that increased dispersion of the Pt metal clusters on the carbon support will result in increased catalytic activity. The degree of metal dispersion on the surface is influenced by the metal salt used, the metal loading (weight percent of metal), and the surface area of the carbon support. It stands to reason that increasing the amount of metal on the carbon surface will result in larger metal crystallites, thus a lower dispersion and reduced metal surface area that is exposed. The carbon that is used will also influence the optimal spray process temperature. It is believed that when a carbon with a higher surface area is used for the support phase, it results in a lower required decomposition temperature. An example is illustrated by comparing the processing of SHAWINIGAN BLACK and VULCAN XC-72. When 20 wt. % Pt/C was run on both SHAWINIGAN BLACK and VULCAN XC-72 supports at 210° C., increased conversion was seen for the higher-surface area VULCAN XC-72 than for the lower-surface area SHAWINIGAN BLACK. This may suggest the ability to further lower the spray processing temperature by using a carbon with an even higher surface area, such as about 800 m²/g. It may also be advantageous to use a mixture of carbon supports having different surface areas. This may be catalytically advantageous, for if on the higher surface area carbon the Pt precursor converts at a lower temperature, it may act as a catalyst for the conversion of the Pt precursor on the lower-surface area carbon.

Powder x-ray diffraction (XRD) spectroscopy was used as a rapid pre-screening method to monitor the conversion of the precursor salts to their active metal states. The manufacturing processes were optimized using the XRD as immediate feedback for process condition refinements. XRD is much less labor-intensive than electrochemical testing and TEM, thus once the powders were determined via XRD to be have potential as catalysts, they were subjected to electrochemical testing. This allowed for rapid optimization of processing conditions.

The presence of the platinum peaks indicated by XRD in sample PPC056156A indicated the platinum precursor is converted to crystalline platinum metal.

Figure 32:
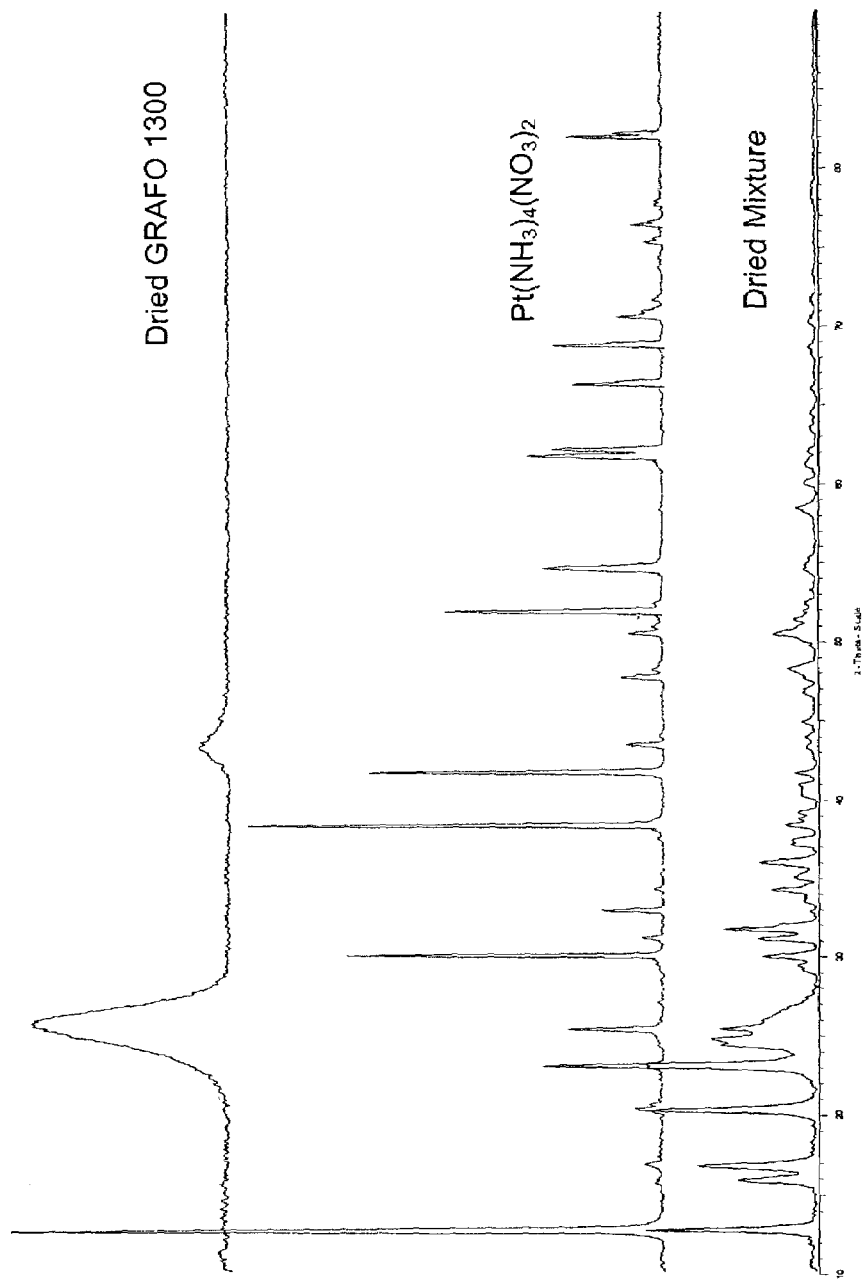
FIG. 32 illustrates X-ray diffraction patterns for precursor and converted precursors according to the present invention.

XRD patterns of GRAFO 1300, platinum precursor Pt(NH$_3$)$_4$(NO$_3$)$_2$, and a mixture of GRAFO 1300 and Pt(NH$_3$)$_4$(NO$_3$)$_2$ dried at room temperature were also obtained, as is illustrated in FIG. 32. This series shows that when mixed, the diffraction patterns of the starting materials (GRAFO 1300 and Pt(NH$_3$)$_4$(NO$_3$)$_2$) are not merely additive. The interaction between the two compounds gives rise to a completely new diffraction pattern for the dried precursor dispersion. The diffraction pattern that is seen for the precursor dispersion dried at room temperature is identical to that of catalyst powder that has been processed at elevated temperature, but not high enough to convert the platinum precursor. The platinum in sample PPC056093A has not been converted to platinum metal, as the characteristic platinum peaks are absent.

The X-ray diffraction patterns were also used to estimate the average size of the platinum crystallites in the powder samples via the Scherrer and Warren equations. The size of the crystallites is inversely proportional to the dispersion of the platinum on the carbon support. Generally, a highly dispersed metal should result in higher catalytic activity. Therefore, the platinum crystallite size was used as an estimate for the dispersion of platinum on the carbon support. Care must be taken when interpreting these results. For catalysts that have a sharp XRD peak, indicating large crystallites, further inspection with TEM revealed there were also many finely dispersed crystallites. The more intense signal of the larger crystallites masked the weaker broad signal from the finely dispersed crystallites that were also present. Therefore, it should be considered that Pt average crystallite size based on XRD measurements is an overestimate of the real Pt cluster size.

Figure 33:
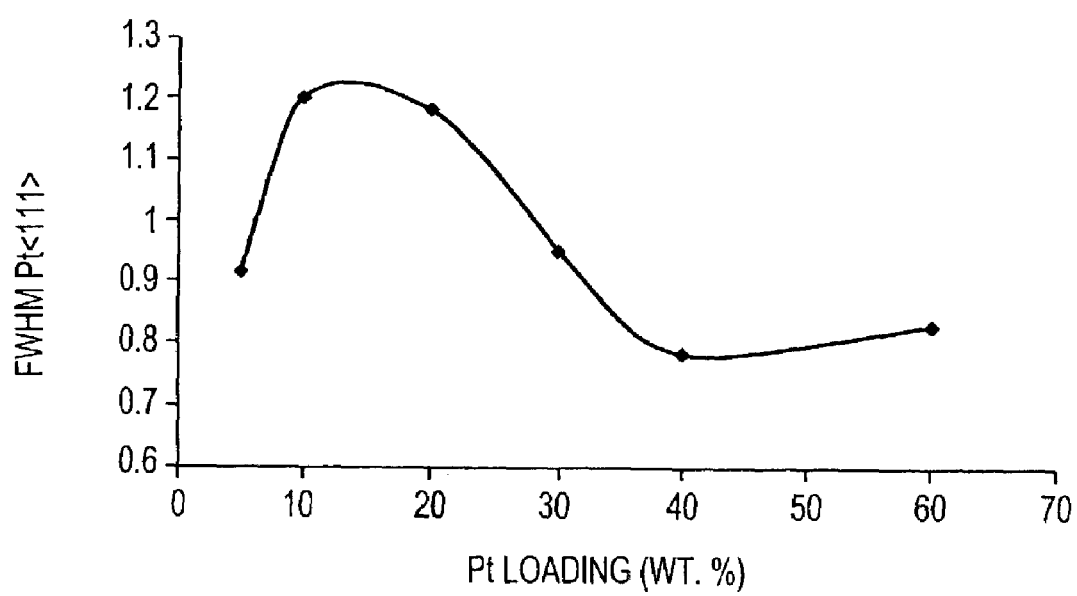
FIG. 33 illustrates the full-width half-maximum of the Pt<111> X-ray diffraction peak as a function of platinum loading on a carbon support according to the present invention.
Figure 34:
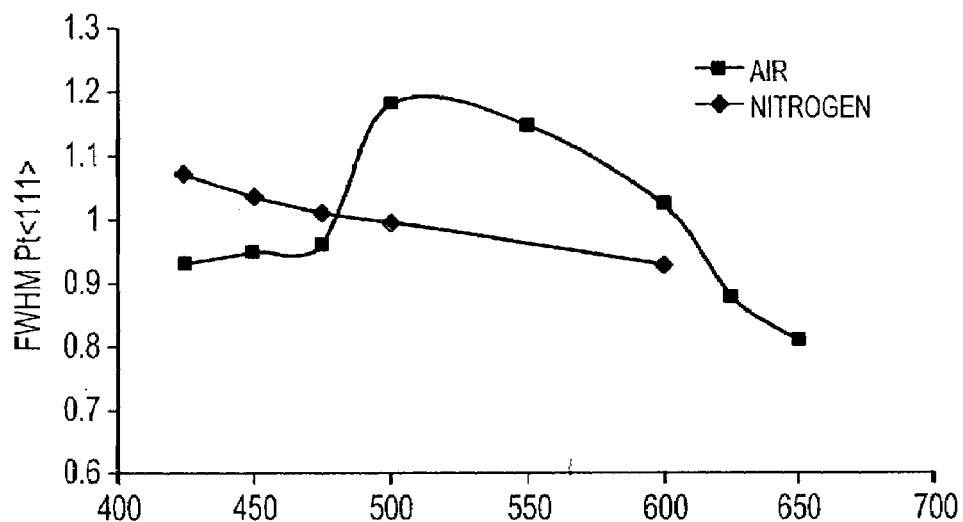
FIG. 34 illustrates the full-width half-maximum of the Pt<111> X-ray diffraction peak as a function of conversion temperature for 20 wt. % Pt/C electrocatalyst according to the present invention.

FIG. 33 illustrates the dependency of peak broadening with respect to platinum loading on SHAWINIGAN BLACK carbon processed at identical spray conditions. The plot depicts a maximum broadening at 10 to 20 wt. % Pt, indicating optimal crystallite size. This result does not imply that other optimal processing conditions can not be found for an improved Pt dispersion at lower than 10 wt. % Pt electrocatalysts. In FIG. 34, the full-width at half-maximum X-ray diffraction peak of Pt<111> FWHM was plotted against furnace temperature for 20 wt. % Pt/C (SHAWINIGAN BLACK) catalysts made using air vs. nitrogen. The FWHM parameter was used to estimate the dispersion of the Pt crystallites—the higher the FWHM the higher the dispersion of Pt species on the carbon support surface. For temperatures in the region of 500° C. to 600° C., the use of air as both carrier and quench gases resulted in larger FWHM values than those for nitrogen, therefore a better Pt dispersion was achieved using air as a carrier and quench gas.

Figure 35:
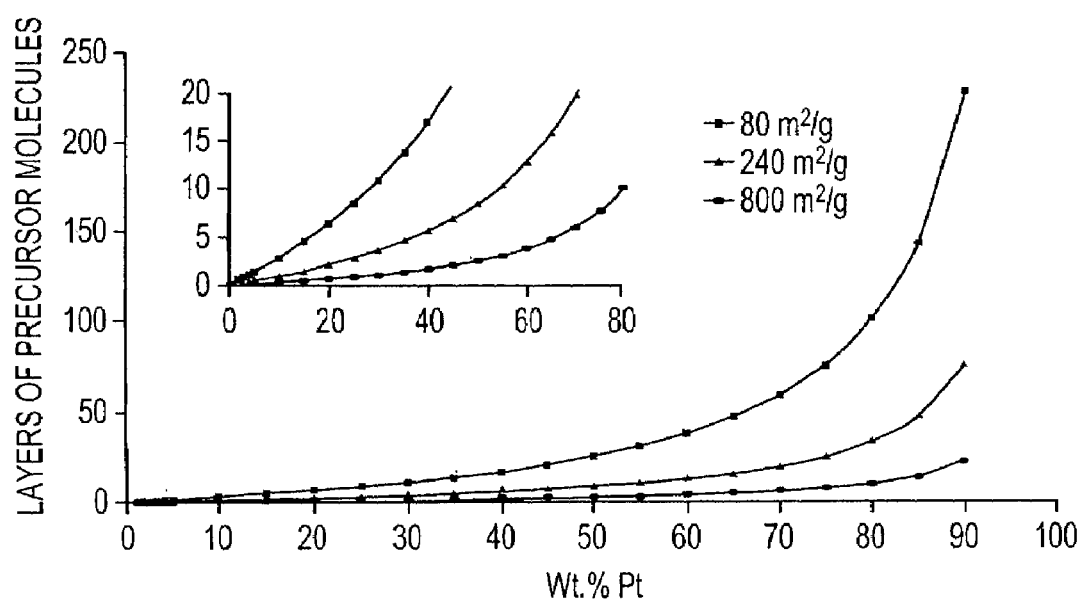
FIG. 35 illustrates the relationship between the coverage of the Pt precursor versus the wt. % Pt after conversion and the support surface area for electrocatalysts according to the present invention.

An illustration of the relationship between the amount of precursor and support surface area is shown in FIG. 35. For this model, the area of $Pt(NH_3)_4(NO_3)_2$ was compared to the surface area of a given carbon support. The calculation was carried out based on the weight percent of platinum deposited from this precursor against three carbon supports of increasing surface area. The surface areas of the carbon supports used were 80, 240, and 800 $m^2/g$, and the area of one $Pt(NH_3)_4(NO_3)_2$ molecule was estimated to be 2.25 $nm^2$. If the total area covered by the $Pt(NH_3)_4(NO_3)_2$ (in quantity necessary to achieve certain wt. % Pt after decomposition of the precursor) is equal to that of the carbon, it should result in a monolayer of precursor molecules on the carbon surface. This will not result in a platinum monolayer, as the Pt precursor ligands are responsible for a significant portion of the precursor molecule's area. Therefore, individual Pt atoms or small clusters of platinum atoms that are well spaced should form. Additional $Pt(NH_3)_4(NO_3)_2$ molecules result in multiple layers, which increases the probability of larger agglomerates of metal. Following this thought, if the metal loading is high enough for a low surface area carbon, the entire carbon surface could become coated with large Pt crystallites, resulting in a catalyst with lower activity than that of one with small Pt crystallites, as the metal surface area will be lower.

The inset in FIG. 35 shows that for 20 wt. % Pt, the number of layers increases from 0.64 to 2.12 to 6.36 as the carbon surface area decreases from 800 to 240 to 80 $m^2/g$. This suggests that not all platinum loadings are optimal for a given carbon surface area. Further, each carbon may have an ideal window of metal loadings, allowing tailoring of the Pt/C catalyst to loading requirements. This point becomes more pronounced as the metal loading is increased. Although it is impossible to predict at what point the metal loading becomes so large that the entire particle is covered, to avoid this possibility the carbon should be chosen so the number of layers is minimized, combined with experimental results.

The temperature limits of conventional spray dryers resulted in a need for an alternate route for converting the platinum precursor. After drying the powder at processing temperatures below that required for platinum reduction, the powders were subjected to an additional treatment step. The samples were placed in a pre-heated furnace for 5 or 10 minutes with varying atmospheric compositions. The atmosphere in the furnace was either air, hydrogen, nitrogen, or ratios of the latter two. Table 7 summarizes the results of the post-processing experiments.

Initial experiments in air showed that there exists a small window where the balance between temperature and time is critical. If the catalyst was exposed to too high of a temperature or too low of a temperature for too long, the platinum agglomerated to a significant extent. This agglomeration was exaggerated in the presence of hydrogen. Comparison of samples PPC113121A and PPC11386B shows the reducing power of hydrogen. Sample PPC113086B was post-treated at 250° C. and did not convert in air, but when the same powder was run as PPC113121A in hydrogen at 150° C., not only did the platinum convert, but the crystallite size was the largest observed. This was due in part to the presence of a mobile platinum species formed at elevated temperatures in the presence of hydrogen. This migratory species made narrowing-down post-treatment conditions difficult. At the time of the discovery of this species in the literature, the post-treatment was abandoned once it was realized the spray dryer, in conjunction with reducing agents, would solve the platinum conversion problems.

The estimation of the Pt crystallite size listed in Table 7 was based on the XRD data, more specifically the FWHM of the Pt<111>XRD peak and calculations of the crystallite size based on comparison with a standard.

TABLE 7

Post-Processing Treatment Conditions

| Sample | Temperature | Conversion | Crystallite Size (Å) | Atmosphere |
| --- | --- | --- | --- | --- |
| PPC113086A | 300 | yes | 134 | Air |
| PPC113086B | 250 | no | — | Air |
| PPC113086C | 275 | yes | 136 | Air |
| PPC113087A | 250 | yes | 79 | Air |
| PPC113087B | 275 | yes | 87 | Air |
| PPC113087C | 300 | — | — | Air |
| PPC113088A | 250 | no | — | Air |
| PPC113088B | 275 | yes | 77 | Air |
| PPC113088C | 300 | yes | 113 | Air |
| PPC113089A | 300 | yes | 165 | Air |
| PPC113090A | 250 | no | — | Air |
| PPC113090B | 250 | yes | 71 | Air |
| PPC113090C | 250 | yes | 85 | Air |
| PPC113092A | 250 | no | — | Air |
| PPC113092B | 275 | yes | 121 | Air |
| PPC113092C | 300 | yes | 124 | Air |
| PPC113093A | 250 | no | — | Forming Gas |
| PPC113093B | 250 | partial | — | Forming Gas |
| PPC113093C | 250 | yes | 181 | Forming Gas |
| PPC113094A | 200 | no | — | Forming Gas |
| PPC113094B | 225 | partial | — | Forming Gas |
| PPC113100A | 250 | burned | — | Air |
| PPC113100B | 250 | no | — | Air |
| PPC113100C | 275 | partial | — | Air |
| PPC113114A | 250 | yes | 282 | $H_2$ |
| PPC113117A | 100 | no | — | Air |
| PPC113117B | 200 | yes | 197 | $H_2/N_2$ |
| PPC113121A | 150 | yes | 212 | $H_2/N_2$ |
| PPC113121B | 25 | no | — | $H_2/N_2$ |
| PPC113133A | 150 | no | 45 | Air |
| PPC113133B | 200 | yes | 83 | Air |
| PPC113135A | 200 | mostly | 74 | Air |
| PPC113135B | 250 | no | 48 | Air |
| PPC113135C | 250 | yes | 83 | Air |
| PPC113135D | 275 | partial | 60 | Air |

Prior art methods of platinum catalyst preparation employ a platinum chloride precursor due to its low cost. The majority of platinum catalysts fabricated in accordance with the present invention have used $Pt(NH_3)_4(NO_3)_2$ (platinum amine) to avoid possible system corrosion common to chloride use. The chlorides are also acidic when in solution, coagulating the binders in the carbon dispersions. Coagulation of the binders results in an unstable dispersion, and settling occurs within an hour. For this reason, the amine has been the precursor salt most commonly used. However, using the chloride precursor, the conversion temperature is lowered from about 400° C. to less than 350° C. This became a key point once a spray dryer was enlisted to attempt platinum catalyst production.

An alternative to post-processing is the use of reduction agents. If conventional spray dryers are unable to reach the temperatures required for the reduction of platinum or more complex alloy compositions, then additives can be used to allow for the reduction to occur at lower temperatures. This method keeps the drying/calcinations to one step, eliminating some of the problems associated with post-processing. Table 8 lists the experimental conditions and reduction agents used in the generation of platinum electrocatalysts.

solution was diluted as necessary to keep the concentration within the linear range of the instrument.

TABLE 9

Summary of Atomic Absorption Results

| Sample | Wt. % Pt Calculated | Method 1 | Method 2 | Mass remaining after TGA |
|---|---|---|---|---|
| PPC056103A | 5 | 5.7 | — | — |
| PPC056104A | 10 | 6.0 | 9.0 | 27.0 (C left on filter) |
| PPC056105A | 20 | 13.9 | 16.4 | 36.8 (C left on filter) |
| PPC056096A | 20 | 13.8* | 18.8 | 32.4 (C left on filter) |
| PPC056106A | 30 | 21.5 | 25.1 | 25.8 (no C left on filter) |
| PPC056106A | 40 | 33.8 | — | — |
| PPC056102A | 60 | 74.3 | — | 53.6 (C left on filter) |
| PPC056156A | 20 | — | 16.8 | 44.0 (C left on filter) |
| PPC056158A | 5 | — | 7.2 | 7.2 (no C left on filter) |

TABLE 8

Experimental Conditions Exploring Reduction Agents

| Sample | Composition (wt. %) | Carbon Support | Precursor | Temp. (° C.) | Conversion |
|---|---|---|---|---|---|
| PPC097109B | 20% Pt, 1 eq HCOOH | GRAFO 1300 | Amine | 315 | no |
| PPC097109A | 20% Pt, 1 eq HCOOH | GRAFO 1300 | Amine | 205 | no |
| PPC097110A | 20% Pt, 4 eq HCOOH | GRAFO 1300 | Amine | 315 | no |
| PPC097109C | 20% Pt, 4 eq HCOOH | GRAFO 1300 | Amine | 205 | no |
| PPC113013B | 20% Pt, KBH4 | GRAFO 1300 | Chloride | 315 | — |
| PPC113013C | 20% Pt, Urea | GRAFO 1300 | Chloride | 205 | — |
| PPC056098A | 20% Pt, KBH4 | GRAFO 1300 | Amine | 200 | — |
| PPC056116A | 20% Pt, 10% EtOH | GRAFO 1300 | amine | 350 | mostly |
| PPC056117A | 20% Pt, excess NaOOCH | GRAFO 1300 | amine | 350 | mostly |
| PPC056118A | 20% Pt, 10% EtOH | GRAFO 1300 | amine | 400 | small peaks |
| PPC056119A | 20% Pt, 10% MeOH | GRAFO 1300 | amine | 350 | mostly |
| PPC056120A | 20% Pt, 10% HCOOH | GRAFO 1300 | amine | 350 | mostly |
| PPC056121A | 20% Pt, 10% MeOH | GRAFO 1300 | amine | 300 | partial |
| PPC056122A | 20% Pt, 10% MeOH, 10% HCOOH | GRAFO 1300 | amine | 300 | partial |
| PPC056141A | 20% Pt, 10% EtOH | GRAFO 1300 | Chloride | 500 | conv. |
| PPC056144A | 20% Pt, 10% EtOH | GRAFO 1322 | Chloride | 225 | small peaks |
| PPC056145A | 20% Pt, 10% EtOH | GRAFO 1300 | Chloride | 225 | mostly |
| PPC056147A | 20% Pt, Ethylene Glycol | GRAFO 1322 | amine | 300 | partial |
| PPC056148A | 20% Pt, Ethylene Glycol, PVP (10k) | GRAFO 1322 | amine | 300 | partial |
| PPC056149A | 20% Pt, Ethylene Glycol | GRAFO 1300 | amine | 300 | partial |
| PPC056150A | 20% Pt, Ethylene Glycol, PVP (10k) | GRAFO 1300 | amine | 300 | partial |
| PPC056151A | 20% Pt, Ethylene Glycol | GRAFO 1300 | Chloride | 300 | — |
| PPC056152A | 20% Pt, Ethylene Glycol, PVP (10k) | GRAFO 1300 | Chloride | 300 | conv. |
| PPC056164B | 20% Pt, 10% EtOH | GRAFO 1300 | amine | 521/289 | — |

The data in Table 8 suggest an alcohol, such as ethanol or methanol, reduces the conversion temperature of platinum by about 150° C., while retaining well-dispersed crystallites.

Thermal gravimetric analysis (TGA) was performed for total metals determination, sample preparation for atomic absorption (AA) measurements, and moisture content. During a TGA run, the carbon is burned off leaving only the metal, making an ideal starting point for AA analysis. The amount of water in the catalyst is determined from the mass loss at around 100° C. This is especially important in analyzing catalysts converted at low temperature.

Atomic absorption spectroscopy was used to quantify the amount of metal in the catalysts on a Perkin-Elmer AAnalyst 300. The catalyst was first heated with the TGA to remove the carbon support. The metal nugget remaining was then dissolved with aqua regia (3:1 HCl:HNO$_3$). The resulting As seen in Table 9, there was carbon contamination of the sample after it was heated to 1300° C. This did not seem reasonable, as carbon should be burned off at 500° C. It was determined that the available oxygen in the sample chamber was consumed by about 5 mg of sample, leaving the remaining sample oxygen-starved and unable to burn. Therefore, further TGA measurements were done with 5 mg sample and the TGA data were used for rapid evaluation of the Pt content in carbon supported catalysts.

Figure 36:
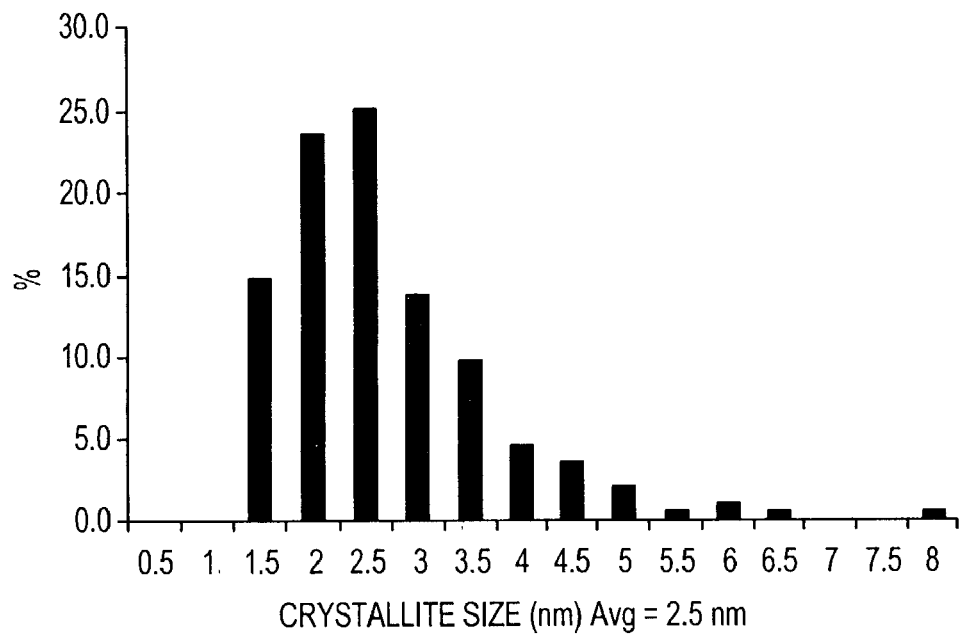
FIG. 36 illustrates the distribution and average crystallite size for 10 wt. % Pt/VULCAN XC-72 prior art electrocatalyst as determined by TEM.

Transmission electron microscopy (TEM) was used to measure the size of the platinum crystallites and visually inspect their dispersion. Up to 250 Pt crystallites were measured and counted to produce the distributions in FIGS. 36, 37 and 38. This approach is a rough estimate of crystallite size, as the assumption is that the crystallites at the edges of the aggregates that can be seen are representative for the entire aggregate structure. Further, it is difficult to include very large particles, as the difference between what is a large particle and overlap is not always apparent. FIG. 35 shows the Pt cluster size distribution for a 10 wt. % Pt/C (VULCAN XC-72) prior art catalyst. If compared to the distribution presented on FIG. 36 for 10 wt. % Pt/C (VULCAN XC-72) made according to the present invention it is obvious that the latter results in a smaller average Pt cluster size (1.8 nm vs. 2.5 nm) on otherwise identical carbon support.

Figure 37:
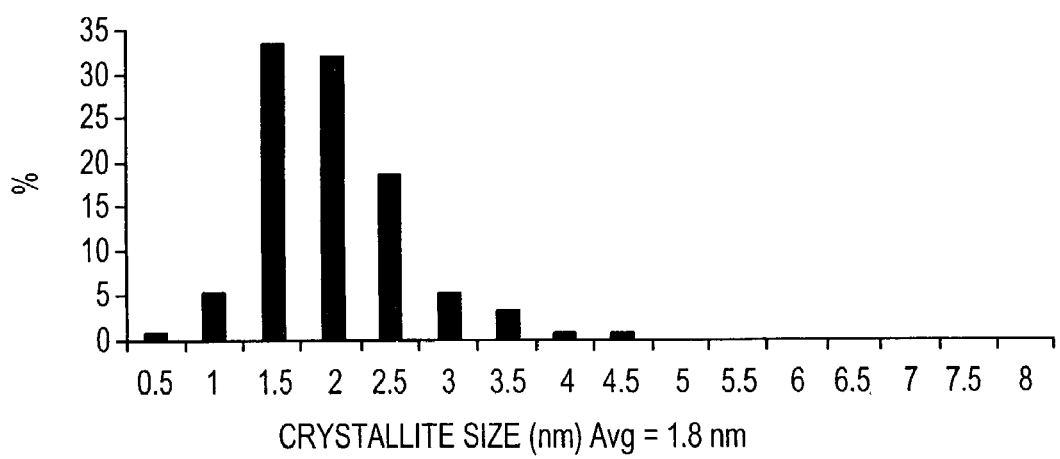
FIG. 37 illustrates the distribution and average crystallite size for 10 wt. % Pt/VULCAN XC-72 electrocatalyst as determined by TEM according to the present invention.
Figure 38:
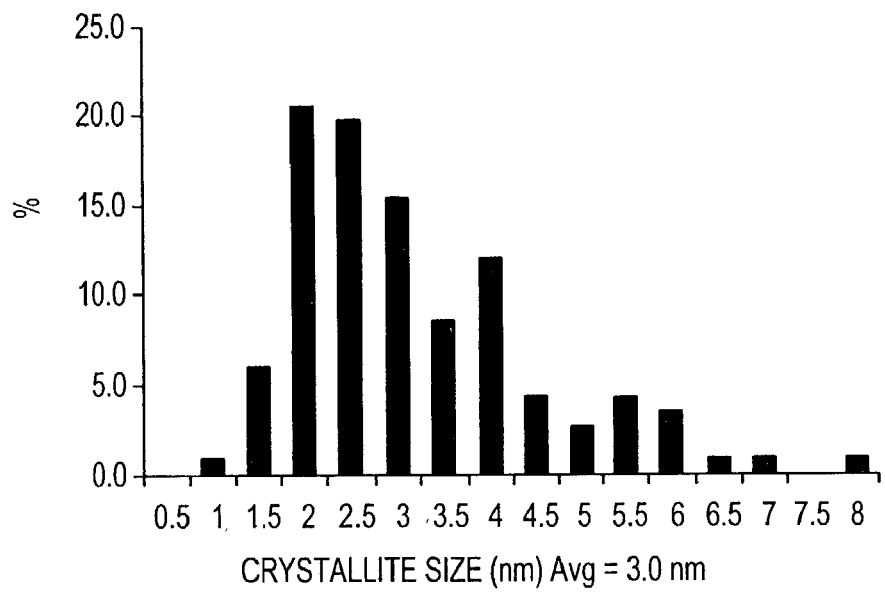
FIG. 38 illustrates the distribution and average crystallite size for 10 wt. % Pt/SHAWINIGAN BLACK electrocatalyst as determined by TEM according to the present invention.

The Pt cluster size distributions on FIG. 37 and FIG. 38 illustrate the dependence of the dispersion of the platinum on the type of carbon support. As previously mentioned, it is anticipated that a carbon support of higher surface area should yield a catalyst with greater dispersion for a given platinum loading. This is readily seen in FIGS. 37 and 38. The surface area of VULCAN XC-72 is 240 m$^2$/g, while SHAWINIGAN BLACK is 80 m$^2$/g. Sample PPC056159B is 10 wt. % Pt on SHAWINIGAN BLACK (FIG. 38), while PPC056158B is 10 wt. % Pt on VULCAN XC-72 (FIG. 37). The distribution for PPC056158B (average crystallite size 1.8 nm) is significantly narrower than that of PPC056159B (average crystallite size 3.0 nm). This 60% difference in the average Pt cluster size supports the claim that no identical metal loadings will be optimal for every carbon support.

Hydrogen-air cells were made using a NAFION 112 membrane with a working area of 50 cm$^2$ and 0.2 mg/cm$^2$ platinum loading on the cathode side of the membrane and tested at 50° C., at atmospheric pressure and with 100% humidified gases at constant flows corresponding to 1.2 hydrogen and 2.4 air stoichiometry at 1000 mA/cm$^2$ current density.

The overall performance of the MEA is given in Table 10, which is the current density at a cell potential of 0.7 V. The results in Table 10 support the argument for the benefits of maximizing the platinum dispersion. The electrochemical performance of catalysts formulated with platinum chloride is considerably lower than that of those with platinum amine. The Pt crystallite size estimated via XRD is about four times lower for the amine-based catalyst than for that of the chloride. These results suggest a better dispersion is required if platinum chloride is to be used as a precursor.

TABLE 10

Electrochemical Evaluation of Pt/C Electrocatalysts in PEMFC

| Sample | Composition (wt %) | Carbon Support | Precursor | Process Process Temp. (° C.) | EC Activity, (mA/cm$^2$) |
|---|---|---|---|---|---|
| PPC093109A | 20% Pt | GRAFO 1300 | Amine | 500 | 110, 38 alk |
| PPC093109B | 20% Pt | GRAFO 1300 | Amine | 600 | 35 alk 0.6 V |
| PPC056087A | 20% Pt | GRAFO 1300 | Amine | 500 | 210 |
| PPC056093A | 20% Pt | GRAFO 1300 | Amine | 475 | not active |
| PPC056096A | 20% Pt | GRAFO 1300 | Amine | 500 | 190 |
| PPC056101A | 40% Pt | GRAFO 1300 | Amine | 500 | 280 |
| PPC056104A | 10% Pt | GRAFO 1300 | amine | 500 | 120 |
| PPC056105A | 20% Pt | GRAFO 1300 | amine | 500 | 230 |
| PPC056106A | 30% Pt | GRAFO 1300 | amine | 500 | 120 |
| PPC056142A | 20% Pt | GRAFO 1300 | Chloride | 350 | 10 |
| PPC056143A | 20% Pt | GRAFO 1322 | Chloride | 500 | 180/190 |
| PPC056144A | 20% Pt, 10% EtOH | GRAFO 1322 | Chloride | 225 | 75 |
| PPC056156A | 20% Pt | GRAFO 1300 | amine | 500 | 240 |
| PPC056157A | 20% Pt | GRAFO 1322 | amine | 482/244 | 240 |
| PPC056157C | 20% Pt | GRAFO 1300 | amine | 482/249 | 110 |
| PPC056158B | 10% Pt | GRAFO 1322 | amine | 517/265 | 180 |
| PPC056159B | 10% Pt | GRAFO 1300 | amine | 515/274 | 240 |
| PPC056163C | 20% Pt | GRAFO 1300 | amine | 526/282 | 120 |
| PPC056164C | 20% Pt | GRAFO 1322 | amine | 524/287 | 260 |

Since MEA preparation is labor-intensive, some of the catalysts in Table 10 were tested as alkaline cathodes as an approach to rapid screening. The results are not directly comparable to those obtained from MEAs, however it is believed that the relative activity is useful in ranking catalytic activity.

Comparison of PPC056163C (SHAWINIGAN BLACK) and PPC056164C (VULCAN XC-72), made at the same spray dryer conditions again illustrates the contribution of the support to the conversion temperature. Therefore, a higher surface area carbon support should be used in combination with spray dryer processing conditions.

Sample PPC056156A is also a SHAWINIGAN BLACK supported Pt catalyst, but the electrochemical activity is at a much more reasonable value. In comparing PPC056159B and PPC056163C, it appears the spray dryer processing temperature might be at the lower limit for platinum conversion. At 10 wt. % Pt, the conversion is successful and the electrochemical activity is very good, but for 20 wt. % Pt, the electrochemical activity is quite low, indicating the platinum is not in the same state.

It can be concluded that the particles are exposed to a lower temperature in the spray dryer than in hot wall reactors. This finding suggests higher temperatures are needed for SHAWINIGAN BLACK than VULCAN XC-72, but whether the mechanism is surface area-dependent or due to the structural differences between the carbons is not readily evident.

The comparison of the Pt cluster size distribution between the Pt/C electrocatalysts of the present invention and prior art 10 wt. % and 20 wt. % Pt/C (VULCAN XC-72) was derived from TEM data. The data show that for an identical carbon support and 10 wt. % Pt concentration, an average Pt crystallite size of $d_{av}$=2.5 nm is observed for the prior art sample, while $d_{av}$=1.8 nm was observed for the electrocatalyst of the present invention. This result shows that at identical Pt concentration and when the same support is used, the spray conversion method of the present invention produces electrocatalysts with higher Pt dispersion.

Figure 39:
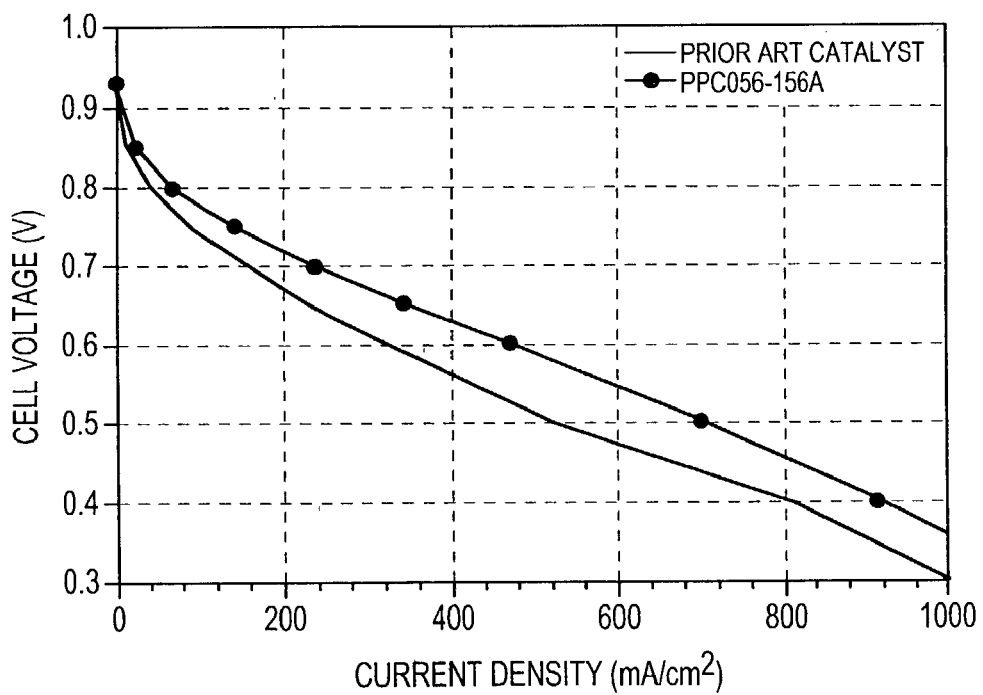
FIG. 39 illustrates a polarization curve for a membrane electrode assembly in accordance with an embodiment of the present invention compared to a membrane electrode assembly utilizing a prior art electrocatalyst.

The superior characteristics of the 20 wt. % Pt/C electrocatalyst of the present invention (PPC056-156A) as compared to that of the prior art electrocatalyst is demonstrated in FIG. 39. The electrocatalyst of the present invention shows an improvement of about 50% over the prior art electrocatalysts at identical Pt loading and a potential of 0.6 V. It should be noted that the electrocatalyst of the present invention in the above comparison was made with SHAWINIGAN BLACK support compared to the VULCAN XC-72 used for the prior art electrocatalyst. The SHAWINIGAN BLACK support has significantly lower surface area and therefore it is harder to achieve high Pt dispersion on this support vs. the VULCAN XC-72, which has a much higher surface area.

Figure 40:
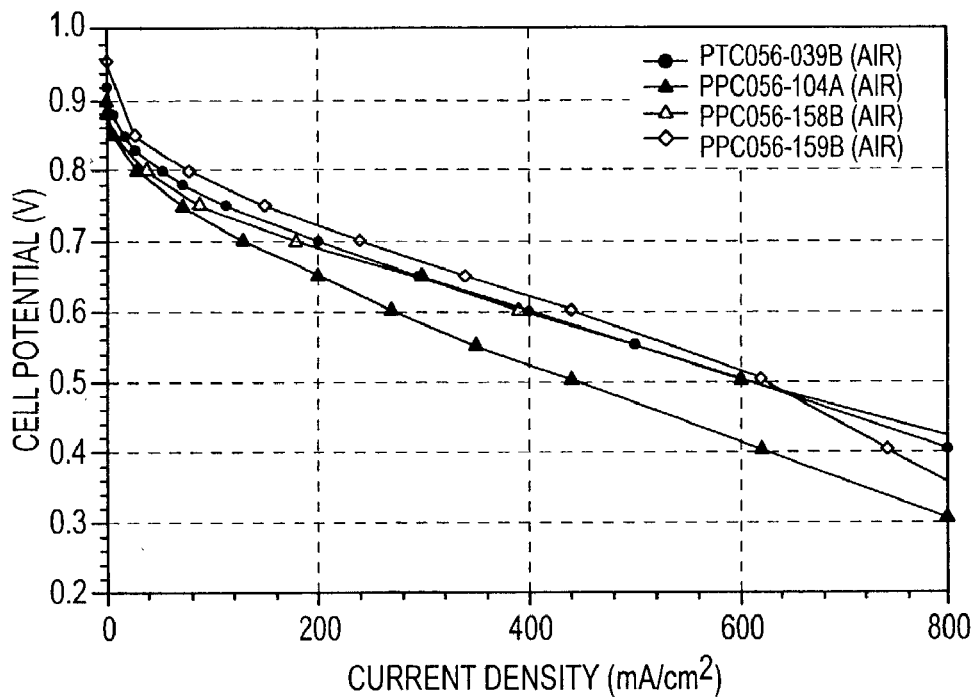
FIG. 40 illustrates polarization curves for membrane electrode assemblies made with laboratory-scale and spray dryer scale-up 10 wt. % Pt/C electrocatalysts according to the present invention.

FIG. 40 illustrates the polarization curves for two different samples with a loading of 10 wt. % Pt/C. Sample 158B (Table 6) is supported on VULCAN XC-72 and Sample 159B (Table 6) is supported on SHAWINIGAN BLACK. The total cathode layer loading for each sample is 0.2 mg Pt/cm$^2$. FIG. 40 demonstrates that the two electrocatalysts processed in a mixed flow spray dryer show either identical performance or outperform the best 10 wt. % electrocatalyst generated in a horizontal, hot-wall reactor (Samples P104A and P39B, Table 2). The estimation of the average platinum cluster size for the samples showed that the average crystallite size for Sample 158B on a VULCAN XC-72 support is about 1.8 nanometers while the average crystallite size for Sample 159B on a SHAWI NIGAN BLACK support is about 3 nanometers. Therefore, the platinum dispersion is higher on the VULCAN XC-72 support compared to the SHAWINIGAN BLACK support. However, the comparison of the polarization curves for the two supports shows that despite the higher average Pt crystallite size and lower dispersion, the electrocatalyst on SHAWINIGAN BLACK has better electrochemical performance compared to that of VULCAN XC-72.

Figure 41:
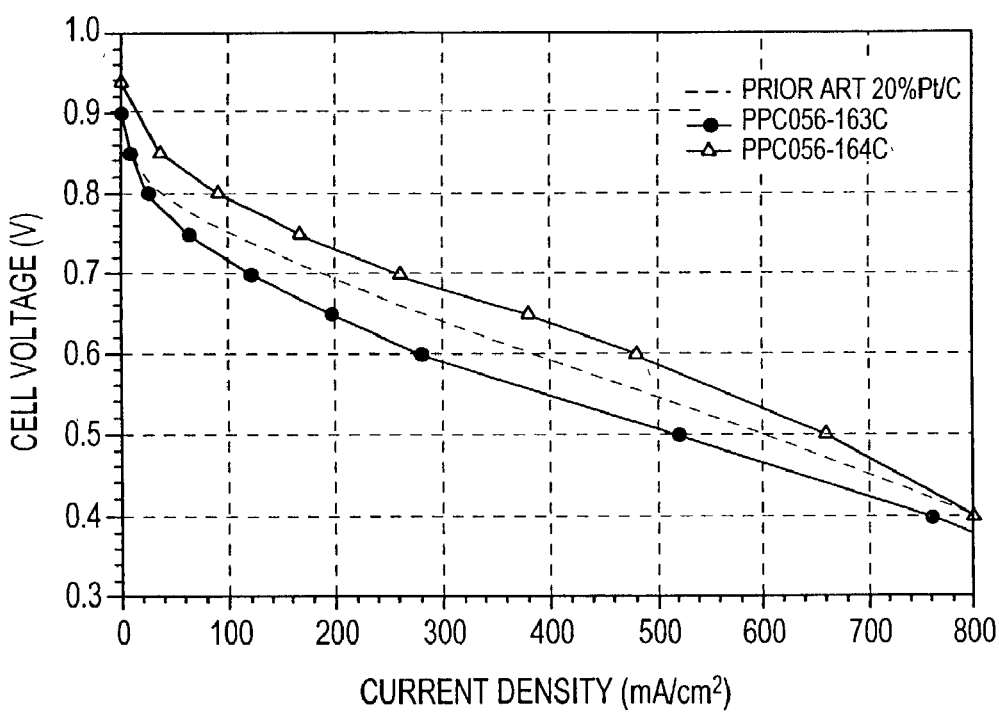
FIG. 41 illustrates polarization curves for membrane electrode assemblies of 20 wt. % Pt/C spray dryer scale-up electrocatalysts according to the present invention compared to a prior art electrocatalyst.

The results of the electrochemical testing for the 20 wt. % Pt/C spray dryer scale-up samples are illustrated in FIG. 41. The sample prepared on VULCAN XC-72 (PPC056-164C) demonstrates superior performance (about 40% better) compared to the 20 wt. % Pt/C prior art commercial sample.

These Pt/C electrocatalysts were then used to produce laboratory prototype MEAs for comparison to the existing commercial MEAs. The MEAs were tested by an independent laboratory overseen by a fuel cell manufacturer. The goal was to construct MEAs with a performance of about 600 mA/cm$^2$ at 0.6 V with the lowest Pt loading possible. The low Pt loading provides the longer-term avenue to commercialization since the Pt loadings of the current commercial MEAs are too high for long-term commercialization.

Figure 42:
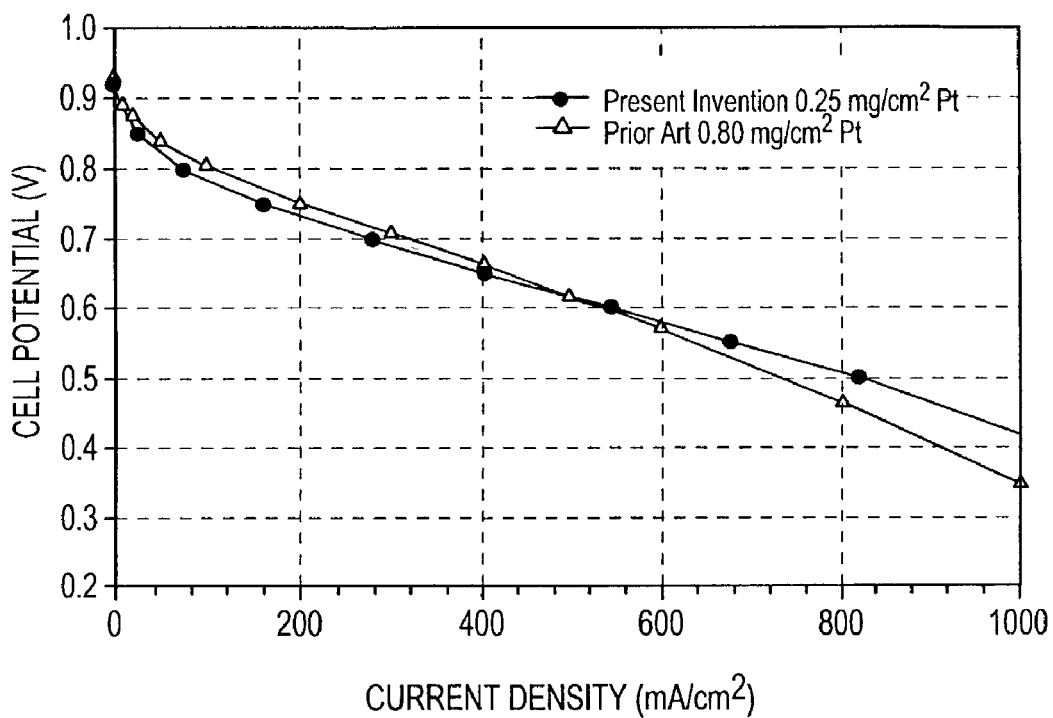
FIG. 42 illustrates a polarization curve for a membrane electrode assembly with 20 wt. % Pt/SHAWINIGAN BLACK electrocatalyst in accordance with the present invention compared to a membrane electrode assembly utilizing a prior art electrocatalyst.

A comparison of the performance of a MEA comprising 20 wt. % Pt/C (SHAWINIGAN BLACK) cathode catalyst of the present invention at a total loading of 0.25 mgPt/cm$^2$ compared to the prior art MEA with a total Pt loading of 0.8 mgPt/cm$^2$ is shown in FIG. 42. This plot illustrates the similar performance of the 2 MEAs, under conditions where the MEA containing the electrocatalyst of the present invention contains over 3 times less Pt. To illustrate that this result is not confined to a particular sample or Pt dispersion, another polarization curve was generated in which the application has a different set of performance specifications. In this case a 60 wt. % Pt/C sample was prepared which was tested in an MEA against pure Pt black (i.e., 100% Pt). The lower Pt content electrocatalyst of the present invention had comparable performance at low current densities and higher performance at higher current densities.

Figure 43:
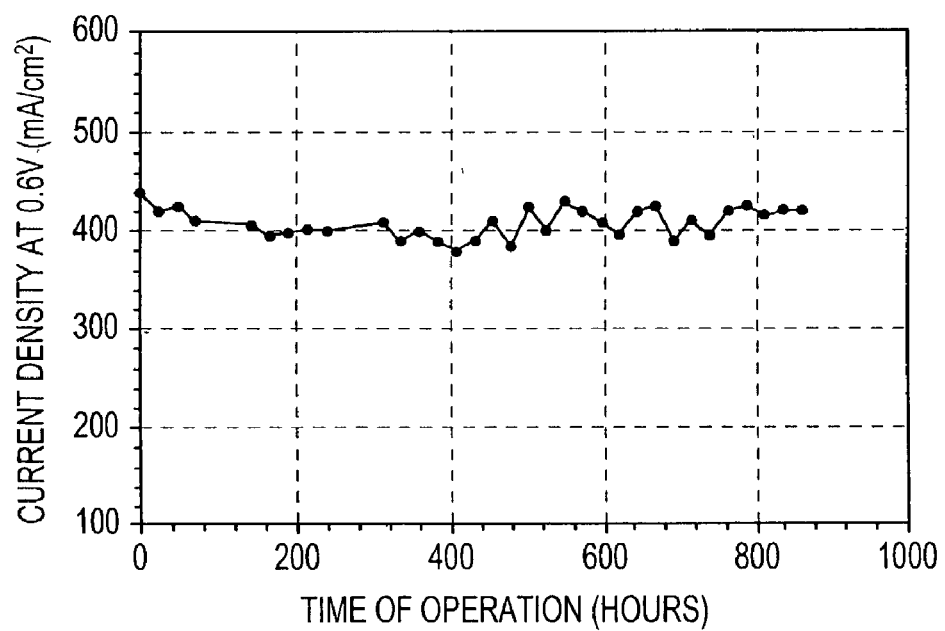
FIG. 43 illustrates the performance of membrane electrode assembly over time in accordance with an embodiment of the present invention.
Figure 44:
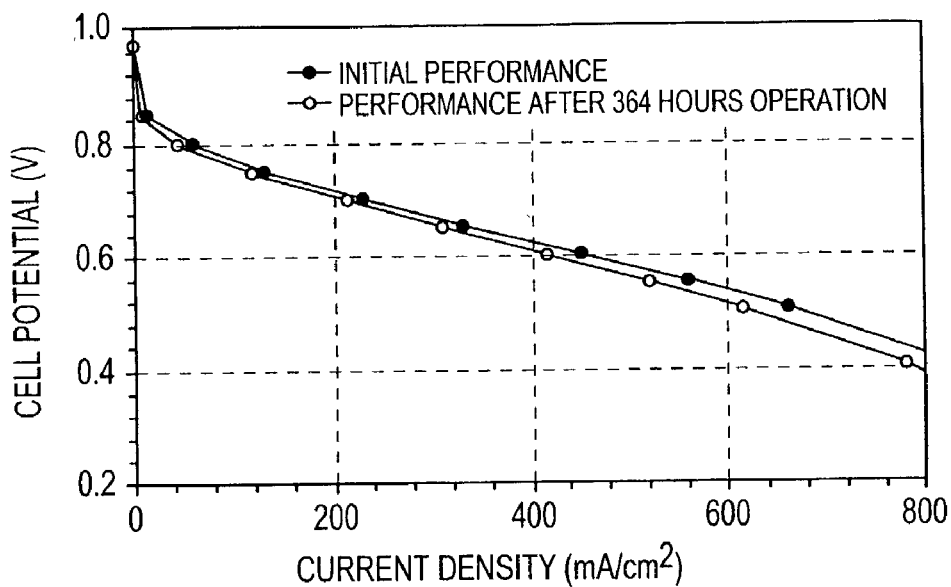
FIG. 44 illustrates the performance of membrane electrode assembly over time in accordance with an embodiment of the present invention.

An additional aspect important in the commercial applications of these materials is the timescale over which the performance is maintained. This can be measured by recording either the cell voltage at constant current density or the current density at constant cell voltage. FIGS. 43 and 44 provide some information on the variation of the current density at constant cell voltage under the conditions previously indicated.

Thus, MEAs constructed using the electrocatalyst of present invention have demonstrated equal performance with 0.25 mgPt/cm$^2$ as compared to prior art MEAs with 0.8 mgPt/cm$^2$.

Pt/C electrocatalysts with 5, 10, 20, 40 and 60 wt. % Pt loadings were tested at 50° C. under atmospheric pressure, with a NAFION 112 membrane, at various cathode loadings and with 0.05 mg Pt/cm$^2$ loading at the anode using a 10 wt. % Pt/C electrocatalyst. The measurements were made at constant gas flows corresponding to hydrogen 1.2 and oxygen (air) 2.2 stoichiometry for 1000 mA/cm$^2$ current density.

Figure 45:
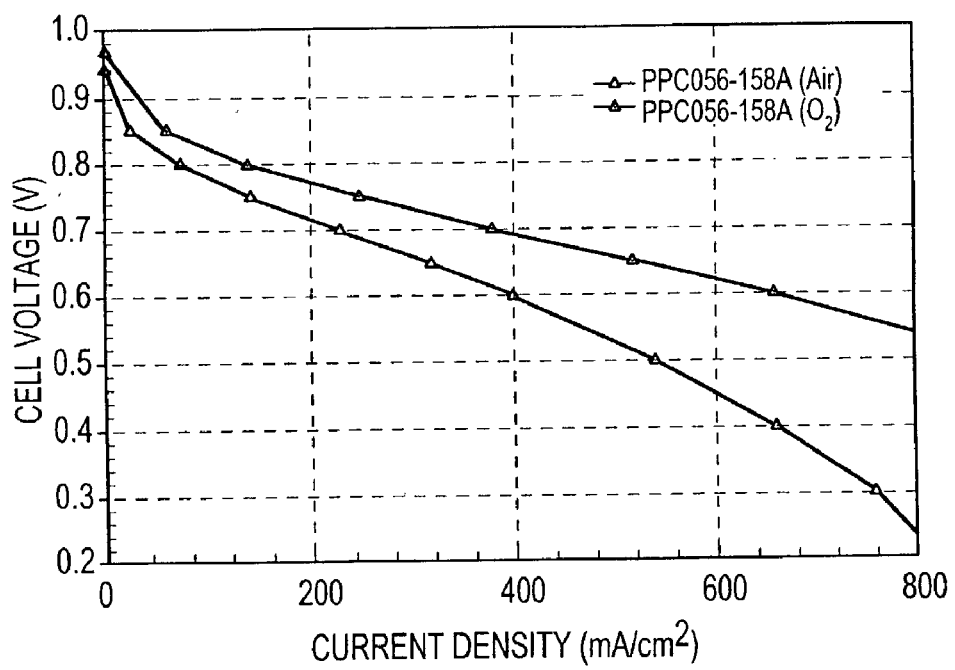
FIG. 45 illustrates polarization curves for a membrane electrode assembly with 5 wt. % Pt/VULCAN XC-72 electrocatalyst in accordance with the present invention.
Figure 46:
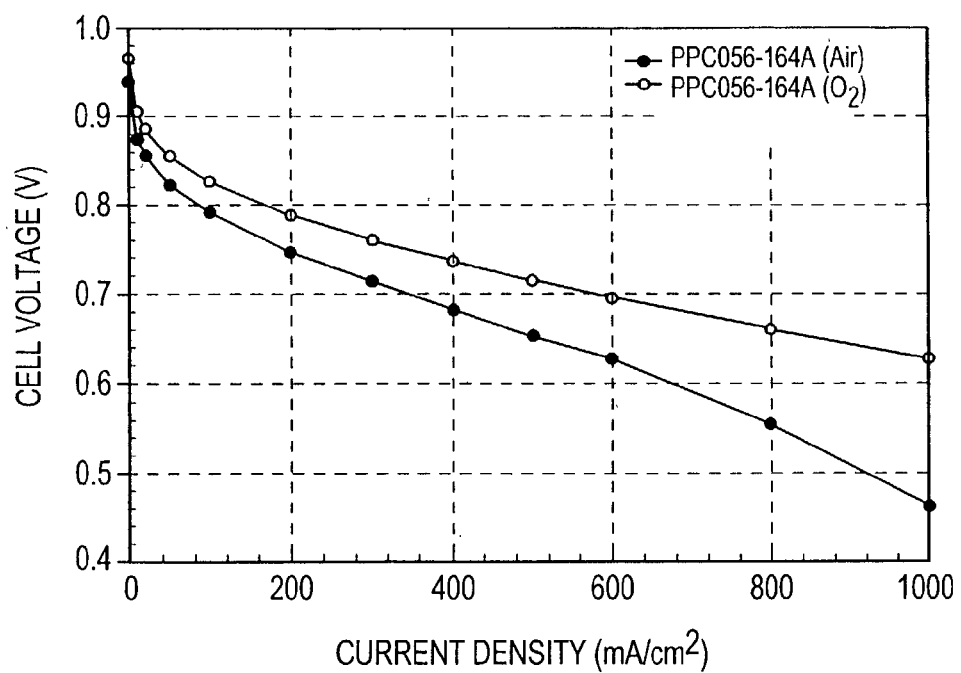
FIG. 46 illustrates polarization curves for a membrane electrode assembly with 20 wt. % Pt/SHAWINIGAN BLACK electrocatalyst in accordance with the present invention.

Polarization curves in air and oxygen for a 5 wt. % Pt/C electrocatalyst (Sample 158A, Table 6) at a cathode layer loading of 0.1 mg Pt/cm$^2$ are illustrated in FIG. 45. These curves demonstrate that at 0.6 V, a current density of 400 mA/cm$^2$ is achieved with a total (cathode and anode) loading of 0.15 mg Pt/cm$^2$. This performance is virtually identical to the performance of a prior art electrocatalyst having a cathode loading of 0.2 mg Pt/cm$^2$ and to that of a prior art MEA having 0.4 mg Pt/cm$^2$ cathode electrocatalyst loading. That is, identical performance is achieved with the electrocatalyst according to the present invention at a Pt cathode loading that is up to 4 times lower than the prior art catalyst. Referring now to FIG. 46, polarization curves in air and oxygen are illustrated for a 20 wt. % Pt/C electrocatalyst fabricated in a mixed-flow spray dryer (Sample 164A, Table 6) at a cathode loading of 0.2 mg Pt/cm$^2$. A comparison of this polarization curve with a 20 wt. % Pt/C SHAWINIGAN BLACK electrocatalyst generated in a horizontal hot wall system using ultrasonic spray nozzle (Sample 156A, Table 5 and FIG. 39) demonstrates the advantages of the former method of electrocatalyst generation.

Figure 47:
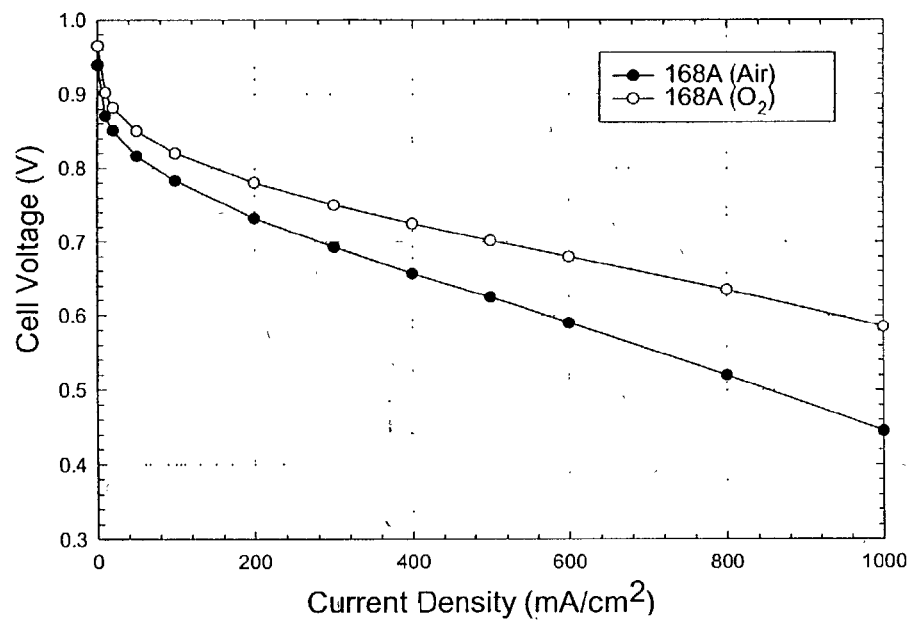
FIG. 47 illustrates polarization curves for a membrane electrode assembly with 20 wt. % Pt/VULCAN XC-72 electrocatalyst in accordance with the present invention.

FIG. 47 illustrates the polarization curves in oxygen and air for a 20 wt. % Pt/Vulcan XC-72 at a cathode loading of 0.2 mg PT/cm$^2$. (Sample 168A) that was dispersed on VULCAN XC-72 and was processed in a mixed flow spray dryer from a 5 wt. % solids suspension (Table 6).

Figure 48:
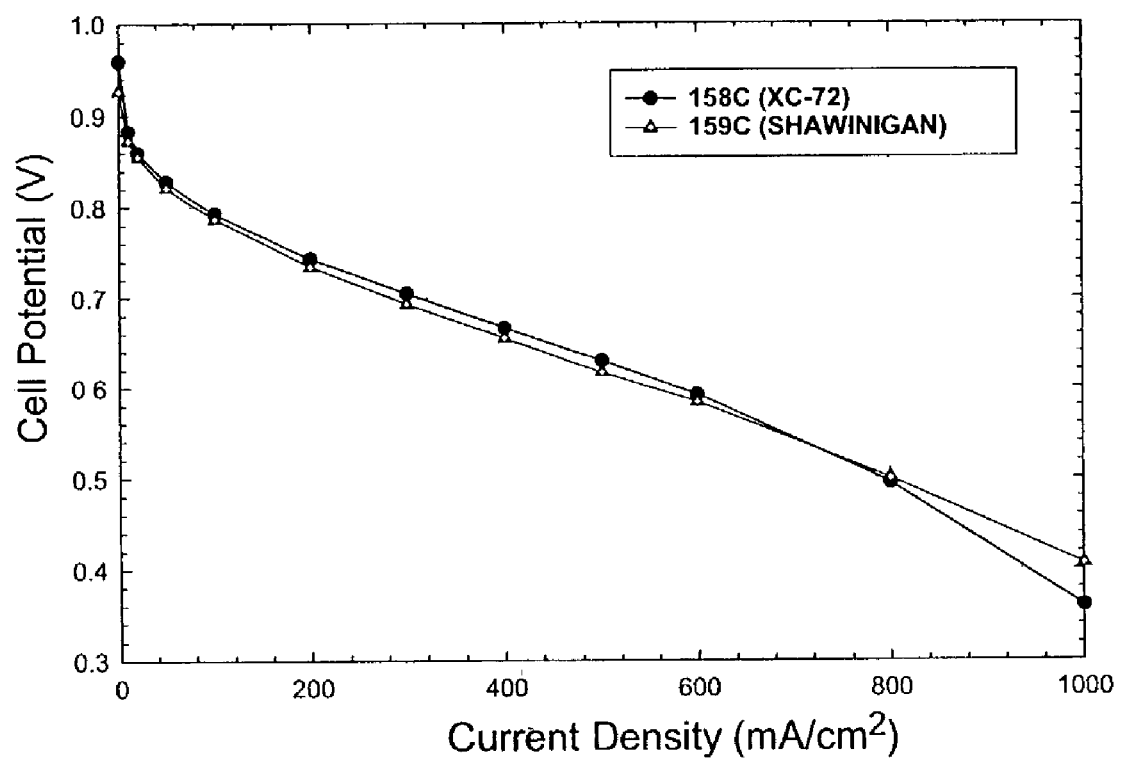
FIG. 48 illustrates polarization curves for membrane electrode assemblies with 40 wt. % Pt/Carbon electrocatalysts in accordance with the present invention.

FIG. 48 illustrates a polarization curve for a 40 wt. % Pt/C on SHAWINIGAN BLACK (Sample 159C, Table 6) and a 40 wt. % Pt/C on VULCAN XC-72 (Sample 158C, Table 6) at a cathode loading of 0.4 mg Pt/t cm$^2$. As can be seen from FIG. 47, the polarization curves are virtually identical which demonstrates that at higher wt. % Pt in the catalyst the superior performance of catalysts supported on Shawinigan black is no longer observed because the lower surface area of this support compared to VULCAN XC-72. Therefore to achieve high Pt dispersion at high Pt loadings higher surface area supports are more beneficial.

Figure 49:
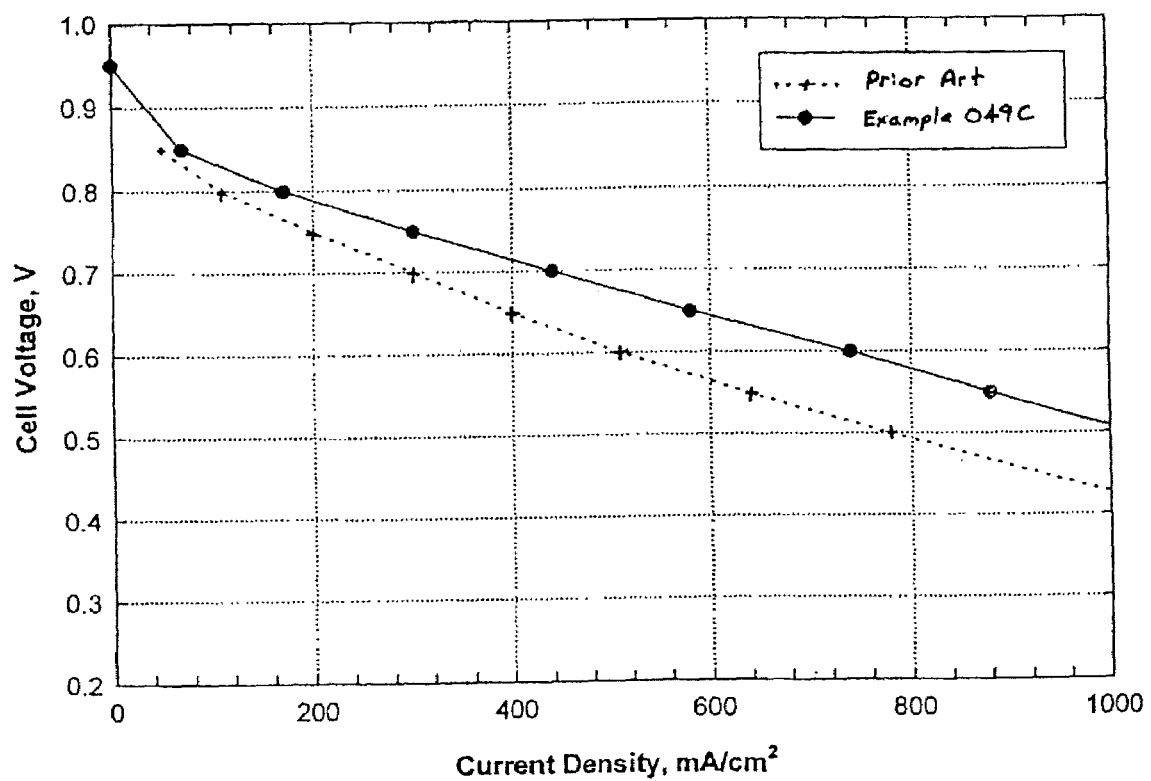
FIG. 49 illustrates a polarization curve for a membrane electrode assembly with 60 wt. % Pt/SHAWINIGAN BLACK in accordance with the present invention compared to a prior art electrocatalyst.

FIG. 49 illustrates a 60 wt. % Pt/C electrocatalyst using SHAWINIGAN BLACK (Sample P49C, Table 4) formed by ultrasonic generation and a hot wall horizontal reactor at a total loading of 1 mgPt/cm$^2$. A commercial catalyst having the same catalyst loading is also included in FIG. 49 for comparison. These curves demonstrate that electrocatalysts having platinum concentrations as high as 60 wt. % Pt/C also have better electrochemical performance compared to the commercial catalyst utilizing the same platinum loadings.

Figure 50:
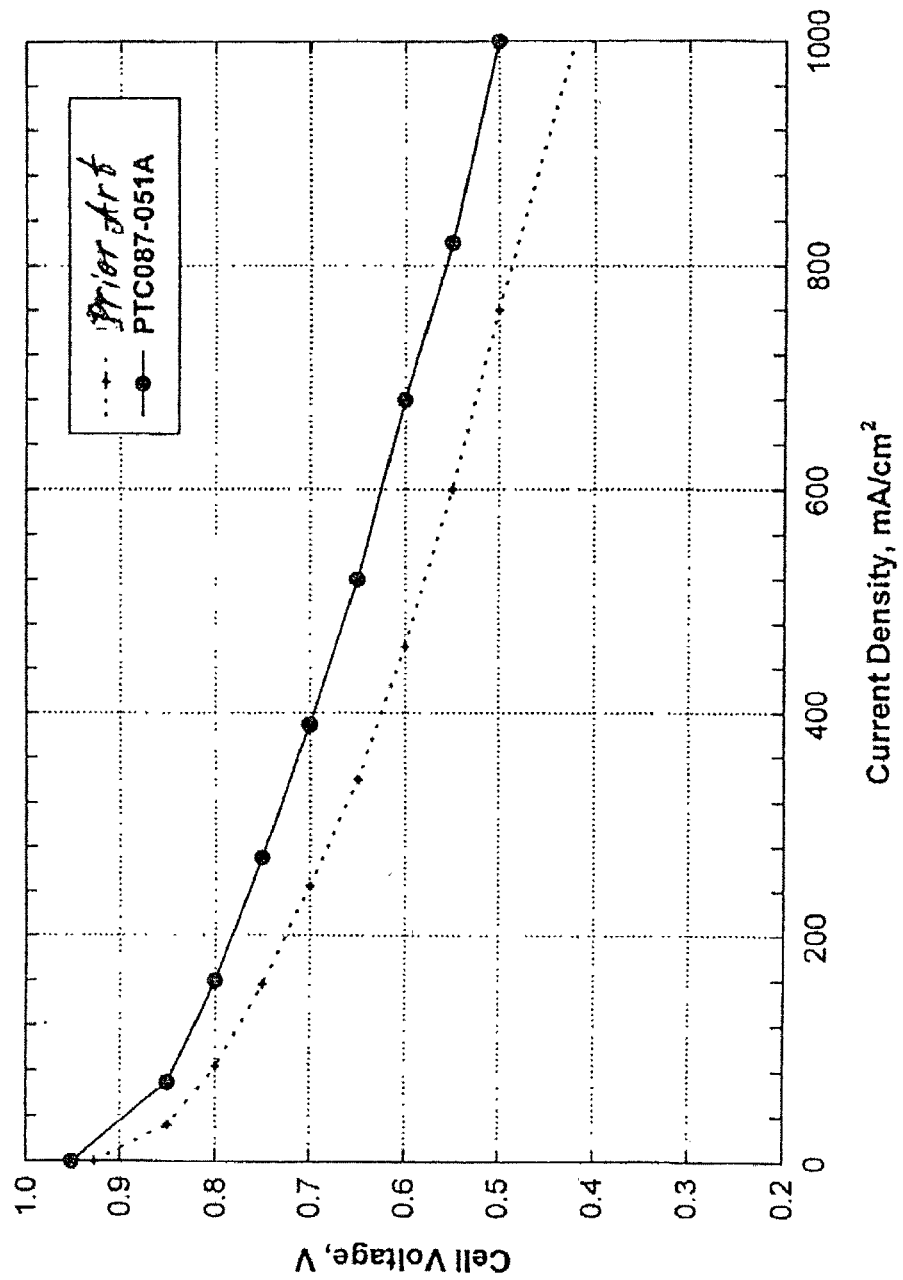
FIG. 50 illustrates a polarization curve for a membrane electrode assembly with 40 wt. % Pt/SHAWINIGAN BLACK in accordance with the present invention compared to a prior art electrocatalyst.

FIG. 50 illustrates a polarization curve for a 40 wt. % Pt/C electrocatalyst (Sample 051A, Table 4) having a total layer loading of 0.5 mgPt/cm$^2$ along with that of a prior art catalyst.

The aggregate size of the electrocatalyst particles is critical to the performance of devices such as MEA's fabricated from these particles. To demonstrate this importance, two identical MEA's were fabricated wherein one MEA utilized the electrocatalyst particles of the present invention where the aggregates were substantially intact and the other MEA utilized identical electrocatalyst where the aggregates had been broken down ultrasonically prior to being made into the cathode layer in an MEA.

Specifically, 1 gram of a Pt/C electrocatalyst prepared according to the present invention (20 wt. % Pt dispersed on a VULCAN XC-72 support) was dispersed in 2 ml of deionized water and 10 ml of 5% NAFION solution (66.67 wt % catalyst, 33.33 wt % NAFION). This ink was sonicated in a water bath for one hour. The particle size distribution for this ink had a $d_{10}$ of 1.9 μm, a $d_{50}$ of 4.7 μm and a $d_{95}$ of 16.0 μm. This ink was used to print MEA Sample 68B.

In addition, 1 gram of the same electrocatalyst was dispersed in 50 ml of deionized water and sonicated using a ultrasonic horn sonication for 30 minutes. The catalyst particles were broken down to a particle size distribution wherein $d_{10}$ was 0.5 μm, $d_{50}$ was 1.53 μm and $d_{95}$ was 4.9 μm. This solution was then dried to obtain the dry catalyst. The catalyst was then re-dispersed in 5% NAFION solution as above to print the MEA Sample 68C. The particle size distribution of the ink showed a $d_{10}$ of 0.2 μm, a $d_{50}$ of 0.4 μm and a $d_{95}$ of 6.8 μm.

Figure 51:
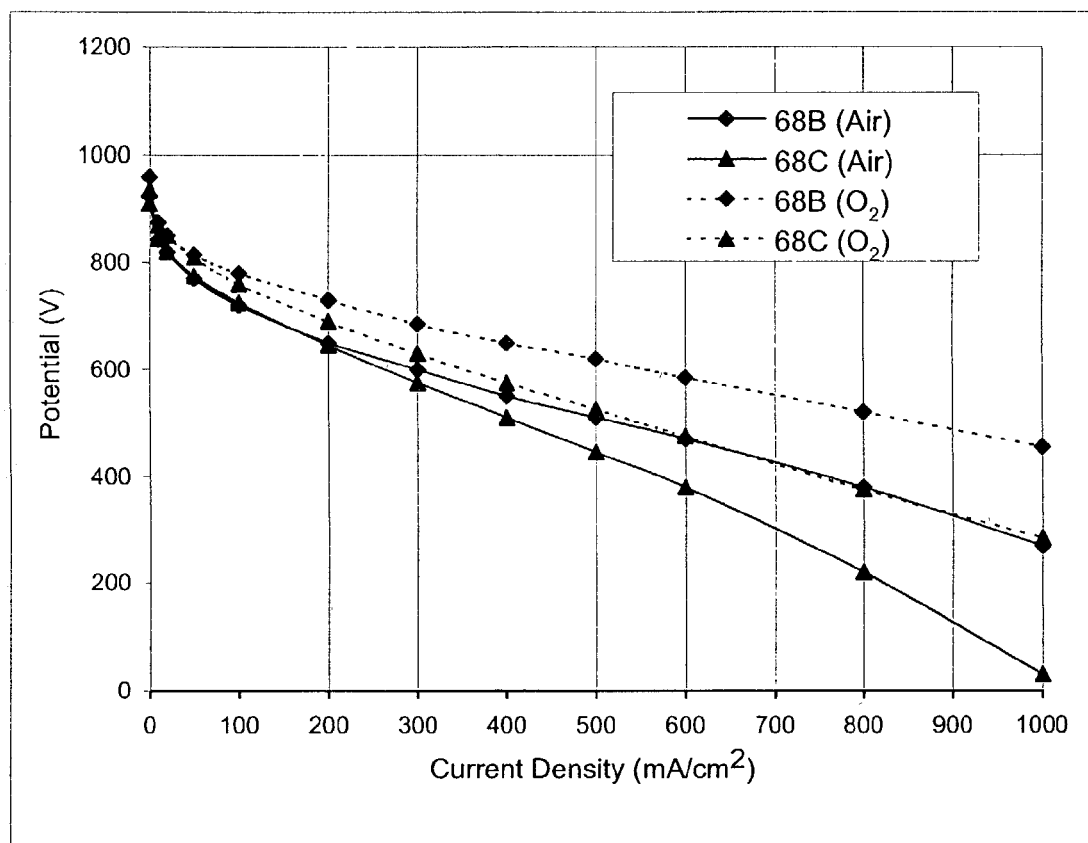
FIG. 51 illustrates polarization curves for membrane electrode assemblies according to the present invention formed from electrocatalyst aggregate particles that remain intact compared to aggregate electrocatalyst particles that have been broken-up.

The MEA cathodes were both loaded with 0.2 mg Pt/cm$^2$. The polarization curves in oxygen and in air are illustrated in FIG. 51. The polarization curves illustrate the following:
1. The performance of the MEA with the electrocatalysts where the aggregate particle structure is intact has a higher performance both in air and oxygen compared to the broken aggregates measured under otherwise identical conditions and with identical loadings.
2. The performance in the range up to 200 mA/cm$^2$ is identical in air for MEA Samples 68B and 68C indicating that breaking the aggregate particles did not affect the kinetic performance of the catalyst in the kinetically limited performance regime.
3. The intact aggregate particles showed a marked improvement in performance, which increases with increasing current density.
4. The performance difference in air versus oxygen is smaller for the particles with the aggregates intact compared to the broken aggregates.

The foregoing gives a strong indication that the presence of controlled size aggregates is critical to the performance in the ohmic and transport limited regimes.

Pt—Ru/C and Pt—Pd—Ru/C Electrocatalysts for PEMFC Anodes

The goal of the following structural and compositional characterization of binary and ternary catalysts is to identify the processing conditions that yield catalysts with the best sustainable electrochemical activity in the presence of CO in the anode feed. A PEMFC anode catalyst must possess CO tolerance in addition to electrocatalytic activity for the hydrogen oxidation reaction. An important aspect of this characterization is to determine the degree of alloying between the metals. The most important analysis information is obtained from XRD, TEM, and electrochemical evaluation.

Table 11 lists the binary Pt—Ru/C catalysts fabricated, and Table 12 lists the ternary Pt—Pd—Ru/C catalysts that were fabricated.

TABLE 11

Experimental Conditions for Preparation of Pt-Ru/C Electrocatalysts

| Sample | Composition (wt. %) | Carbon Support | Precursor | Temperature (° C.) |
|---|---|---|---|---|
| PPR056073A | 20 wt. % Pt/Ru 1:1 | GRAFO 1300 | amine/nitrosyl | 500 |
| PPR056074A | 20 wt. % Pt/Ru 1:1 | GRAFO 1300 | amine/nitrosyl | 500 |
| PPR056076A | 20 wt. % Pt/Ru 1:1 | GRAFO 1300 | amine/nitrosyl | 400 |
| PPR056077A | 20 wt. % Pt/Ru 1:1 | GRAFO 1300 | hydroxide/nitrosyl | 400 |
| PPR056077E | 20 wt. % Pt/Ru 1:1 | GRAFO 1300 | hydroxide/nitrosyl | 250 |
| PPR097110B | 20% Pt/Ru, 1:1 | GRAFO 1301 | amine/nitrosyl | 315 |
| PPR097111A | 20% Pt/Ru, 1 eq HCOOH | GRAFO 1306 | amine/nitrosyl | 315 |
| PPR097110C | 20% Pt/Ru, 1 eq HCOOH | GRAFO 1307 | amine/nitrosyl | 204 |
| PPR097111C | 20% Pt/Ru, 4 eq HCOOH | GRAFO 1308 | amine/nitrosyl | 315 |
| PPR097111B | 20% Pt/Ru, 4 eq HCOOH | GRAFO 1309 | amine/nitrosyl | 204 |
| PPR097126A | 60% Pt/Ru, 1:1 | GRAFO 1300 | amine/nitrosyl | 500 |
| PPR093104E | 20% Pt/Ru, 1:1 | GRAFO 1300 | amine/nitrosyl | 550 |
| PPC093105A | 20% Pt/Ru, 1:1, NaBH4 | GRAFO 1300 | amine/nitrosyl | 400 |
| PPC093105B | 20% Pt/Ru, 1:1, NaBH4 | GRAFO 1300 | amine/nitrosyl | 350 |
| PPR113014A | 20% Pt/Ru, 1:1 | GRAFO 1300 | Chloride | 204 |
| PPR113014B | 20% Pt/Ru, 1:1 | GRAFO 1300 | Chloride | 204 |
| PPR113014C | 20% Pt/Ru, 1:1 | GRAFO 1300 | Chloride | 204 |
| PPR113015A | 20% Pt/Ru, 1:1, KBH4 | GRAFO 1300 | Chloride | 204 |
| PPR113015B | 20% Pt/Ru, 1:1, Urea | GRAFO 1300 | Chloride | 204 |
| PPR093109C | 20% Pt/Ru, 1:1 | GRAFO 1300 | Amine/nitrate | 600 |
| PPR093109D | 20% Pt/Ru, 1:1 | GRAFO 1300 | Amine/nitrate | 500 |
| PPR056088A | 20% Pt/Ru, 1:1 | GRAFO 1300 | Amine/nitrate | 500 |

TABLE 12

Experimental Conditions for Preparation of Pt/Ru/Pd Electrocatalysts

| Sample | Composition (wt. %) | Carbon Support | Precursor | Temperature (° C.) |
|---|---|---|---|---|
| PPC113015C | 20% Pt/Pd/Ru, 30:30:40 | GRAFO 1300 | Chloride | 204 |
| PPC113016A | 20% Pt/Pd/Ru, 30:30:40 | GRAFO 1300 | Chloride | 204 |
| PPC113017A | 20% Pt/Pd/Ru, 40:40:20 | GRAFO 1300 | Chloride | 204 |
| PPC113017B | 20% Pt/Pd/Ru, 40:40:20 | GRAFO 1300 | Chloride | 204 |
| PPC113016B | 20% Pt/Pd/Ru, 30:30:40, KBH4 | GRAFO 1300 | Chloride | 204 |
| PPC113017C | 20% Pt/Pd/Ru, 40:40:20, KBH4 | GRAFO 1300 | Chloride | 204 |
| PPC113016C | 20% Pt/Pd/Ru, 30:30:40, Urea | GRAFO 1300 | Chloride | 204 |

TABLE 12-continued

Experimental Conditions for Preparation of Pt/Ru/Pd Electrocatalysts

| Sample | Composition (wt. %) | Carbon Support | Precursor | Temperature (° C.) |
|---|---|---|---|---|
| PPC113018A | 20% Pt/Pd/Ru, 40:40:20, Urea | GRAFO 1300 | Chloride | 204 |
| PPP093105C | 20% Pt/Pd/Ru, 30:30:40 | GRAFO 1300 | amine/nitrate | 500 |
| PPP093105D | 20% Pt/Pd/Ru, 30:30:40 | GRAFO 1300 | amine/nitrate | 550 |
| PPP093105E | 20% Pt/Pd/Ru, 30:30:40 | GRAFO 1300 | amine/nitrate | 600 |
| PPP093105F | 20% Pt/Pd/Ru, 30:30:40 | GRAFO 1300 | amine/nitrate | 650 |
| PPP093105G | 20% Pt/Pd/Ru, 30:30:40 | GRAFO 1300 | amine/nitrate | 700 |
| PPP093106A | 20% Pt/Pd/Ru, 40:40:20 | GRAFO 1300 | amine/nitrate | 500 |
| PPP093106B | 20% Pt/Pd/Ru, 40:40:20 | GRAFO 1300 | amine/nitrate | 550 |
| PPP093106C | 20% Pt/Pd/Ru, 40:40:20 | GRAFO 1300 | amine/nitrate | 600 |
| PPP093106D | 20% Pt/Pd/Ru, 40:40:20 | GRAFO 1300 | amine/nitrate | 650 |
| PPP093106E | 20% Pt/Pd/Ru, 40:40:20 | GRAFO 1300 | amine/nitrate | 700 |
| PPP093107A | 20% Pt/Pd/Ru, 40:40:20 | GRAFO 1300 | amine/nitrate | 400 |
| PPP093107B | 20% Pt/Pd/Ru, 40:40:20 | GRAFO 1300 | amine/nitrate | 500 |
| PPP093109E | 20% Pt/Pd/Ru, 30:30:40 | GRAFO 1300 | amine/nitrate | 500 |
| PPP093109F | 20% Pt/Pd/Ru, 30:30:40 | GRAFO 1300 | amine/nitrate | 600 |
| PPP093109G | 20% Pt/Pd/Ru, 40:40:20 | GRAFO 1300 | amine/nitrate | 600 |
| PPP093109H | 20% Pt/Pd/Ru, 40:40:20 | GRAFO 1300 | amine/nitrate | 500 |
| PPP056089A | 20% Pt/Pd/Ru, 30:30:40 | GRAFO 1300 | amine/nitrate | 500 |
| PPP056090A | 20% Pt/Pd/Ru, 40:40:20 | GRAFO 1300 | amine/nitrate | 500 |

Analysis for palladium is similar to analysis for platinum, since both are soluble in aqua regia. Elemental analysis for ruthenium-containing catalysts is not as simple. Following carbon removal with the TGA, the sample has two possible routes for analysis. The sample can be assayed for platinum (and palladium, if present) using the simple aqua regia dissolution, then the ruthenium content can be determined by difference. More accurately, the sample can be subjected to sodium fusion by heating with sodium peroxide, followed by leaching with aqua regia. The resulting solution can then be analyzed by atomic absorption.

The relative electrochemical activity of the Pt—Ru/C and Pt—Ru—Pd/C catalysts of the present invention was tested. The catalysts were pressed into electrodes and evaluated as 20 mg/cm$^2$ active layers with a gas diffusion layer of 50 mg/cm$^2$ XC-35 in 7 N KOH.

TABLE 13

Electrochemical Evaluation Data of Pt-Ru/C and Pt-Ru-Pd/C Catalysts

| Sample | Composition | Temperature (° C.) | PRF in 7N KOH |
|---|---|---|---|
| PPR093109C | PtRu | 600 | 25 |
| PPR093109D | PtRu | 500 | 18 |
| PPP093109E | PtPdRu | 500 | 35 |
| PPP093109F | PtPdRu | 600 | 30 |

Figure 52:
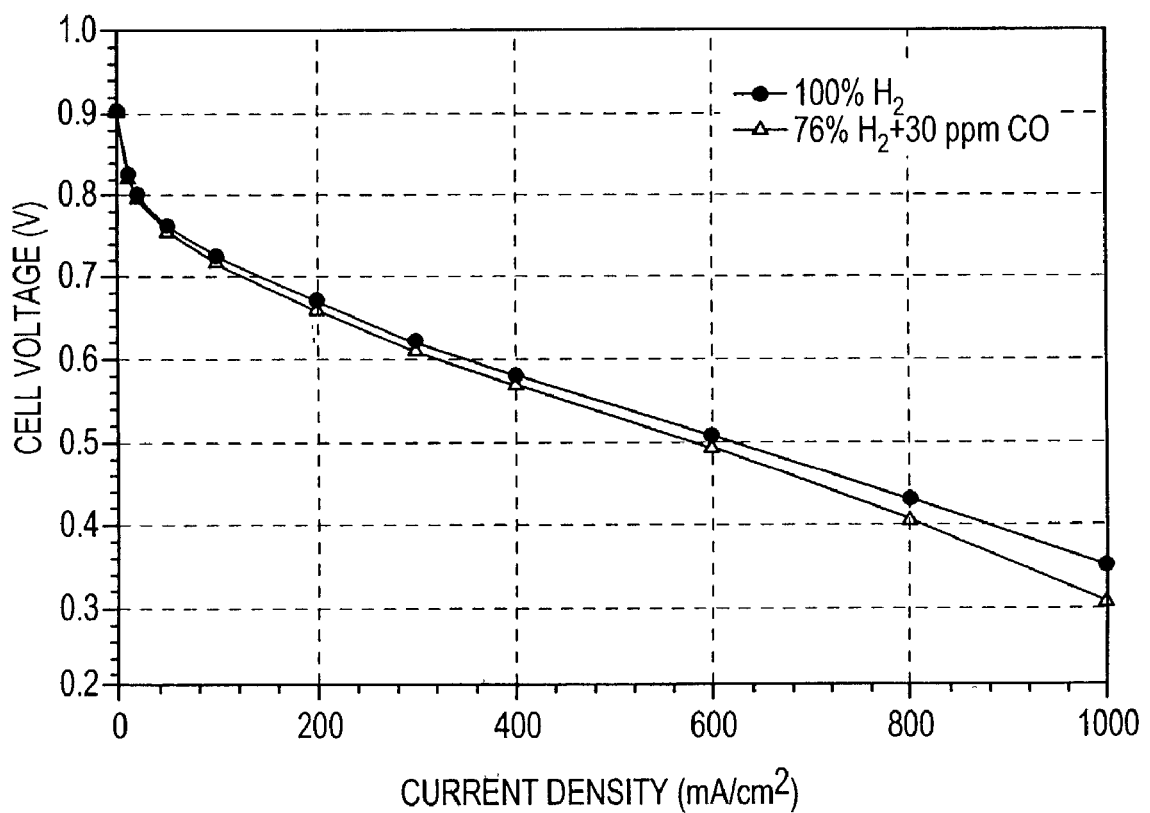
FIG. 52 illustrates polarization curves for a membrane electrode assembly according to the present invention in hydrogen and in a mixture of pure hydrogen and CO gas.

As illustrated in Table 13, the addition of palladium significantly increased the electrochemical activity of the catalyst in the oxygen reduction reaction. A similar catalyst, PPC093106A, was made into an MEA and tested with reformate. The result of the reformate test is illustrated by the polarization curve in FIG. 52, which compares the electrochemical activity of sample PPC093106A (Table 12) in pure hydrogen and reformate with 30 ppm CO steady concentration. The excellent CO tolerance of this catalyst can be seen from the nearly overlapping polarization curves, a loss of less than 20 mV is observed at 600 mA/cm$^2$ current density when operation with reformate is compared to operation with pure hydrogen as anode feed gas.

Polymer-Modified Particles

The gas diffusion layer (GDL) in any power device should allow maximum gas permeability combined with impermeability to aqueous solutions. There are various methods to obtain a gas diffusion layer. Depending on the application this layer can be a continuous fluorocarbon polymer membrane, a composite material such as hydrophobized carbon black or a hydrophobized metal oxide. The hydrophobic layer needs to be deposited with the right structure to form a layer that has the optimum size channels and hydrophobic pores to allow transport of the active species while preventing the electrolyte from weeping out. Further, the hydrophobic pores need to prevent the ambient water vapor from entering the power device. The control on the hydrophobicity of the hydrophobic layer can be achieved by varying the ratio of the support and the hydrophobic component and/or by depositing a gradient of hydrophobic layers. Table 14 summarizes the hydrophobized powder composites (polymer-modified carbon) manufactured in accordance with the present invention.

Dispersions of various carbons such as SHAWINIGAN BLACK and PWA were shear mixed in different ratios varying from 5 to 60% by weight of the fluorocarbon polymer. The dispersions were then spray dried at different temperatures as shown in Table 14. Dispersions of metal oxides such as $SiO_2$, $Al_2O_3$ and $TiO_2$ were prepared using surfactants. The fluorocarbon polymer dispersions were shear mixed at lower power with the metal oxide dispersions to prevent foaming in the presence of the surfactants. The dispersions were then spray dried.

The surface area and pore volume of the final powders was determined by a nitrogen adsorption-desorption technique. The surface area of the final composite is determined by the surface area of the hydrophobized carbon or metal oxide.

TABLE 14

Polymer-modified Powder Composites

| Substrate | Temp. (° F.) | TEFLON (wt. %) | S.A. (m$^2$/g) | Pore volume (cm$^3$/g) | Avg Pore D (nm) |
|---|---|---|---|---|---|
| SHAWINIGAN BLACK | 400 | 5 | 33 | 0.1384 | 16.8 |
| SHAWINIGAN BLACK | 600 | 5 | 30.3 | 0.1361 | 18 |
| SHAWINIGAN BLACK | 400 | 35 | 28.5 | 0.11 | 15.4 |
| SHAWINIGAN BLACK | 600 | 35 | 27 | 0.1294 | 19.2 |
| Silica | 600 | 60 | 81 | 0.614 | 30.3 |
| SHAWINIGAN BLACK | 640 | 50 | 31.6 | 0.0843 | 10.6 |

TABLE 14-continued

Polymer-modified Powder Composites

| Substrate | Temp. (° F.) | TEFLON (wt. %) | S.A. (m²/g) | Pore volume (cm³/g) | Avg Pore D (nm) |
|---|---|---|---|---|---|
| SHAWINIGAN BLACK | 610 | 50 | 23 | 0.11 | 18.9 |
| SHAWINIGAN BLACK | 640 | 35 | 101 | 0.13 | 5 |
| SHAWINIGAN BLACK | 600 | 35 | | | |
| PWA | 615 | 50 | 226 | 0.17 | 3 |
| PWA | 600 | 50 | | | |
| PWA | 630 | 35 | 352 | 0.22 | 2.5 |
| PWA | 600 | 35 | | | |
| Al₂O₃ | 600 | 50 | | | |
| Al₂O₃ | 600 | 35 | | | |
| TiO₂ | 600 | 50 | | | |
| TiO₂ | 600 | 35 | | | |
| TiO₂(Hydrophobic) | 600 | 50 | 19.9 | 0.0747 | 14.9 |
| TiO₂(Hydrophobic) | 600 | 35 | | | |

The polymer-modified carbon composites were then post-treated at 300° C. for 15 minutes to burn any surfactants or binders that were present, as these surfactants can affect the performance of the gas diffusion layer. The polymer-modified carbon was pressed into a gas diffusion layer with $MnO_x$/C catalyst and measured electrochemically. Similarly, polymer-modified carbon blacks from other sources were pressed with the same catalyst to compare electrochemical performance of polymer-modified carbon blacks in accordance with the present invention.

Figure 53:
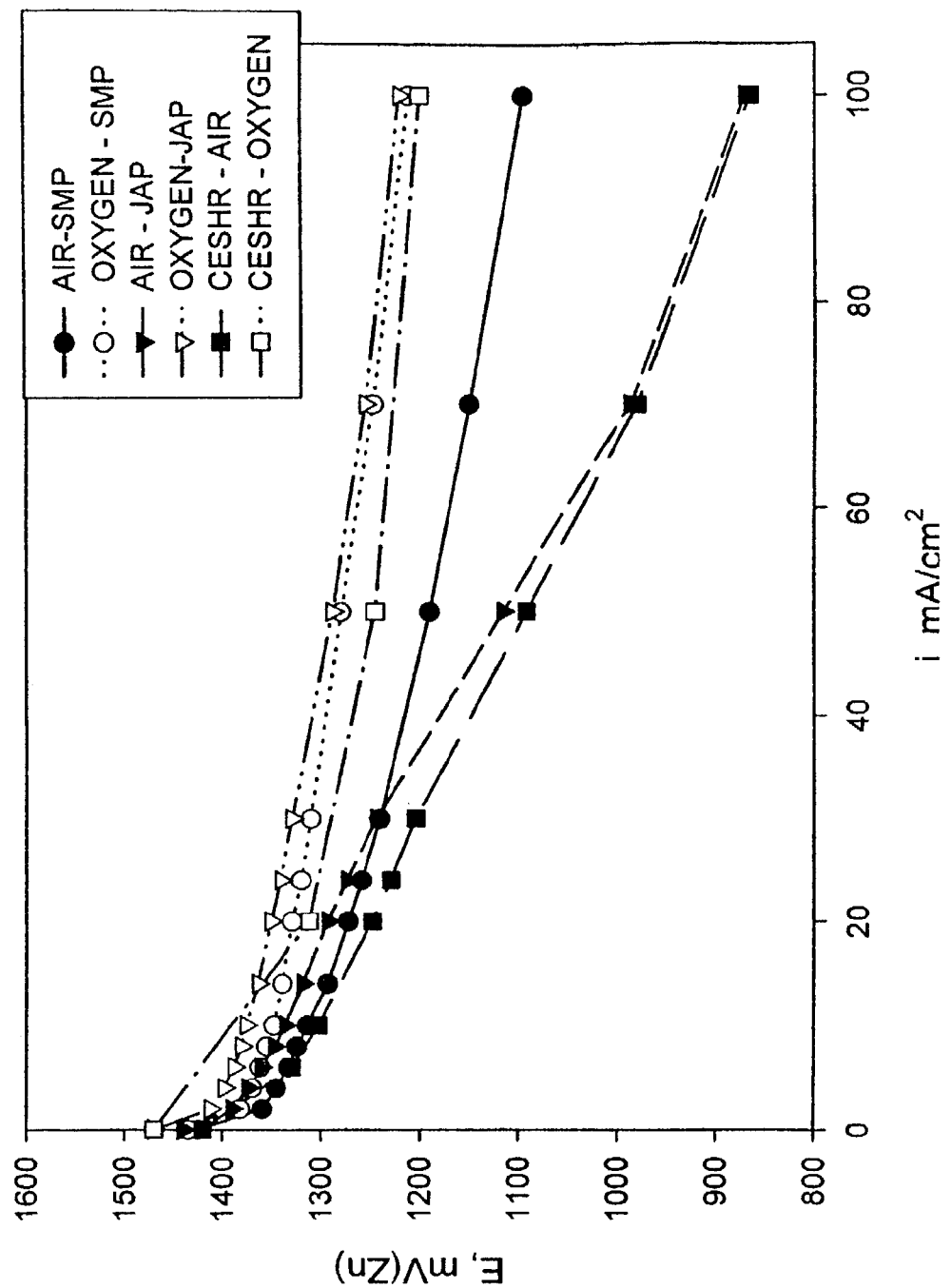
FIG. 53 illustrates polarization curves for gas diffusion electrodes made according to the present invention compared to a prior art samples.
Figure 54:
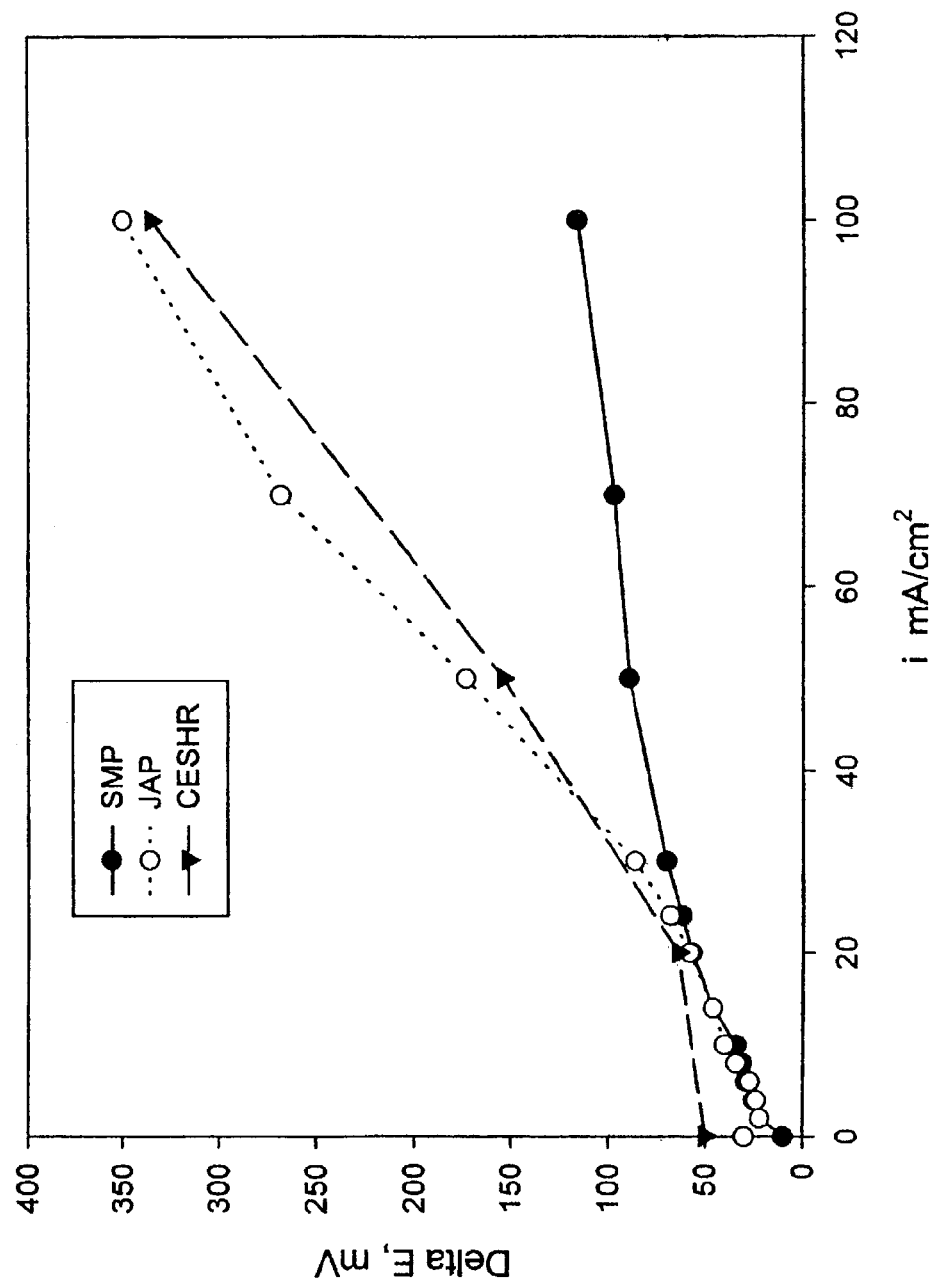
FIG. 54 illustrates the delta E derived from the data in FIG. 53 for gas diffusion electrodes made according to the present invention compared to a prior art samples.

FIG. 53 is a polarization curve plotted for polymer-modified carbon blacks prepared from different sources. As can be seen from the polarization curve, polymer-modified carbons according to the present invention perform better in oxygen and in air, especially at a current density of 100 mA/cm², where transport and diffusion limitations become predominant. This is further obvious from FIG. 54, which is a delta E plot of the performance difference in air vs. in oxygen. The difference in oxygen vs. air is very small for the polymer-modified carbon of the present invention, which proves that the gas diffusion layer prepared with the polymer-modified carbon of the present invention is better in performance.

Printing these materials thinner with methods such as syringe dispensing and screenprinting can further decrease the thickness of the gas diffusion layers. Formulations of polymer-modified carbons were prepared in alpha-terpeniol and in isoproponal for depositing thin layers, which should further increase performance in the transport and diffusion regimes of a polarization curve.

The polymer-modified blacks are hydrophobized using a fluorocarbon polymer (TEFLON) sprayed with carbon. Similar composites can be made for different applications such as to facilitate transport of species to the catalytic sites. The polymer dispersed on the support can be selected for a particular application. For example, polymer-modified NAFION carbons were prepared to facilitate the transport of protons to the NAFION membrane. NAFION solution was mixed with different carbon dispersions of SHAWINIGAN Black and VULCAN XC-72 and spray dried at 204° C. Table 15 lists a summary of these polymer-modified materials.

TABLE 15

Polymer-Modified Powders

| Product # PNF | Composition (wt. % NAFION) | Carbon Support | SA (m²/g) | Pore Vol (cm³/g) | Avg pore (D nm) | PSD $d_{90}$ (μm) |
|---|---|---|---|---|---|---|
| 056129B | 15 | VULCAN XC-32 | 71.36 | 0.262 | 14.7 | 19 |
| 056129C | 10 | VULCAN XC-32 | 76.8 | 0.284 | 14.8 | 0.7 |
| 056130A | 5 | VULCAN XC-32 | 86.43 | 0.334 | 15.46 | 0.8 |
| 056130C | 15 | SHAW. BLACK | 36.97 | 0.171 | 18.51 | 1.2 |
| 056131A | 10 | SHAW. BLACK | 36.96 | 0.167 | 18.06 | 1.2 |
| 056131B | 5 | SHAW. BLACK | 37.8 | 0.174 | 18.4 | 1.5 |

Graded Hydrophobicity Layers

A number of graded hydrophobicity layers were produced in accordance with the present invention. In a first example, a single layer of TEFLON-modified carbon was printed on top of an electrocatalyst layer, the other side of the electrocatalyst layer interfacing the electrolyte. The TEFLON-modified carbon layer consisted of 35 wt. % TEFLON and 65 wt. % SHAWINIGAN BLACK. The average thickness of the layer was 90 μm and the loading of the TEFLON-modified carbon was about 2.5 mg/cm². The printing suspension consisted of SHAWINIGAN BLACK, TEFLON particles, surfactants and water. The printed layer was then subjected to roll pressing and the sample was heated at 300° C. for 5 minutes to drive out surfactants used in the printing suspension In a second example, two 50 μm thick sublayers of TEFLON-modified carbon were printed on top of an electrocatalyst layer, the other side of the electrocatalyst layer interfacing the electrolyte. The first sublayer of TEFLON-modified carbon interfacing the electrocatalyst layer consists of 35 wt. % TEFLON and 65 wt. % SHAWINIGAN BLACK. The second sublayer of TEFLON-modified carbon consists of 50 wt. % TEFLON and 65 wt. % SHAWINIGAN BLACK. The average thickness of the layer was 90 μm and the loading of the TEFLON-modified carbon was about 2.5 mg/cm². The printing suspension consists of SHAWINIGAN BLACK, TEFLON particles, surfactants and water. The printed layer was subjected to roll pressing and the samples were heated at 300° C. for 5 minutes to drive out surfactants used in the printing suspension.

In a third example, the various layers were consecutively added to a nickel mesh. First, a 100 μm electrocatalyst layer then a 100 μm TEFLON-modified carbon layer. The TEFLON-modified carbon layer consisted of 35 wt. % TEFLON and 65 wt. % SHAWINIGAN BLACK. The electrocatalyst layer consisted of 65 wt. % electrocatalyst (with a ratio of 15 wt. % $MnO_2$ with respect to the PWA activated carbon support) and 35 wt. % TEFLON-modified carbon (35 wt. % TEFLON and 65 wt. % SHAWINIGAN BLACK). The electrocatalyst layer and the TEFLON-modified carbon layers were deposited at 10 mg/cm² loadings. All layers were simultaneously pressed at pressure (600 kg/cm² or 160 kg/cm²) and no heating was employed.

In another example, a nickel mesh was again used and layers were deposited on the nickel mesh. First, a 100 μm thick electrocatalyst layer was deposited and then a 100 μm thick TEFLON-modified carbon layer was deposited. The TEFLON-modified carbon layer consists of 50 wt. %

TEFLON and 50 wt. % SHAWINIGAN BLACK. The electrocatalyst layer consists of 65 wt. % electrocatalyst (with a ratio of 15 wt. % $MnO_2$ with respect to the PWA activated carbon support) and 35 wt. % TEFLON-modified carbon (35 wt. % TEFLON and 65 wt. % SHAWINIGAN BLACK). The electrocatalyst layer and the TEFLON-modified carbon layer were deposited at 10 mg/cm² loadings. All layers were simultaneously pressed under pressure (600 kg/cm² or 150 kg/cm²) and no heating was employed.

In yet another example, layers were again deposited on nickel mesh. First, a 100 µm electrocatalyst layer was deposited. Then a first 100 µm thick TEFLON-modified carbon layer was deposited over which a second 100 µm thick TEFLON-modified carbon layer was deposited. The first TEFLON-modified carbon layer consisted of 35 wt. % TEFLON and 65 wt. % SHAWINIGAN BLACK. The second TEFLON-modified carbon layer consisted of 50 wt. % TEFLON and 50 wt. % SHAWINIGAN BLACK. The electrocatalyst layer consists of 65 wt. % electrocatalyst (with a ratio of 15 wt. % $MnO_2$ with respect to the PWA activated carbon support) and 35 wt. % TEFLON-modified carbon (35 wt. % TEFLON and 65 wt. % SHAWINIGAN BLACK). The electrocatalyst layer and the TEFLON-modified carbon layers were deposited at 10 mg/cm² loadings. All layers were simultaneously pressed under pressure (600 kg/cm² or 150 kg/cm²) and no heating was employed.

In a further example, two layers were deposited on a nickel mesh. First, a 100 µm thick electrocatalyst layer was deposited and then a 100 µm TEFLON-modified carbon layer was deposited. The TEFLON-modified carbon layer consisted of 35 wt. % TEFLON and 65 wt. % VULCAN XC-72. The electrocatalyst layer consisted of 65 wt. % electrocatalyst (15 wt. % $MnO_2$ dispersed on PWA) and 35 wt. % TEFLON-modified carbon (35 wt. % TEFLON and 65 wt. % SHAWINIGAN BLACK). The electrocatalyst layer and the TEFLON-modified carbon layers were deposited at 10 mg/cm² loadings. The layers were simultaneously pressed under pressure (600 kg/cm² or 160 kg/cm²) and no heating was employed.

What is claimed is:

1. A membrane electrode assembly comprising at least an anode, a cathode and a membrane separating said anode and said cathode, wherein at least one of said anode and said cathode comprises electrocatalyst particles fabricated by heating suspended droplets of an electrocatalyst precursor composition while said droplets are suspended in a gas.

2. A membrane electrode assembly as recited in claim 1, wherein said electrocatalyst particles are composite electrocatalyst aggregates comprising a support phase and an active species phase dispersed on said support phase.

3. A membrane electrode assembly as recited in claim 1, wherein said electrocatalyst particles are composite electrocatalyst aggregates comprising a support phase and a platinum metal phase dispersed on said support phase.

4. A membrane electrode assembly as recited in claim 1, wherein said heating step comprises heating said suspended droplets in a spray-dryer.

5. A membrane electrode assembly as recited in claim 1, wherein said heating step comprises heating said suspended droplets in a mixed-flow spray-dryer.

6. A membrane electrode assembly as recited in claim 1, wherein said heating step comprises heating to a temperature of not greater than about 400° C.

7. A membrane electrode assembly as recited in claim 1, wherein said heating step comprises heating to a temperature of not greater than about 300° C.

8. A membrane electrode assembly as recited in claim 1, wherein said heating step comprises heating for not greater than about 600 seconds.

9. A membrane electrode assembly as recited in claim 1, wherein said heating step comprises heating for not greater than about 100 seconds.

10. A membrane electrode assembly as recited in claim 1, wherein said electrocatalyst particles have a volume average particle size of not greater than about 30 µm.

11. A membrane electrode assembly as recited in claim 1, wherein said electrocatalyst particles comprise an active species phase dispersed on a support phase and wherein said support phase comprises primary carbon particles having an average primary particle size of from about 10 to about 100 nanometers.

12. A membrane electrode assembly comprising at least an anode, a cathode and a membrane separating said anode and cathode, wherein at least one of said anode and cathode comprises composite electrocatalyst aggregates having an active species dispersed on a support phase wherein said aggregates are substantially spherical and wherein the volume average size of said aggregates is not greater than about 100 µm.

13. A membrane electrode assembly as recited in claim 12, wherein said electrocatalyst aggregates have a volume average size of not greater than about 20 µm.

14. A membrane electrode assembly as recited in claim 12, wherein said composite electrocatalyst aggregates comprise a support phase of primary carbon particles and an active species phase dispersed on said primary carbon particles.

15. A membrane electrode assembly as recited in claim 12, wherein said electrocatalyst aggregates are dispersed in an electrocatalyst layer having an average thickness of not greater than about 50 µm.

16. A membrane electrode assembly comprising at least an anode, a cathode and a membrane separating said anode and said cathode, wherein at least one of said anode and said cathode comprises an electrocatalyst layer and said electrocatalyst layer comprises substantially spherical electrocatalyst particles, said electrocatalyst particles comprising an active species phase dispersed on a carbon support phase.

17. A membrane electrode assembly as recited in claim 16, wherein said electrocatalyst particles have a volume average particle size of not greater than about 20 µm.

18. A membrane electrode assembly as recited in claim 16, wherein said electrocatalyst particles have a volume average particle size of not greater than about 10 µm.

19. A membrane electrode assembly as recited in claim 16, wherein at least about 5 volume percent of said electrocatalyst layer comprises said spherical electrocatalyst particles.

20. A membrane electrode assembly as recited in claim 16, wherein at least about 10 volume percent of said electrocatalyst layer comprises said spherical electrocatalyst particles.

21. A membrane electrode assembly as recited in claim 16, wherein at least about 20 volume percent of said electrocatalyst layer comprises said spherical electrocatalyst particles.

22. A membrane electrode assembly as recited in claim 16, wherein said active species phase comprises a platinum-containing metal.

23. A liquid vehicle comprising catalyst particles, said liquid vehicle being adapted to be deposited using a direct-write tool to form a catalyst layer, wherein said liquid vehicle comprises a liquid carrier and catalyst particles having a volume average particle size of not greater than about 20 μm dispersed in said liquid carrier.

24. A liquid vehicle as recited in claim 23, wherein said volume average particle size is from about 1 μm to about 10 μm.

25. A liquid vehicle as recited in claim 23, wherein said catalyst particles are substantially spherical.

26. A liquid vehicle as recited in claim 23, wherein said catalyst particles are electrocatalyst particles.

27. A liquid vehicle as recited in claim 26, wherein said electrocatalyst particles are secondary particles comprising an active species phase dispersed on primary support particles.

28. A liquid vehicle as recited in claim 26, wherein said electrocatalyst particles are secondary particles comprising an active species phase dispersed on primary carbon support particles having an average primary particle size of from about 10 nanometers to about 1000 nanometers.

29. A liquid vehicle as recited in claim 26, wherein said electrocatalyst particles are secondary particles comprising an active species phase dispersed on primary carbon support particles having an average primary particle size of from about 10 nanometers to about 100 nanometers.

30. A liquid vehicle as recited in claim 26, wherein said electrocatalyst comprises a platinum metal active species phase dispersed on primary carbon support particles.

31. A liquid vehicle as recited in claim 26, wherein said electrocatalyst comprises $MnO_x$ active species phase dispersed on primary carbon support particles.

32. A liquid vehicle as recited in claim 26, wherein said liquid vehicle comprises a solvent and a binder.

33. A method for the deposition of an electrocatalyst layer, comprising the steps of:
  a) dispersing electrocatalyst particles in a liquid carrier to form a liquid vehicle, wherein said electrocatalyst particles have a volume average particle size of not greater than about 20 μm;
  b) depositing said liquid vehicle onto a surface using a direct-write tool that is controllable over an x-y grid relative to the surface; and
  c) heating said liquid vehicle to a temperature sufficient to form an electrocatalyst layer.

34. A method as recited in claim 33, wherein said volume average particle size is from about 1 μm to about 10 μm.

35. A method as recited in claim 33, wherein said electrocatalyst particles are substantially spherical.

36. A method as recited in claim 33, wherein said electrocatalyst particles are secondary particles comprising an active species phase dispersed on primary support particles.

37. A method as recited in claim 33, wherein said electrocatalyst particles are secondary particles comprising an active species phase dispersed on primary carbon support particles having an average primary particle size of from about 10 nanometers to about 100 nanometers.

38. A method as recited in claim 33, wherein said electrocatalyst comprises a platinum metal active species phase dispersed on primary carbons support particles.

39. A method as recited in claim 33, wherein said electrocatalyst comprises $MnO_x$ active species phase dispersed on primary carbon support particles.

40. A method as recited in claim 33, wherein said liquid vehicle comprises a solvent and a binder.

41. A membrane electrode assembly comprising at least an anode, a cathode and a membrane separating said anode and said cathode, wherein at least one of said anode and said cathode comprises electrocatalyst aggregates, said electrocatalyst aggregates comprising an active species phase dispersed on a porous support phase and a polymer phase intimately mixed within the structure of said aggregates and wherein said aggregates have a volume average particle size of from about 1 μm to about 50 μm.

42. A membrane electrode assembly as recited in claim 41, wherein said polymer phase comprises a proton conductive polymer.

43. A membrane electrode assembly as recited in claim 41, wherein said polymer phase comprises a hydrophobic polymer.

44. A membrane electrode assembly as recited in claim 41, wherein said polymer phase comprises a hydrophilic polymer.

45. A membrane electrode assembly as recited in claim 41, wherein said polymer phase comprises a fluorocarbon polymer.

46. A membrane electrode assembly as recited in claim 41, wherein said polymer phase comprises a perfluorohydrocarbon polymer.

47. A membrane electrode assembly as recited in claim 41, wherein said electrocatalyst aggregates comprise primary carbon support particles.

48. A membrane electrode assembly as recited in claim 41, wherein said electrocatalyst aggregates comprise primary carbon support particles having an average primary particle size of from about 10 nanometers to about 100 nanometers.

49. A membrane electrode assembly as recited in claim 41, wherein said electrocatalyst aggregates are substantially spherical.

50. A membrane electrode assembly comprising at least an anode, a cathode and a membrane separating said anode and said cathode, wherein at least one of said anode and said cathode comprises electrocatalyst particles consisting of an active species phase dispersed on a support phase and wherein said electrocatalyst particles have an average internal pore size of not greater than about 20 nanometers.

51. A membrane electrode assembly as recited in claim 50, wherein said electrocatalyst particles have an average internal pore size of not greater than about 15 nanometers.

52. A membrane electrode assembly as in claim 50, wherein said electrocatalyst particles have an open porosity of at least about 40 percent.

53. A membrane electrode assembly as recited in claim 50, wherein said electrocatalyst particles comprise an active species phase dispersed on a support phase, said support phase comprising primary carbon support particles.

54. A membrane electrode assembly comprising an electrocatalyst layer, wherein said layer comprises 20 to 40 volume percent electrocatalyst, 20 to 40 volume percent proton conducting polymer and at least about 30 volume percent porosity.

55. A membrane electrode assembly as recited in claim 54, wherein said electrocatalyst layer has an average thickness of not greater 50 μm.

56. A membrane electrode assembly as recited in claim 54, wherein said electrocatalyst layer has an average thickness of not greater than about 25 μm.

57. A membrane electrode assembly as recited in claim 54, where at least 60% of the volume percent porosity is derived from porosity between aggregates.

* * * * *